US012692279B2

(12) United States Patent
Rota Matir et al.

(10) Patent No.: US 12,692,279 B2

(45) Date of Patent: Jul. 28, 2026

(54) ORGANIC MOLECULES FOR OPTOELECTRONIC DEVICES

(71) Applicant: SAMSUNG DISPLAY CO., LTD., Yongin-si (KR)

(72) Inventors: Diego Rota Matir, Heidelberg (DE); Barbara Szafranowska, Bruchsal (DE); Sabine Weidlich, Frankfurt (DE); Daniel Zink, Graben-Neudorf (DE); Dominik Ijem Ananaba, Kraichtal (DE); Stefan Seifermann, Bühl (DE)

(73) Assignee: Samsung Display Co., Ltd., Yongin-si (KR)

( * ) Notice: Subject to any disclaimer, the term of this patent is extended or adjusted under 35 U.S.C. 154(b) by 925 days.

(21) Appl. No.: 17/629,701

(22) PCT Filed: Jul. 24, 2020

(86) PCT No.: PCT/EP2020/070993

§ 371 (c)(1),
(2) Date: Jan. 24, 2022

(87) PCT Pub. No.: WO2021/014001

PCT Pub. Date: Jan. 28, 2021

(65) Prior Publication Data

US 2022/0278278 A1 Sep. 1, 2022

(30) Foreign Application Priority Data

Jul. 25, 2019 (EP) .................................... 19188361
Oct. 11, 2019 (EP) .................................... 19202645
(Continued)

(51) Int. Cl.
*H01L 51/50* (2006.01)
*C07F 5/02* (2006.01)
(Continued)

(52) U.S. Cl.
CPC .............. *C07F 5/027* (2013.01); *C09K 11/06* (2013.01); *H10K 85/658* (2023.02);
(Continued)

(58) Field of Classification Search
None
See application file for complete search history.

(56) References Cited

U.S. PATENT DOCUMENTS 11,600,790 B2 3/2023 Hatakeyama et al.
11,637,245 B2 4/2023 Duan et al.
(Continued)

FOREIGN PATENT DOCUMENTS

CN 109071501 A 12/2018
CN 109155368 A 1/2019
(Continued)

OTHER PUBLICATIONS

Wong, et al., "Purely Organic Thermally Activated Delayed Fluorescence Materials for Organic Light-Emitting Diodes," Advanced Materials, 2017, 54 ps., vol. 29, No. 1605444.
(Continued)

*Primary Examiner* — Gregory D Clark

(74) *Attorney, Agent, or Firm* — Womble Bond Dickinson (US) LLP

(57) ABSTRACT

An organic molecule for the application in optoelectronic devices is disclosed having a structure of Formula I:

(Continued)

Formula I

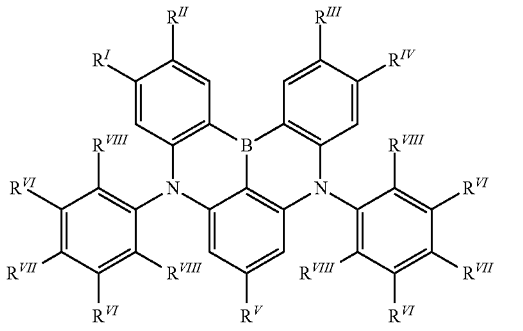

wherein $R^I$, $R^{II}$, $R^{III}$ and $R^{IV}$ are independently from another selected from the group consisting of: hydrogen, deuterium, $N(R^5)_2$, $OR^5$, $SR^5$, $Si(R^5)_3$, $B(OR^5)_2$, $OSO_2R^5$, $CF_3$, CN, halogen, $C_1$-$C_{40}$-alkyl, $C_1$-$C_{40}$-alkoxy, $C_1$-$C_{40}$-thioalkoxy, $C_2$-$C_{40}$-alkenyl, $C_2$-$C_{40}$-alkynyl, $C_6$-$C_{60}$-aryl, and $C_3$-$C_{57}$-heteroaryl, and $R^V$ is selected from the group of $C_1$-$C_5$ alkyl, $C_6$-$C_{18}$ aryl, and $C_3$-$C_{15}$ heteroaryl.

20 Claims, 5 Drawing Sheets

(30) Foreign Application Priority Data

Dec. 20, 2019 (EP) .................................... 19218997
Mar. 11, 2020 (EP) .................................... 20162459

(51) Int. Cl.

| | |
|---|---|
| ***C09K 11/06*** | (2006.01) |
| ***H10K 85/60*** | (2023.01) |
| *H10K 50/11* | (2023.01) |
| *H10K 101/10* | (2023.01) |
| *H10K 101/30* | (2023.01) |
| *H10K 102/00* | (2023.01) |

(52) U.S. Cl.

CPC ...... *C09K 2211/1018* (2013.01); *H10K 50/11* (2023.02); *H10K 2101/10* (2023.02); *H10K 2101/30* (2023.02); *H10K 2102/351* (2023.02)

(56) References Cited

U.S. PATENT DOCUMENTS

| | | | | |
|---|---|---|---|---|
| 11,683,978 | B2 | 6/2023 | Dück | |
| 11,723,263 | B2 | 8/2023 | Hatakeyama et al. | |
| 2007/0007882 | A1* | 1/2007 | Fukuoka ................ | H10K 50/19 252/301.16 |
| 2015/0236274 | A1 | 8/2015 | Hatakeyama et al. | |
| 2016/0281208 | A1 | 9/2016 | Zhang | |
| 2018/0047912 | A1 | 2/2018 | Kwong et al. | |
| 2018/0069182 | A1 | 3/2018 | Hatakeyama et al. | |
| 2019/0115538 | A1 | 4/2019 | Lim et al. | |
| 2019/0165279 | A1 | 5/2019 | Fujita | |
| 2019/0207112 | A1* | 7/2019 | Hatakeyama ........ | C07D 333/76 |
| 2019/0256538 | A1 | 8/2019 | Hatakeyama et al. | |
| 2019/0372023 | A1 | 12/2019 | Hatakeyama et al. | |
| 2020/0028084 | A1 | 1/2020 | Song et al. | |
| 2020/0035922 | A1 | 1/2020 | Ogiwara et al. | |
| 2020/0058885 | A1 | 2/2020 | Hong et al. | |
| 2020/0176679 | A1 | 6/2020 | Jeong et al. | |
| 2020/0203651 | A1 | 6/2020 | Duan et al. | |
| 2021/0053998 | A1 | 2/2021 | Kim et al. | |
| 2021/0062078 | A1 | 3/2021 | Kato et al. | |
| 2021/0167288 | A1 | 6/2021 | Hatakeyama et al. | |
| 2021/0217963 | A1 | 7/2021 | Choi et al. | |
| 2021/0277026 | A1 | 9/2021 | Geum et al. | |
| 2021/0336154 | A1 | 10/2021 | Nakano et al. | |
| 2021/0351364 | A1 | 11/2021 | Hatakeyama et al. | |
| 2022/0037596 | A1 | 2/2022 | Doh et al. | |
| 2022/0278278 | A1 | 9/2022 | Rota Matir et al. | |
| 2023/0124349 | A1 | 4/2023 | Stefan et al. | |
| 2023/0159568 | A1 | 5/2023 | Zink et al. | |
| 2023/0309398 | A1 | 9/2023 | Seifermann et al. | |
| 2024/0018165 | A1 | 1/2024 | Seifermann et al. | |

FOREIGN PATENT DOCUMENTS

| | | | |
|---|---|---|---|
| CN | 109192874 | A | 1/2019 |
| CN | 110225917 | A | 9/2019 |
| CN | 110407859 | A | 11/2019 |
| CN | 110872316 | A | 3/2020 |
| CN | 113727985 | A | 11/2021 |
| CN | 114190091 | A | 3/2022 |
| CN | 115210242 | A | 10/2022 |
| EP | 3109253 | A1 | 12/2016 |
| JP | WO2019/012633 | A1 | 7/2019 |
| JP | 2020-512303 | A | 4/2020 |
| JP | 2022-022130 | A | 2/2022 |
| JP | 2023-544435 | A | 10/2023 |
| KR | 10-2018-0134850 | A | 12/2018 |
| KR | 10-2019-0062177 | A | 6/2019 |
| KR | 10-1990818 | B1 | 6/2019 |
| KR | 20190062177 | A | 6/2019 |
| KR | 10-2020-0010076 | A | 1/2020 |
| KR | 10-2020-0080188 | A | 7/2020 |
| KR | 10-2022-0084871 | A | 6/2022 |
| WO | 2015/102118 | A1 | 7/2015 |
| WO | WO 2017/188111 | A1 | 11/2017 |
| WO | 2018/146962 | A1 | 8/2018 |
| WO | 2018/216990 | A1 | 11/2018 |
| WO | WO 2018/203666 | A1 | 11/2018 |
| WO | WO 2019/009052 | A1 | 1/2019 |
| WO | 2019/128633 | A1 | 7/2019 |
| WO | 2019/132040 | A1 | 7/2019 |
| WO | 2020/022751 | A1 | 1/2020 |
| WO | 2020/022770 | A1 | 1/2020 |
| WO | 2020/076108 | A1 | 4/2020 |
| WO | 2020/138873 | A1 | 7/2020 |
| WO | PCT/EP2020/070993 | | 9/2020 |
| WO | 2021/049889 | A1 | 3/2021 |

OTHER PUBLICATIONS

Xiao Liang et al., "Peripheral Amplification of Multi-Resonance Induced Thermally Activated Delayed Fluorescence for Highly Efficient OLEDs", Angewandte Chemie, International Edition, Jul. 30, 2018, pp. 11316-11320. vol. 57, No. 35.

Extended European Search Report issued in corresponding EP Application No. 19185839.8, dated Jan. 23, 2020 (1 page).

International Search Report and Written Opinion issued in corresponding EP Application No. PCT/EP2020/070965, dated Sep. 9, 2020 (9 pages).

International Search Report and Written Opinion of PCT/EP2021/060074, dated Aug. 25, 2021 (10 pages).

US Notice of Allowance dated Feb. 6, 2023, issued in U.S. Appl. No. 16/925,957 (11 pages).

Office action issued in corresponding CN Patent Application No. 202080051810.3, dated Mar. 21, 2024 (12 pages).

Chinese Office Action issued on Nov. 6, 2024, for corresponding application No. 202180030599.1 (8 pages).

US Office Action dated Feb. 21, 2025, issued in U.S. Appl. No. 17/628,641 (42 pages).

US Final Office Action dated May 1, 2025, issued in U.S. Appl. No. 17/628,641 (32 pages).

US Office Action dated Nov. 18, 2025, issued in U.S. Appl. No. 17/996,915 (26 pages).

(56) References Cited

OTHER PUBLICATIONS

Chinese Office Action corresponding to CN Application No. 202180059199.3, dated Feb. 10, 2026 (10 pages).
US Final Office Action dated Mar. 9, 2026, issued in U.S. Appl. No. 17/996,915 (20 pages).
US Office Action dated Mar. 19, 2026, issued in U.S. Appl. No. 18/006,380 (11 pages).
US Office Action dated May 11, 2026, issued in U.S. Appl. No. 17/628,641 (29 pages).

* cited by examiner

ORGANIC MOLECULES FOR OPTOELECTRONIC DEVICES

CROSS-REFERENCE TO RELATED APPLICATIONS

This application claims priority under 35 U.S.C. § 371 to International Application No. PCT/EP2020/070993, filed Jul. 24, 2020, which claims priority to European Patent Application No. 20162459.0, filed Mar. 11, 2020, European Patent Application No. 19218997.5, filed Dec. 20, 2019, European Patent Application No. 19202645.8, filed Oct. 11, 2019, and European Patent Application No. 19188361.0, filed Jul. 25, 2019, the disclosures of which are incorporated by reference herein in their entireties.

FIELD OF INVENTION

The invention relates to organic light-emitting molecules and their use in organic light-emitting diodes (OLEDs) and in other optoelectronic devices.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS OF THE INVENTION

Figure 1:
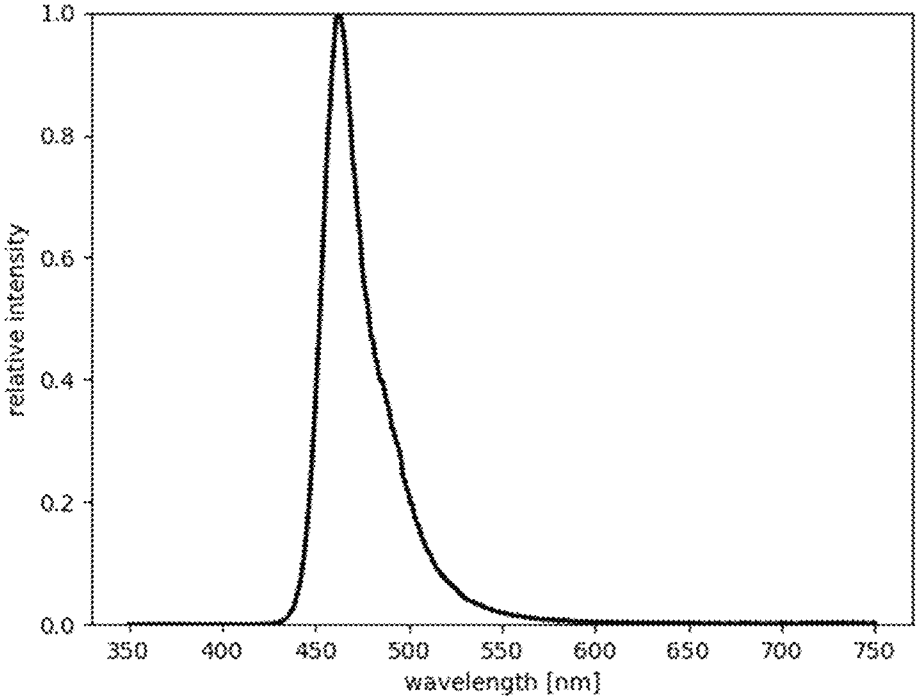
FIG. 1 is an emission spectrum of example 1 (5% by weight) in PMMA.
Figure 2:
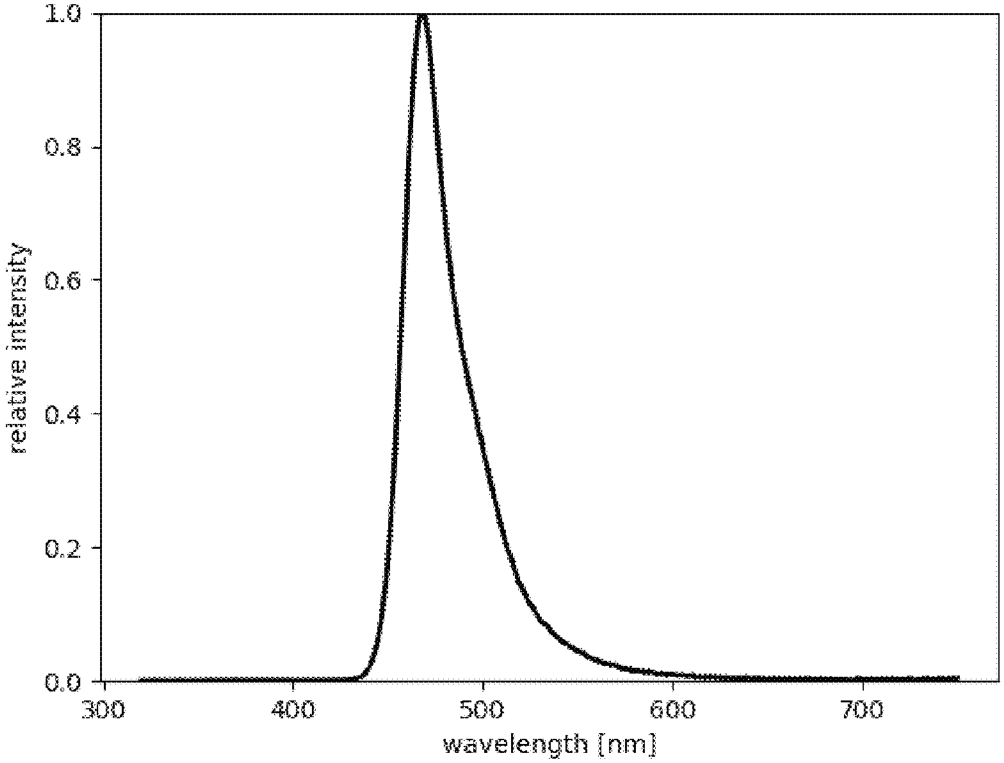
FIG. 2 is an emission spectrum of example 2 (5% by weight) in PMMA.
Figure 3:
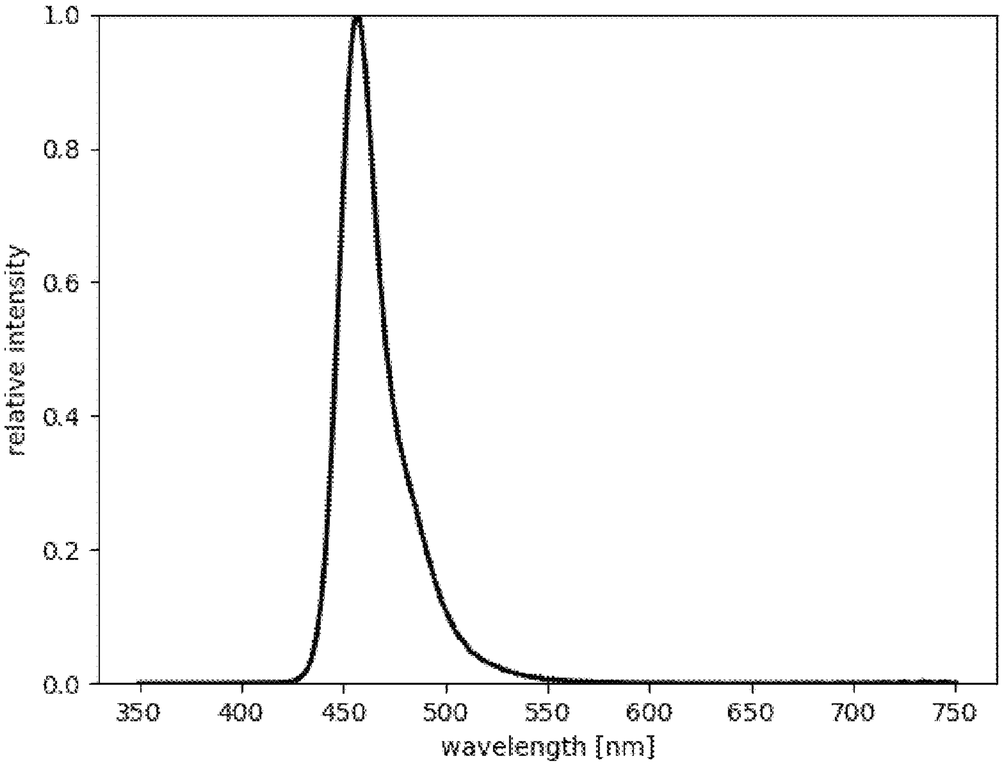
FIG. 3 is an emission spectrum of example 3 (1% by weight) in PMMA.
Figure 4:
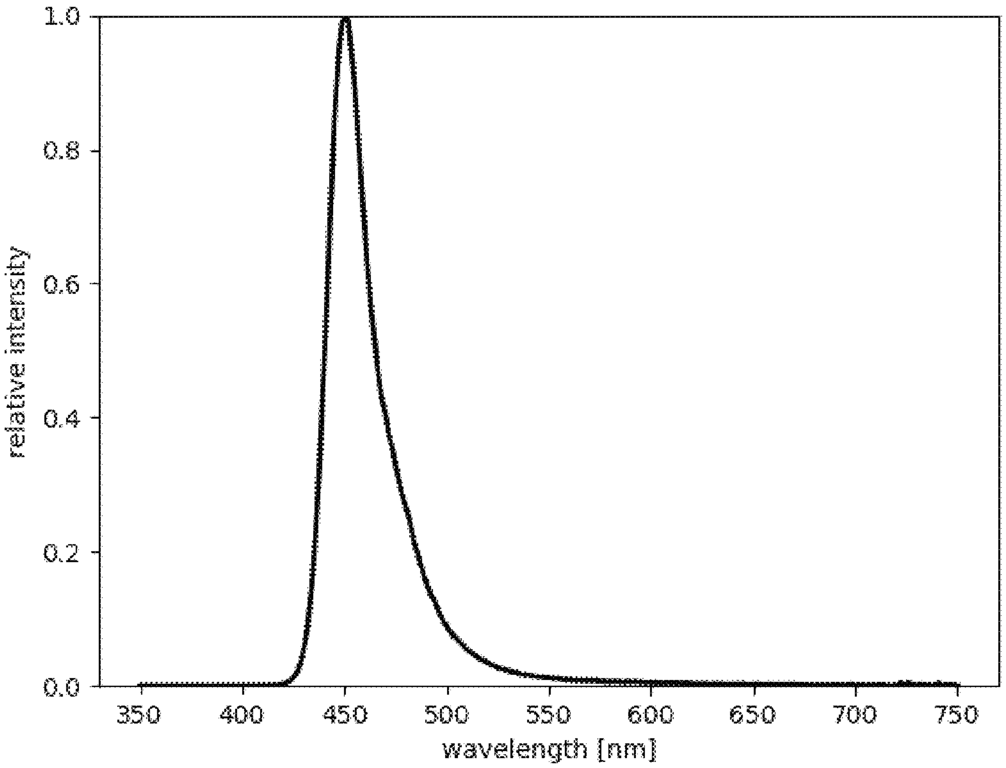
FIG. 4 is an emission spectrum of example 4 (5% by weight) in PMMA.
Figure 5:
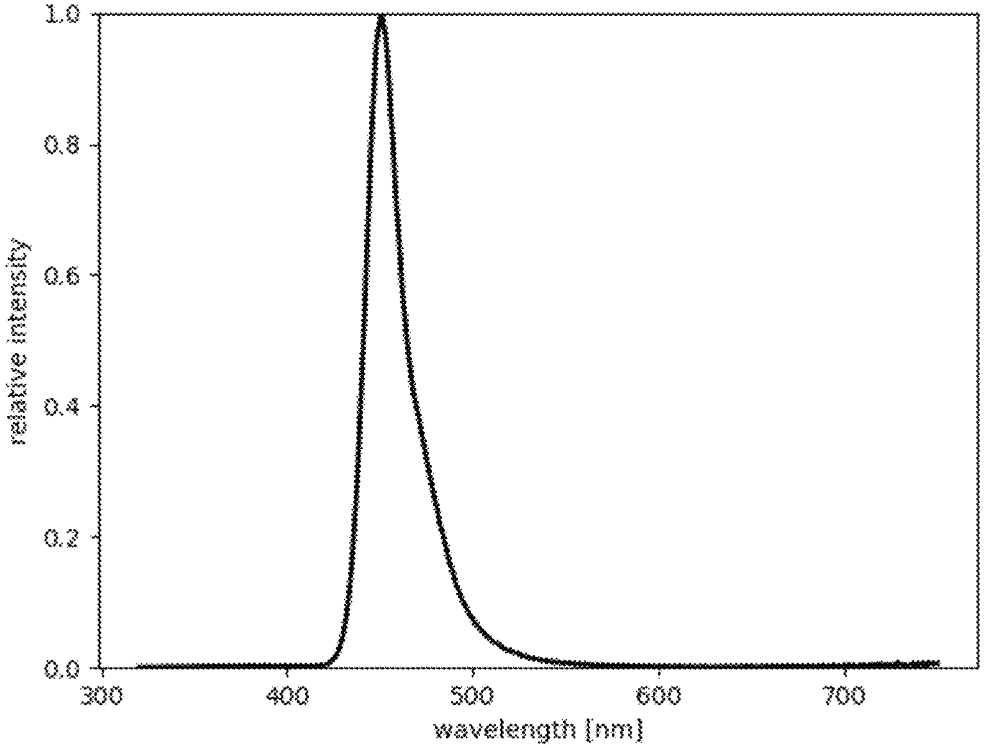
FIG. 5 is an emission spectrum of example 5 (2% by weight) in PMMA.
Figure 6:
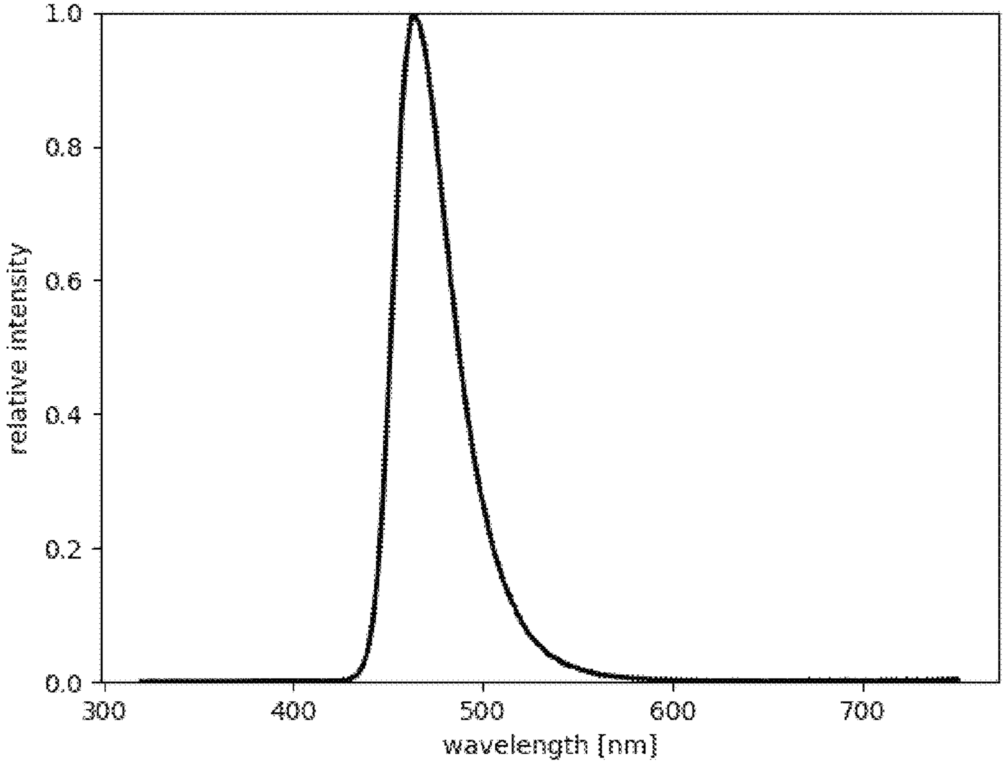
FIG. 6 is an emission spectrum of example 6 (2% by weight) in PMMA.
Figure 7:
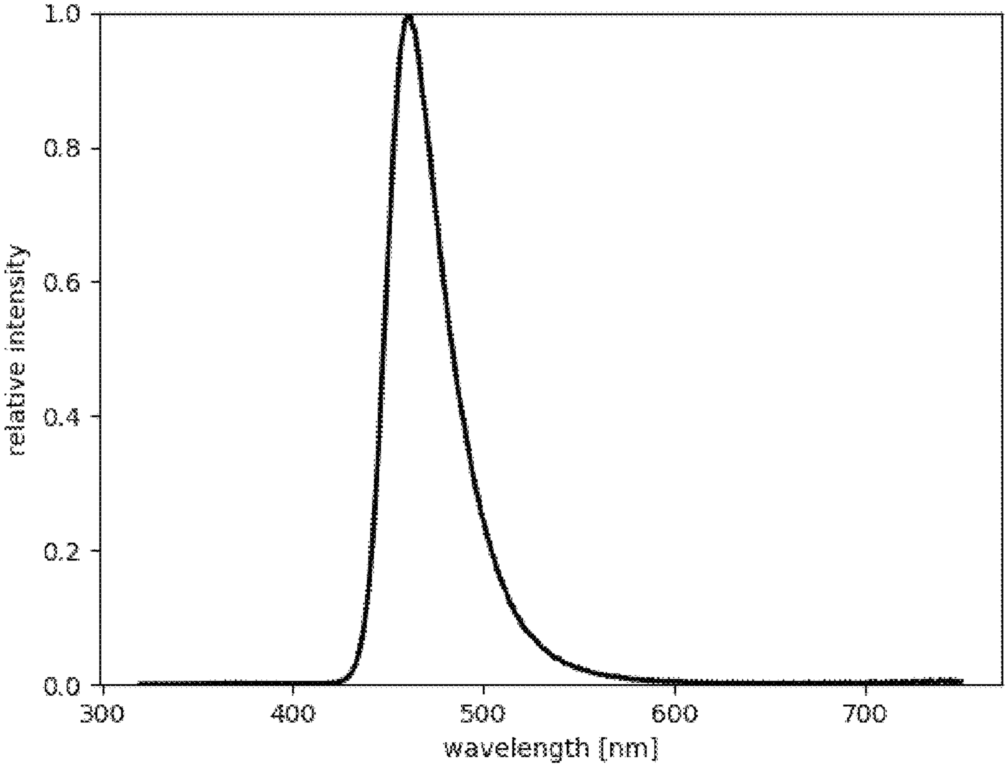
FIG. 7 is an emission spectrum of example 7 (2% by weight) in PMMA.
Figure 8:
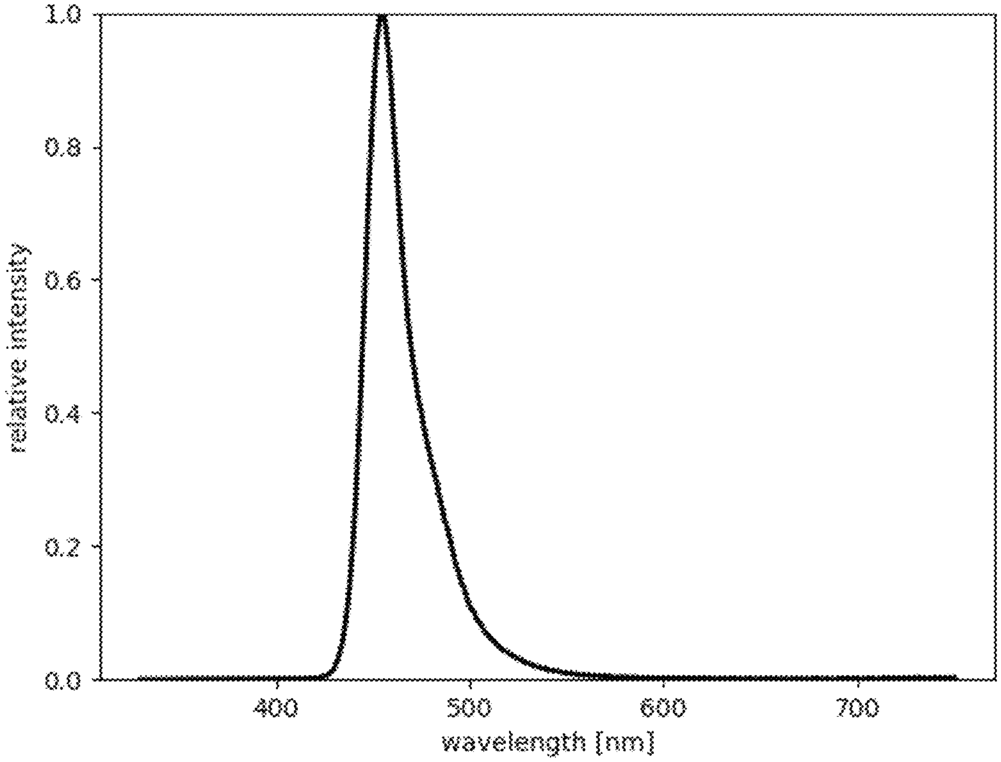
FIG. 8 is an emission spectrum of example 8 (2% by weight) in PMMA.
Figure 9:
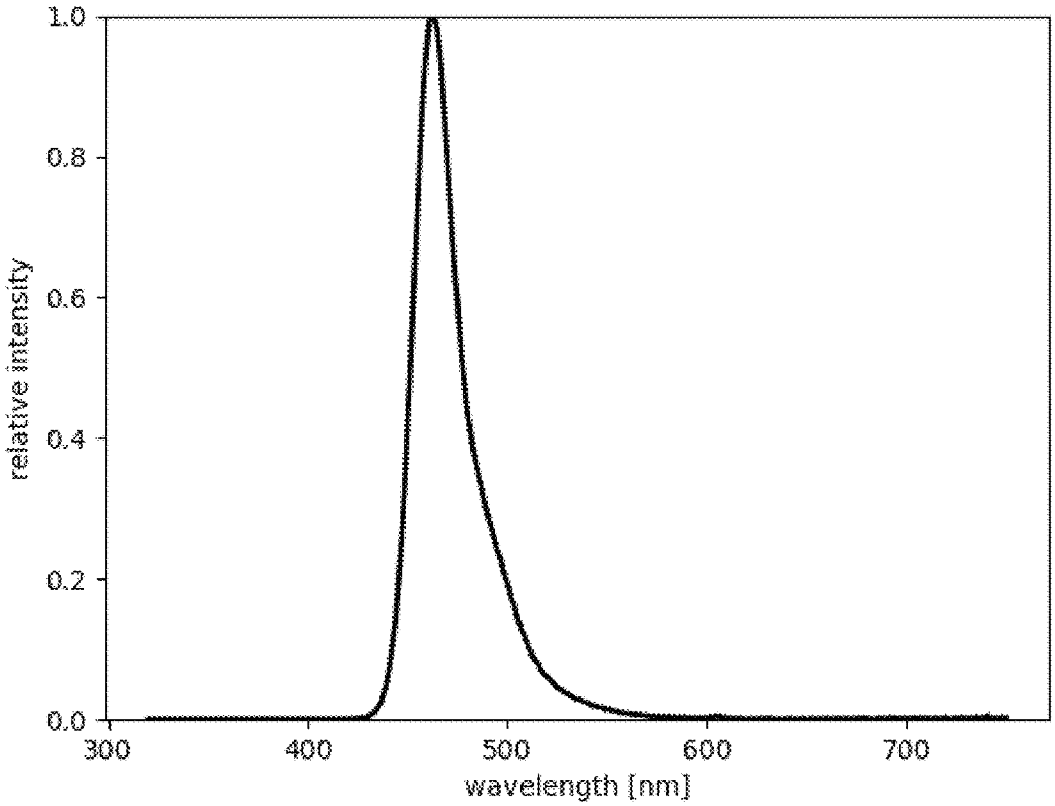
FIG. 9 is an emission spectrum of example 9 (1% by weight) in PMMA.
Figure 10:
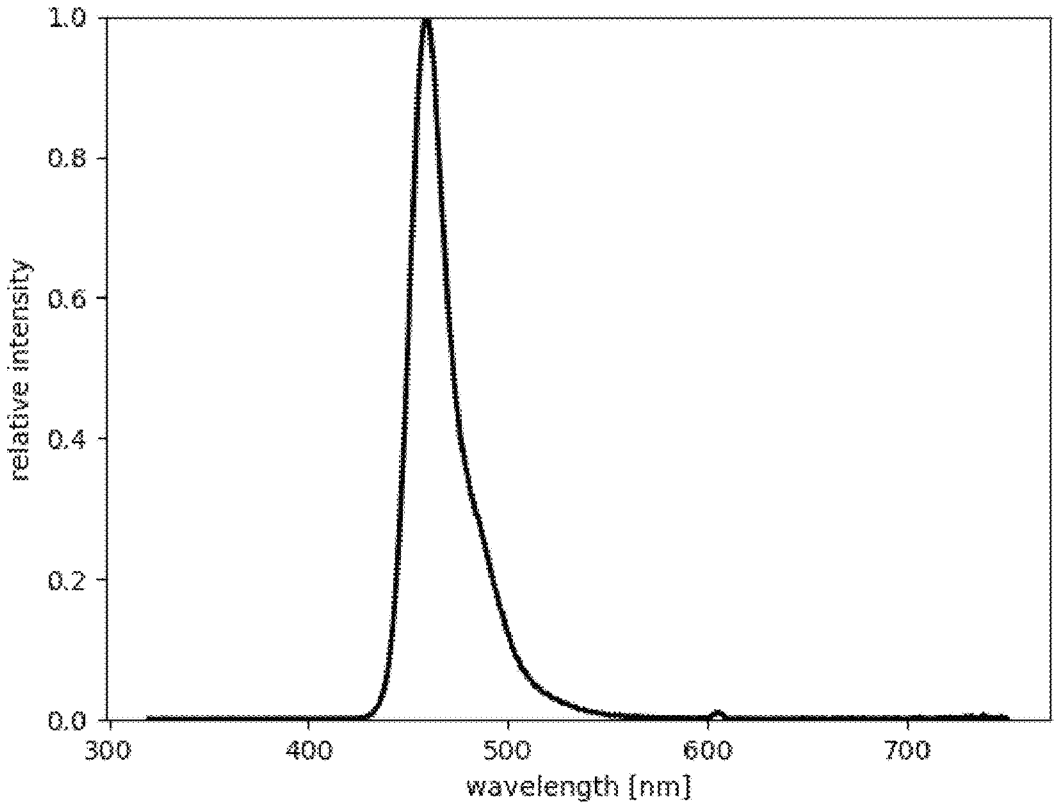
FIG. 10 is an emission spectrum of example 10 (1% by weight) in PMMA.

Exemplary embodiments of the invention will now be discussed in further detail. This invention may, however, be embodied in many different forms and should not be construed as limited to the embodiments set forth herein.

The object of the present invention is to provide molecules which are suitable for use in optoelectronic devices.

This object is achieved by the invention which provides a new class of organic molecules.

According to the invention the organic molecules are purely organic molecules, i.e. they do not contain any metal ions in contrast to metal complexes known for the use in optoelectronic devices. The organic molecules of the invention, however, include metalloids, in particular B, Si, Sn, Se, and/or Ge.

According to the present invention, the organic molecules exhibit emission maxima in the blue, sky-blue or green spectral range. The organic molecules exhibit in particular emission maxima between 420 nm and 520 nm, preferably between 440 nm and 495 nm, more preferably between 450 nm and 470 nm. The photoluminescence quantum yields of the organic molecules according to the invention are, in particular, 50% or more. The use of the molecules according to the invention in an optoelectronic device, for example an organic light-emitting diode (OLED), leads to higher efficiencies or higher color purity, expressed by the full width at half maximum (FWHM) of emission, of the device. Corresponding OLEDs have a higher stability than OLEDs with known emitter materials and comparable color.

The organic molecules described herein in particular shows a severely decreased tendency to form intermolecular aggregates which are known to cause broadening of the photo luminescence (PL) spectra in doped films with increasing concentration. A measure of this spectral broadening in doped films (e.g. spin coated thin films containing 1 wt % or more of the organic molecule in a PMMA matrix) with increasing concentration is the Concentration Dependent Spectral Purity (CDSP) value.

If two organic molecules have a comparable Amax in doped films of the same concentration, the one with a lower CDSP value is preferred in terms of spectral purity. Especially the difference |ΔCDSP| between two concentrations gives evidence whether a material shows a high tendency to aggregate or not: the smaller ΔCDSP, the lower the aggregation tendency of the organic molecule.

The organic light-emitting molecules according to the invention comprise or consist of a structure of formula I:

Formula I

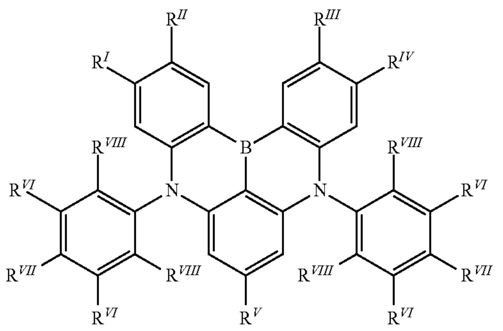

wherein $R^I$, $R^{II}$, $R^{III}$ and $R^{IV}$ is independently from another selected from the group consisting of:

hydrogen, deuterium, $N(R^5)_2$, $OR^5$, $SR^5$, $Si(R^5)_3$, $B(OR^5)_2$, $OSO_2R^5$, $CF_3$,

CN, halogen, $C_1$-$C_{40}$-alkyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, C═O, C═S, C═Se, $C═NR^5$, $P(═O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C═CR^5$, C≡C, $Si(R^5)_2$, $Ge(R^5)_2$, $Sn(R^5)_2$, C═O, C═S, C═Se, $C═NR^5$, $P(═O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C═CR^5$, C≡C, $Si(R^5)_2$, $Ge(R^5)_2$, $Sn(R^5)_2$, C═O, C═S, C═Se, $C═NR^5$, $P(═O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C═CR^5$, C≡C, $Si(R^5)_2$, $Ge(R^5)_2$, $Sn(R^5)_2$, C═O, C═S, C═Se, $C═NR^5$, $P(═O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C═CR^5$, C≡C, $Si(R^5)_2$, $Ge(R^5)_2$, $Sn(R^5)_2$, C═O, C═S, C═Se, $C═NR^5$, $P(═O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$.

$R^5$ is at each occurrence independently from another selected from the group consisting of: hydrogen, deuterium, OPh (Ph=phenyl), SPh, $CF_3$, CN, F, $Si(C_1$-$C_5$-alkyl$)_3$, $Si(Ph)_3$, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_5$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_1$-aryl$)_2$, $N(C_3$-$C_{17}$-heteroaryl$)_2$; and $N(C_3$-$C_{17}$-heteroaryl$)(C_6$-$C_{18}$-aryl).

$R^V$ is at each occurrence independently from another selected from the group consisting of: $C_1$-$C_5$-alkyl, wherein one or more hydrogen atoms are optionally substituted by deuterium;

$C_6$-$C_{18}$-aryl, wherein optionally one or more hydrogen atoms are independently from each other substituted by $C_1$-$C_5$-alkyl, $C_6$-$C_{18}$ aryl or $C_3$-$C_{17}$-heteroaryl;

$C_3$-$C_1$-heteroaryl, wherein optionally one or more hydrogen atoms are independently from each other substituted by $C_1$-$C_5$-alkyl, $C_6$-$C_{18}$ aryl or $C_3$-$C_{17}$-heteroaryl.

$R^{VI}$, $R^{VII}$ and $R^{VIII}$ are at each occurrence independently from another selected from the group consisting of: hydrogen, deuterium, $C_1$-$C_5$-alkyl, wherein one or more hydrogen atoms are optionally substituted by deuterium;

$C_6$-$C_{18}$-aryl, wherein optionally one or more hydrogen atoms are independently from each other substituted by $C_1$-$C_5$-alkyl, $C_6$-$C_{18}$ aryl or $C_3$-$C_{17}$-heteroaryl;

$C_3$-$C_{18}$-heteroaryl, wherein optionally one or more hydrogen atoms are independently from each other substituted by $C_1$-$C_5$-alkyl, $C_6$-$C_{18}$ aryl or $C_3$-$C_{17}$-heteroaryl.

In one embodiment of the organic molecule, $R^I$, $R^{II}$, $R^{III}$ and $R^{IV}$ are independently from another selected from the group consisting of:

hydrogen, deuterium, halogen, Me, $^i$Pr, $^t$Bu, CN, $CF_3$, $SiMe_3$, $SiPh_3$, Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment, $R^I$, $R^{II}$, $R^{II}$ and $R^{IV}$ are independently from another selected from the group consisting of:

hydrogen, deuterium, halogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment, $R^I$, $R^{II}$, $R^{III}$ and $R^{IV}$ is independently from another selected from the group consisting of: hydrogen, deuterium, halogen, Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph, and $N(Ph)_2$.

In one embodiment, $R^I$, $R^{II}$, $R^{II}$ and $R^{IV}$ is independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, carbazolyl, which is optionally substituted with one or more substituents independently from each other selected from the group consisting of Me, $^i$Pr, $^t$Bu, CN, $CF_3$, and Ph, and $N(Ph)_2$.

In one embodiment $R^I$, $R^{II}$, $R^{III}$ and $R^{IV}$ is independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, and $N(Ph)_2$.

In one embodiment, $R^I$, $R^{II}$, $R^{II}$ and $R^{IV}$ is independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, and $N(Ph)_2$.

In one embodiment, $R^I$, $R^{II}$, $R^{III}$ and $R^{IV}$ is independently from another selected from the group consisting of: hydrogen, $^t$Bu, and Ph.

In one embodiment, $R^I$ is hydrogen.

In one embodiment, $R^I$ is $^t$Bu.

In one embodiment, $R^I$ is Ph.

In one embodiment, $R^{II}$ is hydrogen.

In one embodiment, $R^{II}$ is $^t$Bu.

In one embodiment, $R^{II}$ is Ph.

In one embodiment, $R^{III}$ is hydrogen.

In one embodiment, $R^{III}$ is $^t$Bu.

In one embodiment, $R^{III}$ is Ph.

In one embodiment, $R^{IV}$ is hydrogen.

In one embodiment, $R^{IV}$ is $^t$Bu.

In one embodiment, $R^{IV}$ is Ph.

In one embodiment, $R^I$ and $R^{IV}$ are hydrogen, and $R^{II}$ is equal to $R^{II}$, in particular, $R^{II}$ and $R^{III}$ are identical.

In one embodiment, $R^I$ and $R^{IV}$ are hydrogen, and $R^{II}$ and $R^{III}$ are $^t$Bu.

In one embodiment, $R^I$ and $R^{IV}$ are hydrogen, and $R^{II}$ and $R^{III}$ are Ph.

In one embodiment, $R^V$ is mesityl (Mes) or 2-meta-ter-phenyl.

In one embodiment, $R^V$ is 2-meta-ter-phenyl.

In one embodiment, $R^V$ is $C_3$-$C_{15}$-heteroaryl, wherein optionally one or more hydrogen atoms are independently from each other substituted by $C_1$-$C_5$-alkyl, $C_6$-$C_{18}$ aryl or $C_3$-$C_{17}$-heteroaryl. For example, $R^V$ could be a carbazole group, optionally substituted with a phenyl group (Ph).

In one embodiment, $R^V$ comprises or consists of a structure of formula II:

Formula II

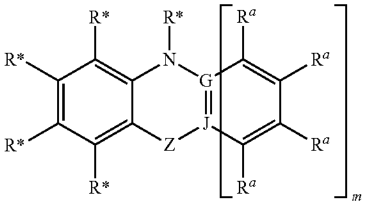

wherein

Z is at each occurrence independently selected from the group consisting of a direct bond (linking the two adjacent pheny rings), $NR^5$, $Si(R^5)_2$, $C(R^5)_2$, $BR^5$, O, S, S(O) and $S(O)_2$;

m is 0 or 1;

G is C if m=1; G is CR if m=0;

J is C if m=1; J is CR if m=0;

R* is at each occurrence independently from another selected from the binding site of $R^V$ to the structure shown in formula I or $R^a$;

$R^a$ is at each occurrence independently from another selected from the group consisting of:

hydrogen, $C_1$-$C_5$-alkyl, $C_6$-$C_{18}$ aryl or $C_3$-$C_{17}$-heteroaryl;

wherein exactly one R* of Formula II represents the binding site of $R^V$ to the structure shown in formula I.

Examples of organic molecules are listed below:

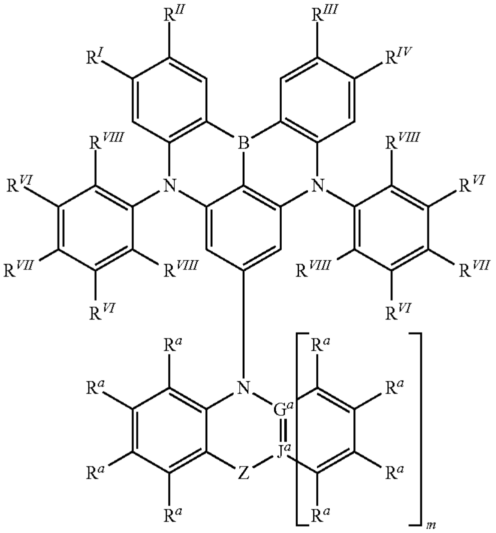

-continued
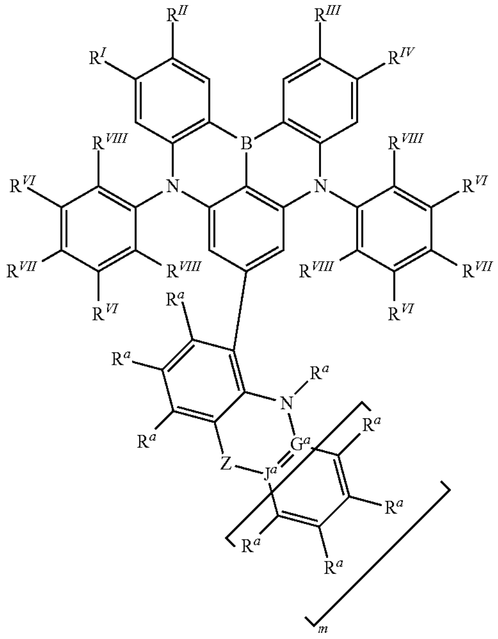
-continued
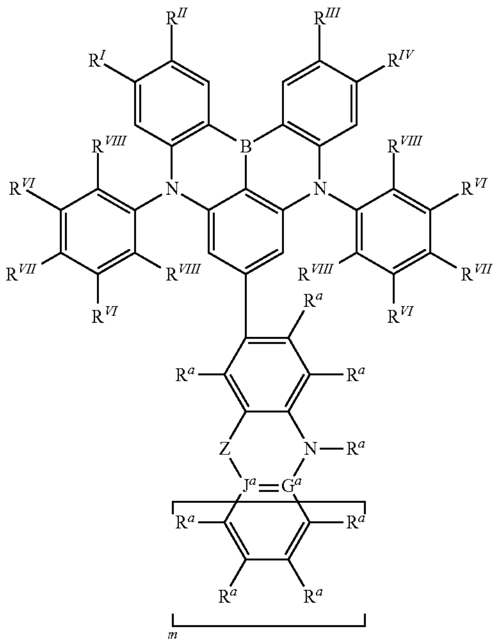
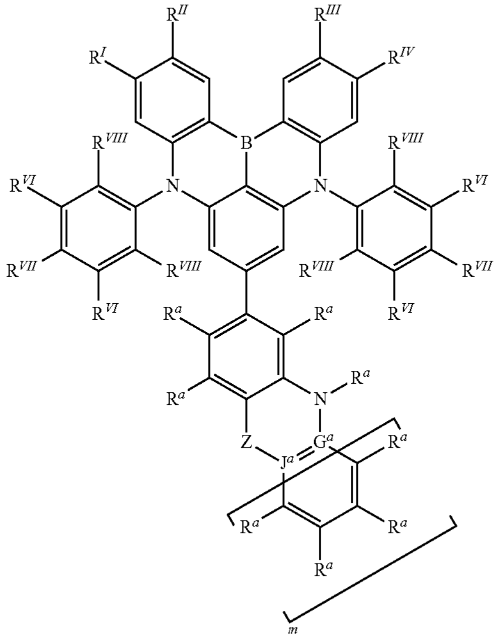
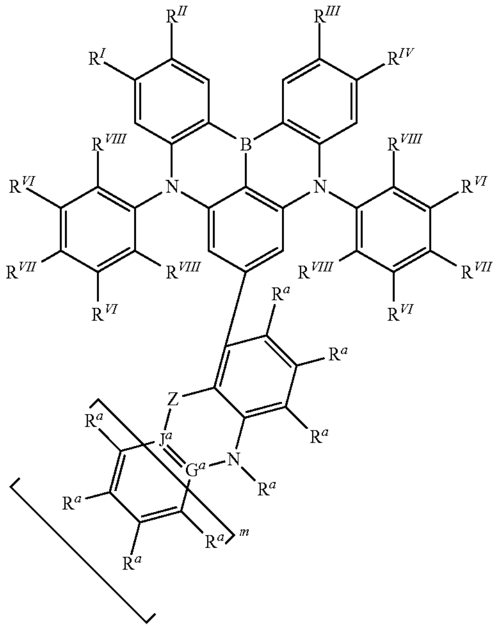

-continued
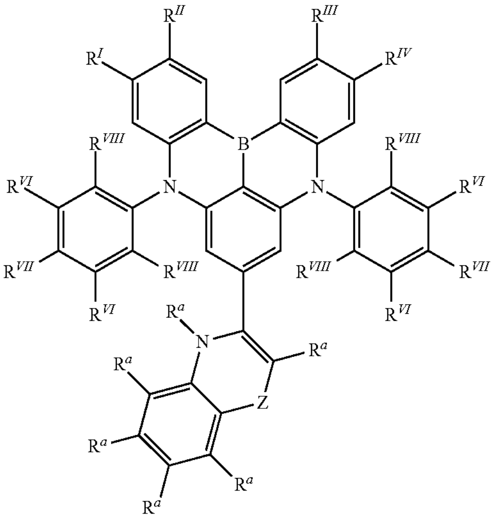
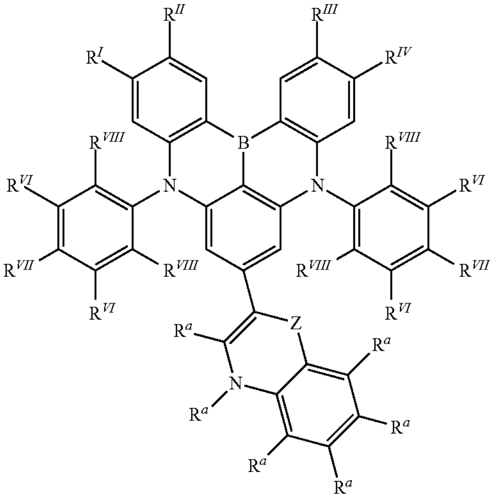
For m=1, formula II may be represented by formula II-1:
Formula II-1
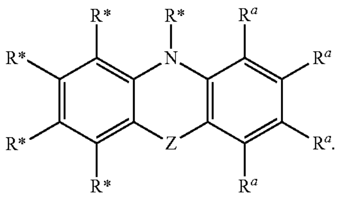
Examples of organic molecules are listed below:
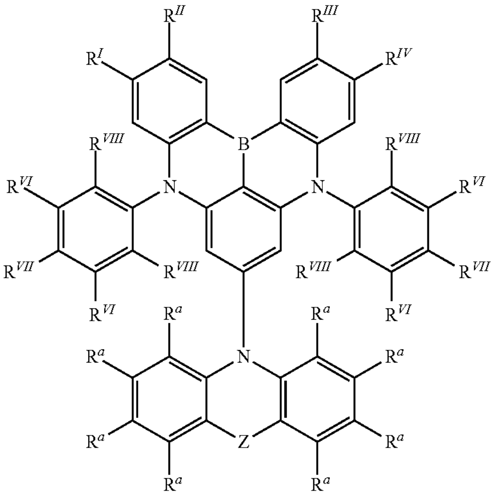
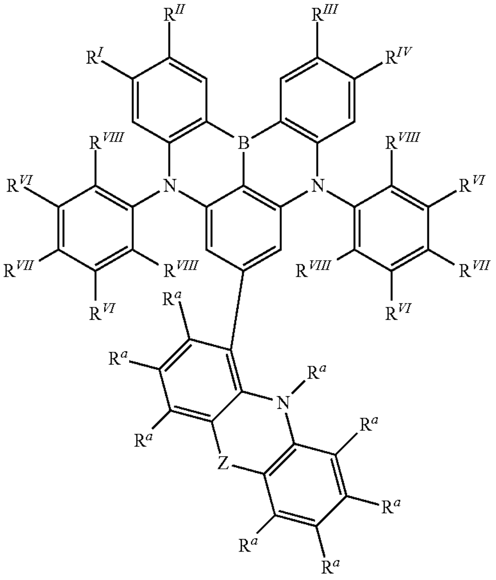
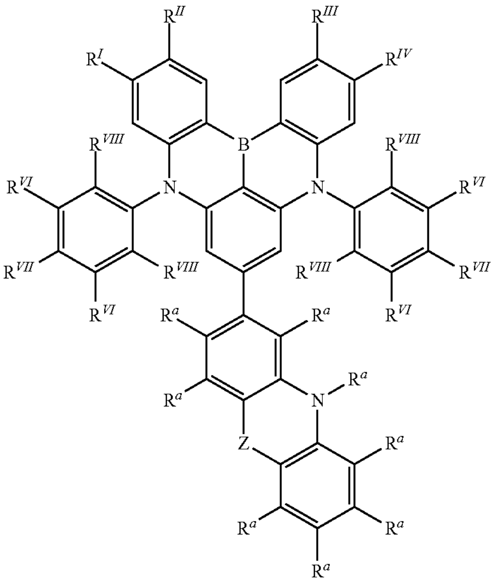

-continued
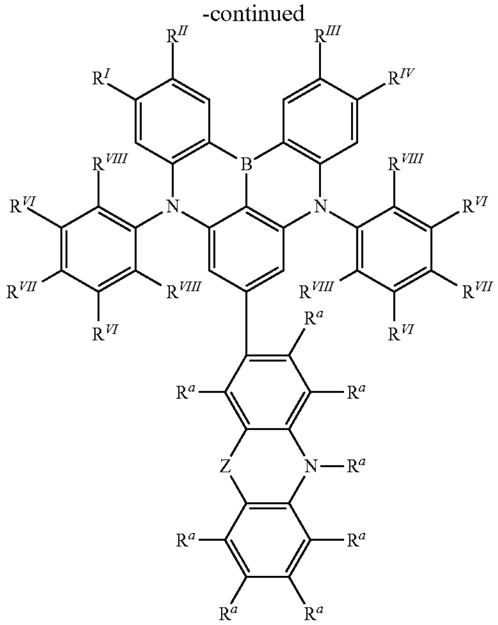
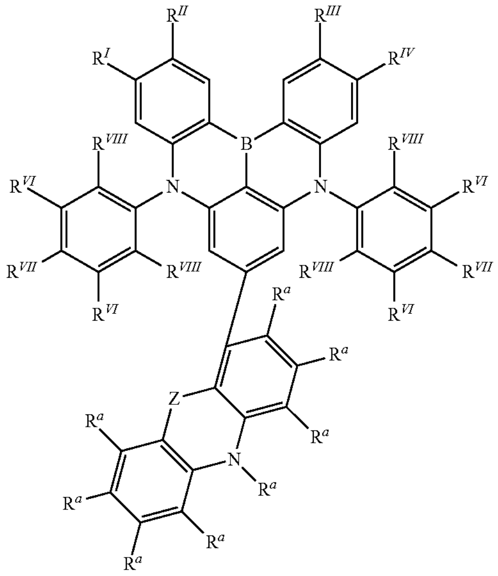
For m=0, formula II is represented by formula II-0:
Formula II-0
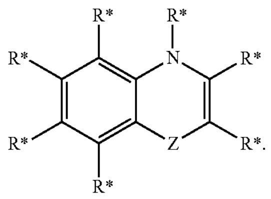
Examples of organic molecules are listed below:
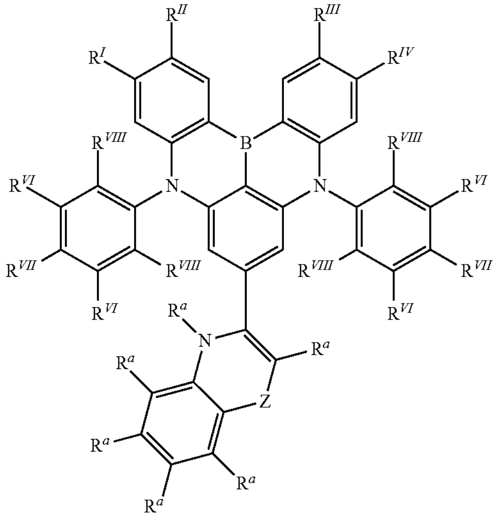
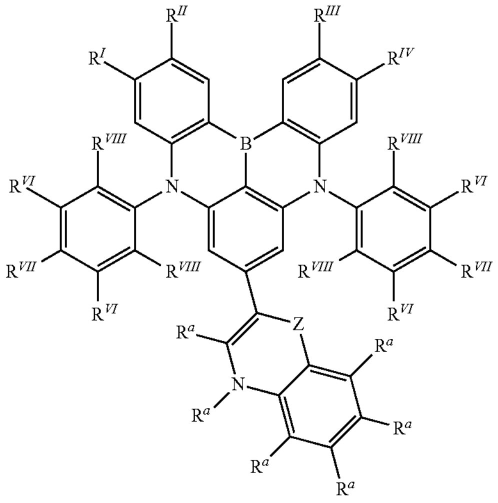
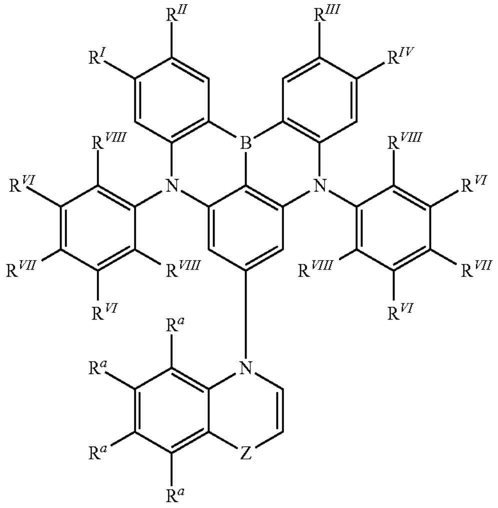

-continued
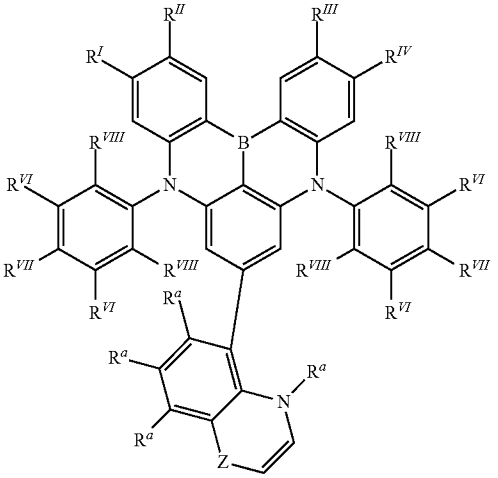
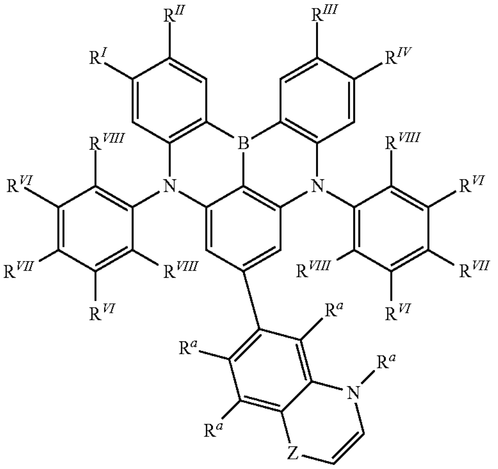
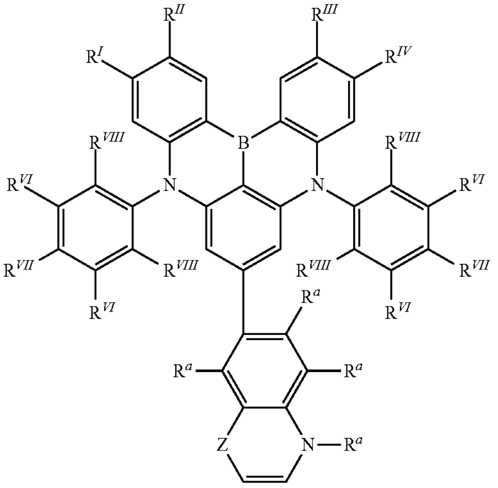
-continued
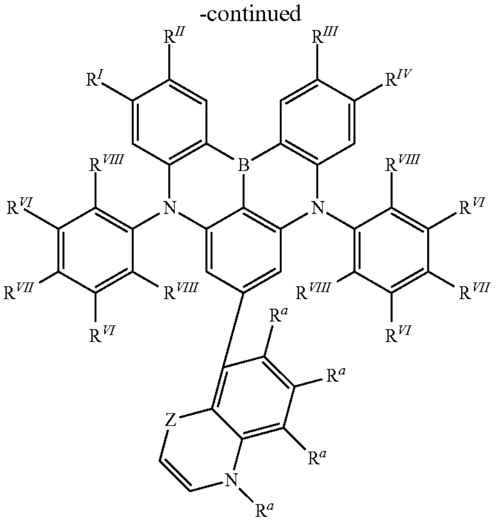
In one embodiment $R^V$ comprises or consists of a structure of formula II, wherein Z is a direct bond.
Examples of organic molecules are listed below:
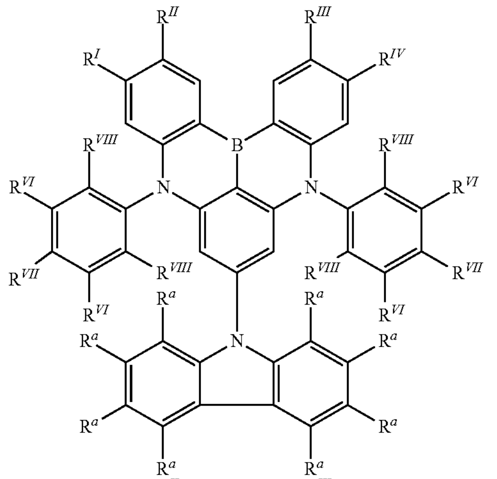
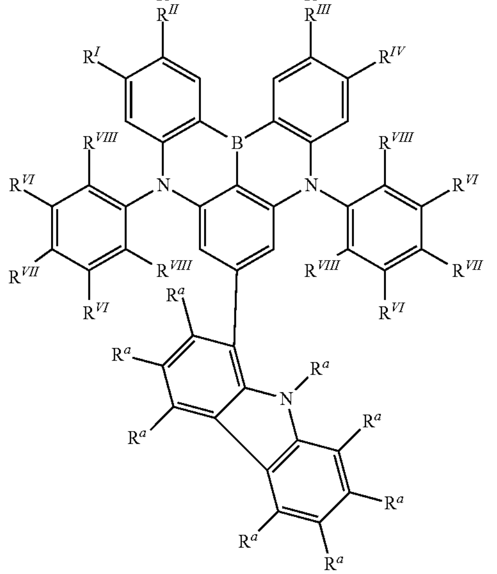

-continued
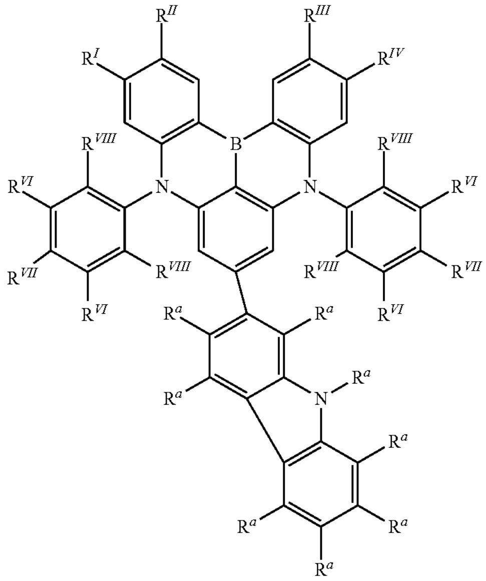
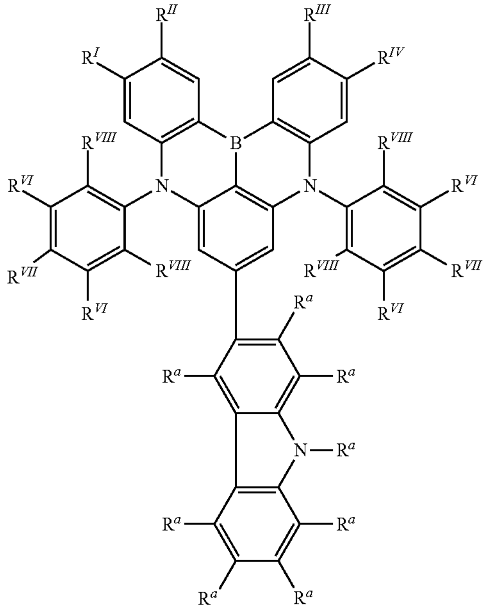
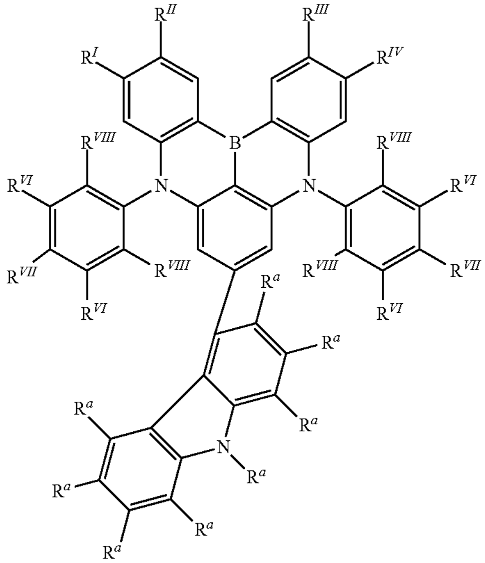
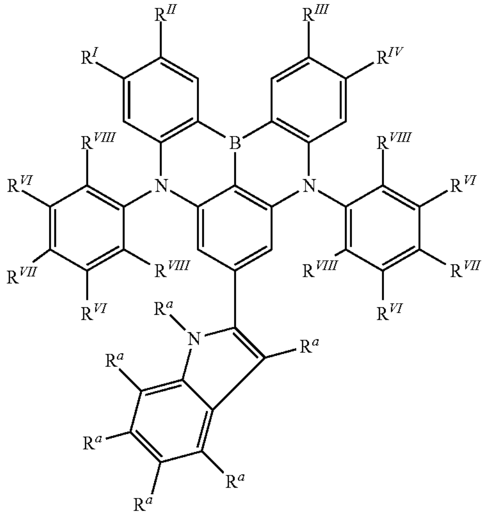
-continued
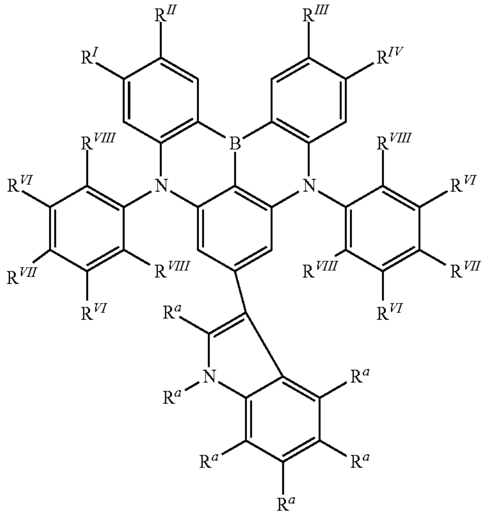

-continued
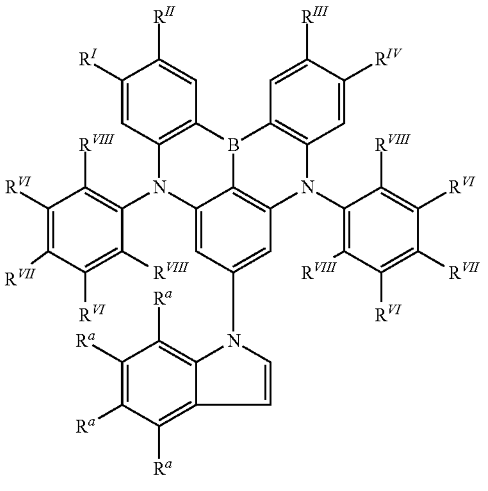
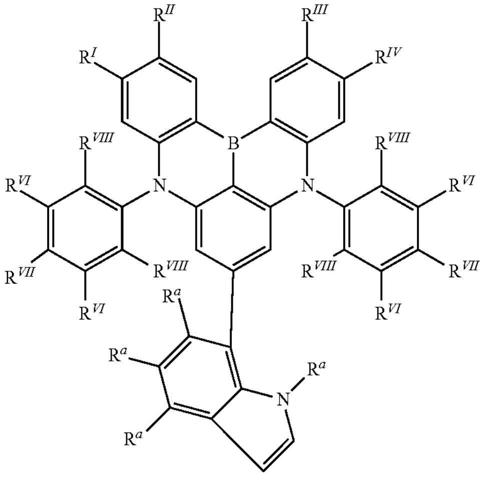
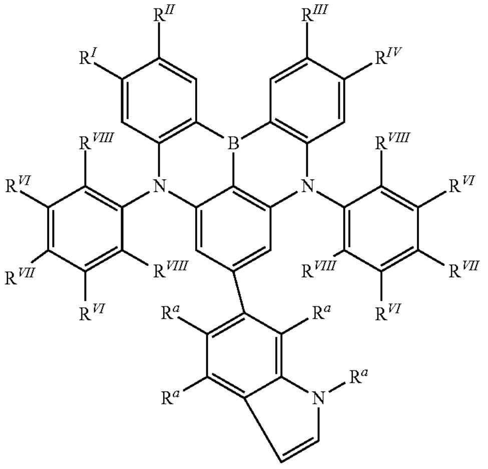
-continued
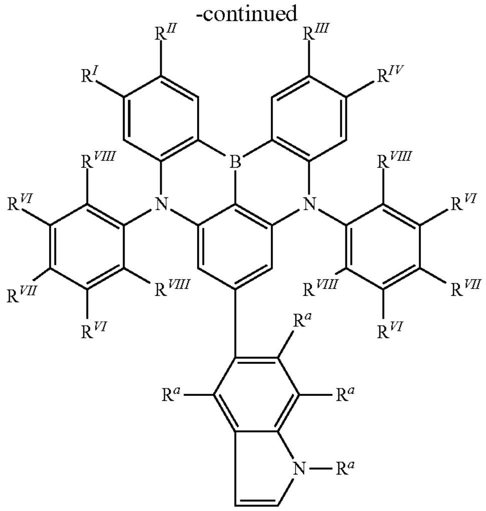
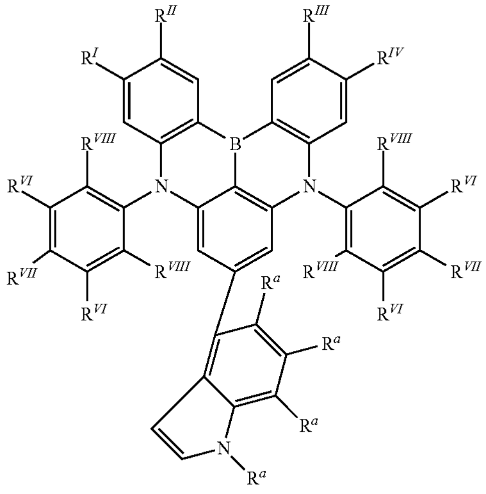
In one embodiment, $R^V$ comprises or consists of a structure of formula II, wherein m is 1.
In a further embodiment, $R^V$ comprises or consists of a structure of formula II, wherein m is 1 and Z is a direct bond.
In one embodiment, $R^V$ comprises or consists of a structure of formula II-a, formula I-b or formula II-c:
Formula II-a
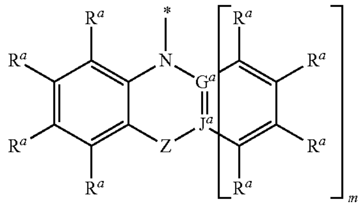
Formula II-b
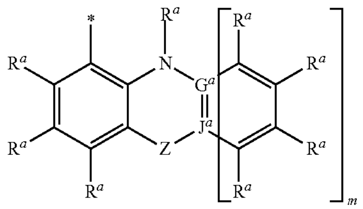

-continued

Formula II-c

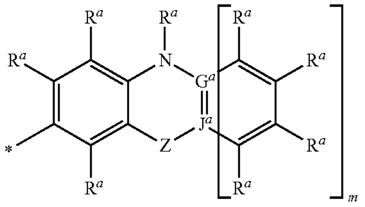

wherein

* represents the binding site to the structure shown in formula I;

$G^a$ is C if m=1; $G^a$ is $CR^a$ if m=0;

$J^a$ is C if m=1; $J^a$ is $CR^a$ if m=0.

In one embodiment, $R^V$ comprises or consists of a structure of formula II-a, II-b or II-c, wherein Z is a direct bond.

In one embodiment, $R^V$ comprises or consists of a structure of formula II-a, formula II-b or formula II-c, wherein m is 1.

In a further embodiment, $R^V$ comprises or consists of a structure of formula II-a, formula II-b or formula II-c, wherein m is 1 and Z is a direct bond.

In a further embodiment, $R^V$ comprises or consists of a structure of formula II-I, formula II-II or formula II-III:

Formula II-I

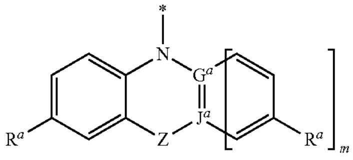

Formula II-II

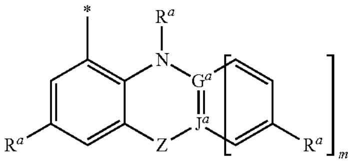

Formula II-III

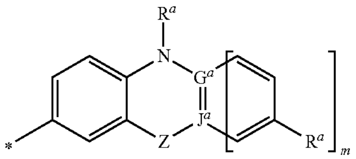

In one embodiment, $R^V$ comprises or consists of a structure of formula II-I, II-II or II-III, wherein Z is a direct bond.

In one embodiment, $R^V$ comprises or consists of a structure of formula II-I, II-II or II-III, wherein m is 1.

In a further embodiment $R^V$ comprises or consists of a structure of formula II-I, formula II-II or formula II-II, wherein m is 1 and Z is a direct bond.

In a preferred embodiment, $R^V$ comprises or consists of a structure of formula II-a:

Formula II-a

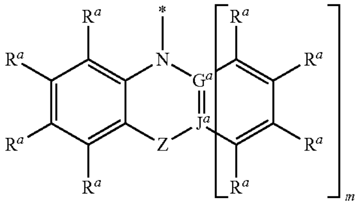

In one embodiment $R^V$ comprises or consists of a structure of one of formulae II-a-I, II-a-II, II-a-IIII, II-a-IV, II-a-V, II-a-VI, II-a-VII, II-a-VIII, and II-a-IX:

Formula II-a-I

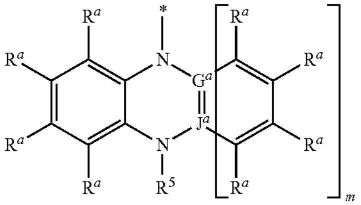

Formula II-a-II

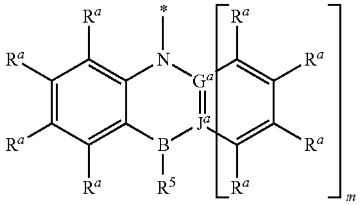

Formula II-a-III

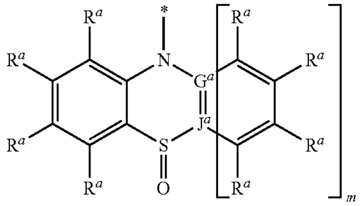

Formula II-a-IV

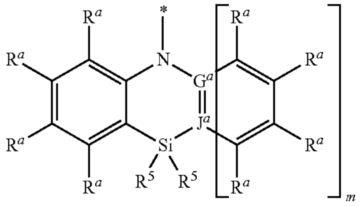

Formula II-a-V

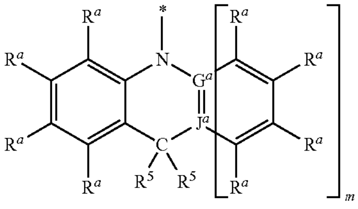

-continued

Formula II-a-VI

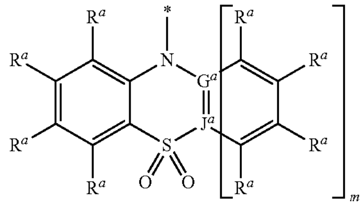

Formula II-a-VII

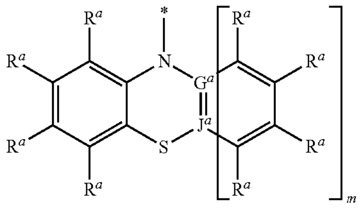

Formula II-a-VIII

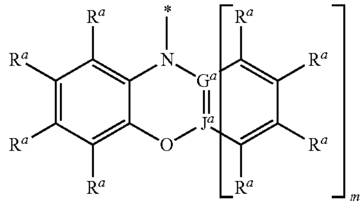

Formula II-a-IX

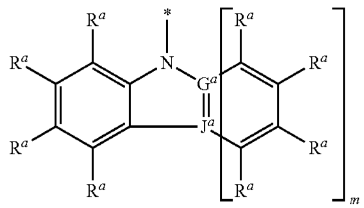

In a preferred embodiment $R^V$ comprises or consists of a structure of formula II-a, wherein Z is a direct bond.

In one embodiment $R^V$ comprises or consists of a structure of formula II-a, wherein m is 1.

In a further embodiment $R^V$ comprises or consists of a structure of formula II-a, wherein m is 1 and Z is a direct bond.

In a preferred embodiment, $R^V$ comprises or consists of a structure of formula II-I:

Formula II-I

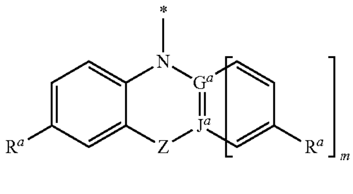

In one embodiment $R^V$ comprises or consists of a structure of formula II-I, wherein Z is a direct bond.

In one embodiment, $R^V$ comprises or consists of a structure of formula II-I, wherein m is 1.

In a further embodiment, $R^V$ comprises or consists of a structure of formula II-I, wherein m is 1 and Z is a direct bond.

In a certain embodiment, $R^V$ comprises or consists of a structure of formula II-I, wherein $R^a$ is hydrogen.

In one embodiment, $R^{VI}$, $R^{VII}$ and $R^{VIII}$ are at each occurrence independently from each other selected from the group consisting of hydrogen, $C_1$-$C_5$-alkyl, $C_6$-$C_{18}$-aryl, wherein optionally one or more hydrogen atoms are independently from each other substituted by $C_1$-$C_5$-alkyl or $C_6$-$C_{18}$-aryl.

In one embodiment, $R^{VI}$, $R^{VII}$ and $R^{VIII}$ are at each occurrence independently from each other selected from the group consisting of hydrogen, Ph (phenyl) and ${}^{t}$Bu.

In one embodiment, $R^{VI}$ is Ph, and $R^{VII}$ and $R^{VIII}$ are both hydrogen.

In one embodiment, $R^{VII}$ is Ph, and $R^{VI}$ and $R^{VII}$ are both hydrogen.

In one embodiment, $R^{VI}$ is ${}^{t}$Bu, and $R^{VII}$ and $R^{VIII}$ are both hydrogen.

In one embodiment, $R^{VII}$ is ${}^{t}$Bu, and $R^{VI}$ and $R^{VIII}$ are both hydrogen.

In one embodiment, the organic molecule comprises or consists of a structure of formula Ia:

Formula Ia

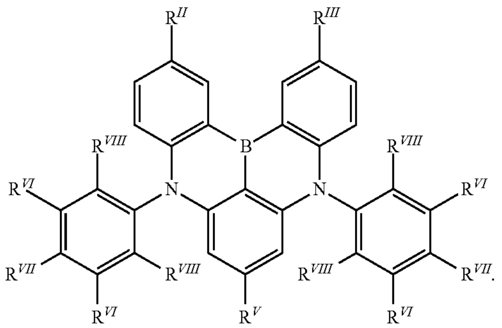

wherein $R^{II}$ and $R^{III}$ is independently from another selected from the group consisting of: hydrogen, deuterium, halogen, Me, ${}^{i}$Pr, ${}^{t}$Bu, CN, $CF_3$, Ph, which is optionally substituted with one or more substituents independently from each other selected from the group consisting of Me, ${}^{i}$Pr, ${}^{t}$Bu, CN, $CF_3$, and Ph, pyridinyl, which is optionally substituted with one or more substituents independently from each other selected from the group consisting of Me, ${}^{i}$Pr, ${}^{t}$Bu, CN, $CF_3$, and Ph, pyrimidinyl, which is optionally substituted with one or more substituents independently from each other selected from the group consisting of Me, ${}^{i}$Pr, ${}^{t}$Bu, CN, $CF_3$, and Ph, and triazinyl, which is optionally substituted with one or more substituents independently from each other selected from the group consisting of Me, ${}^{i}$Pr, ${}^{t}$Bu, CN, $CF_3$, and Ph, and $N(Ph)_2$.

In one embodiment, the organic molecule comprises or consists of a structure of formula Ia, wherein $R^{II}$ and $R^{III}$ is independently from another selected from the group consisting of: hydrogen, deuterium, Me, ${}^{i}$Pr, ${}^{t}$Bu, Ph, which is optionally substituted with one or more substituents independently from each other selected from the group consisting of Me, ${}^{i}$Pr, ${}^{t}$Bu, and Ph, carbazolyl, which is optionally substituted with one or more substituents independently from each other selected from the group consisting of Me, $^{i}$Pr, $^{t}$Bu, CN, $CF_3$, and Ph, and $N(Ph)_2$.

In one embodiment, the organic molecule comprises or consists of a structure of formula Ia, wherein $R^{II}$ and $R^{II}$ is each independently from another selected from the group consisting of: hydrogen, deuterium, Me, $^{i}$Pr, $^{t}$Bu, Ph, which is optionally substituted with one or more substituents independently from each other selected from the group consisting of Me, $^{i}$Pr, $^{t}$Bu, and Ph, and $N(Ph)_2$.

In one embodiment, the organic molecule comprises or consists of a structure of formula Ia, wherein $R^{II}$ and $R^{III}$ is independently from another selected from the group consisting of: hydrogen, deuterium, Me, $^{i}$Pr, $^{t}$Bu, Ph, which is optionally substituted with one or more substituents independently from each other selected from the group consisting of Me, $^{i}$Pr, $^{t}$Bu, and Ph, and $N(Ph)_2$.

In one embodiment, the organic molecule comprises or consists of a structure of formula Ia, wherein $R^{II}$ and $R^{III}$ is independently from another selected from the group consisting of: hydrogen, $^{t}$Bu, and Ph.

In one embodiment, the organic molecule comprises or consists of a structure of formula Ia, wherein $R^{II}$ is hydrogen.

In one embodiment, the organic molecule comprises or consists of a structure of formula Ia, wherein $R^{II}$ is $^{t}$Bu.

In one embodiment, the organic molecule comprises or consists of a structure of formula Ia, wherein $R^{II}$ is Ph.

In one embodiment, the organic molecule comprises or consists of a structure of formula Ia, wherein $R^{III}$ is hydrogen.

In one embodiment, the organic molecule comprises or consists of a structure of formula Ia, wherein $R^{III}$ is $^{t}$Bu.

In one embodiment, the organic molecule comprises or consists of a structure of formula Ia, wherein $R^{III}$ is Ph.

In one embodiment, the organic molecule comprises or consists of a structure of formula Ia, wherein $R^{II}$ is equal to $R^{III}$, in particular, $R^{II}$ and $R^{III}$ are identical.

In one embodiment, the organic molecule comprises or consists of a structure of formula Ia, wherein $R^{II}$ and $R^{II}$ are $^{t}$Bu.

In one embodiment, the organic molecule comprises or consists of a structure of formula Ia, wherein $R^{II}$ and $R^{II}$ are Ph.

In one embodiment, the organic molecule comprises or consists of a structure of formula Ia, wherein $R^{II}$ and $R^{III}$ are hydrogen.

In one embodiment, the organic molecule comprises or consists of a structure of formula Ia, wherein $R^{V}$ is mesityl (Mes) or 2-meta-ter-phenyl.

In one embodiment, the organic molecule comprises or consists of a structure of formula Ia, wherein $R^{V}$ is 2-meta-ter-phenyl.

In one embodiment, the organic molecule comprises or consists of a structure of formula Ia, wherein $R^{V}$ comprises or consists of a structure of formula II:

Formula II

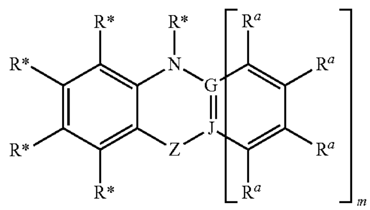

Examples of organic molecules are listed below:

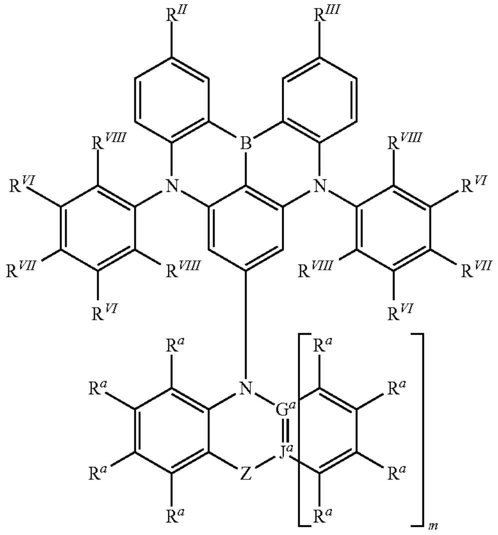

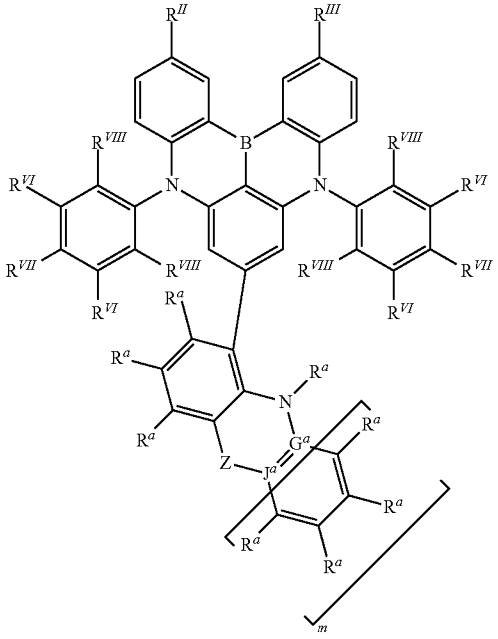

-continued
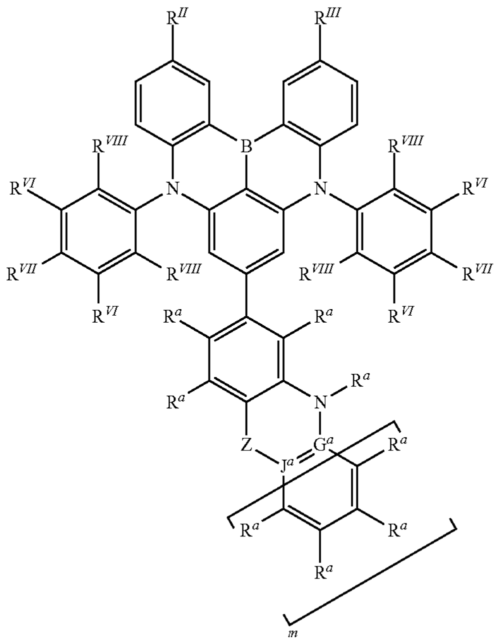
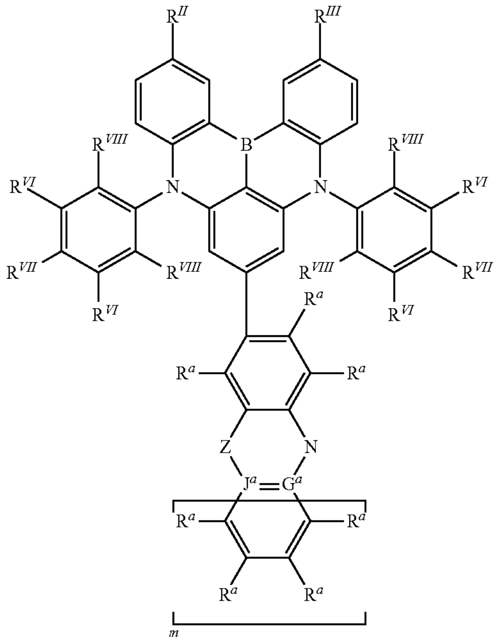
-continued
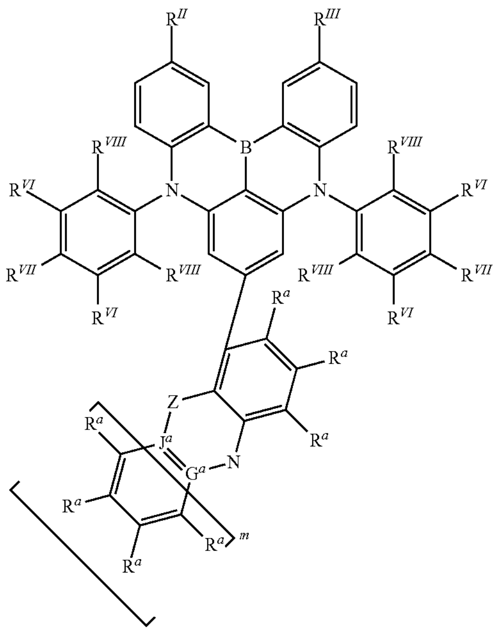
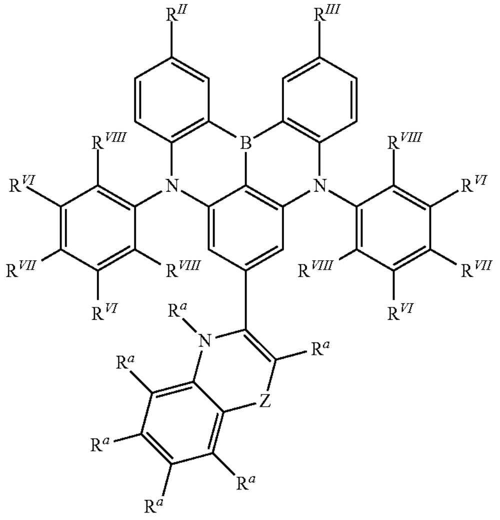
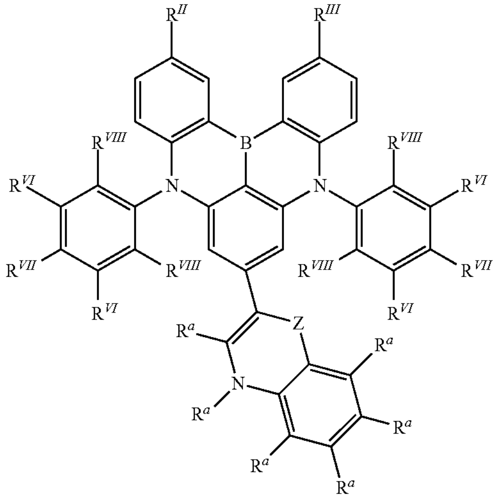

In one embodiment, the organic molecule comprises or consists of a structure of formula Ia, wherein $R^V$ comprises or consists of a structure of formula II, wherein Z is a direct bond.

In one embodiment, the organic molecule comprises or consists of a structure of formula Ia, wherein $R^V$ comprises or consists of a structure of formula II, wherein m is 1.

In a further embodiment, the organic molecule comprises or consists of a structure of formula Ia, wherein $R^V$ comprises or consists of a structure of formula II, wherein m is 1 and Z is a direct bond.

In one embodiment, the organic molecule comprises or consists of a structure of formula Ia, wherein $R^V$ comprises or consists of a structure of formula III-a, II-b or formula II-c:

Formula II-a

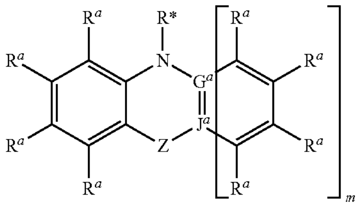

Formula II-b

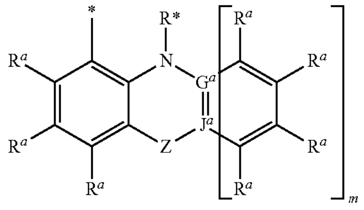

Formula II-c

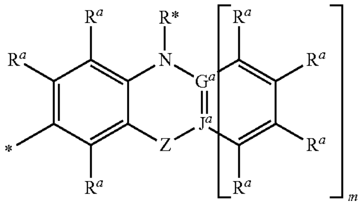

In one embodiment, the organic molecule comprises or consists of a structure of formula Ia, wherein $R^V$ comprises or consists of a structure of formula II-a, II-b or II-c, wherein Z is a direct bond.

In one embodiment, the organic molecule comprises or consists of a structure of formula Ia, wherein $R^V$ comprises or consists of a structure of formula II-a, formula II-b or formula II-c, wherein m is 1.

In further embodiment, the organic molecule comprises or consists of a structure of formula Ia, wherein $R^V$ comprises or consists of a structure of formula II-a, formula II-b or formula II-c, wherein m is 1 and Z is a direct bond.

In a further embodiment, the organic molecule comprises or consists of a structure of formula Ia, wherein $R^V$ comprises or consists of a structure of formula II-I, formula II-II or formula II-III:

Formula II-I

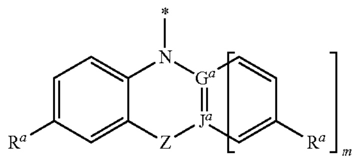

Formula II-II

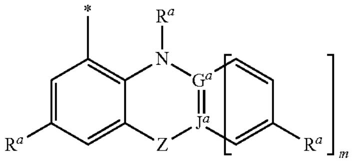

Formula II-III

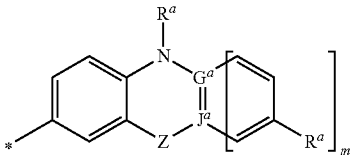

In one embodiment, the organic molecule comprises or consists of a structure of formula Ia, wherein $R^V$ comprises or consists of a structure of formula II-I, formula II-II or formula II-III, wherein Z is a direct bond.

In one embodiment, the organic molecule comprises or consists of a structure of formula Ia, wherein $R^V$ comprises or consists of a structure of formula II-I, formula II-II or formula II-III, wherein m is 1.

In a further embodiment, the organic molecule comprises or consists of a structure of formula Ia, wherein $R^V$ comprises or consists of a structure of formula II-I, formula II-II or formula II-III, wherein m is 1 and Z is a direct bond.

In a preferred embodiment, the organic molecule comprises or consists of a structure of formula Ia, wherein $R^V$ comprises or consists of a structure of formula II-a:

Formula II-a

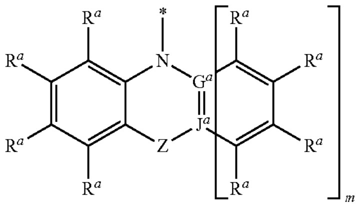

In one embodiment, the organic molecule comprises or consists of a structure of formula Ia, wherein $R^V$ comprises or consists of a structure of formula II-a, wherein Z is a direct bond.

In one embodiment, the organic molecule comprises or consists of a structure of formula Ia, wherein $R^V$ comprises or consists of a structure of formula II-a, wherein m is 1.

In a further embodiment, the organic molecule comprises or consists of a structure of formula Ia, wherein $R^V$ comprises or consists of a structure of formula II-a, wherein m is 1 and Z is a direct bond.

In a preferred embodiment, the organic molecule comprises or consists of a structure of formula Ia, wherein $R^V$ comprises or consists of a structure of formula II-I:

Formula II-I

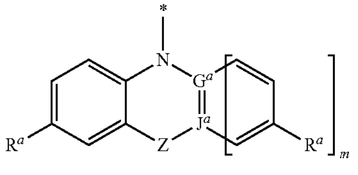

In one embodiment the organic molecule comprises or consists of a structure of formula Ia, wherein $R^V$ comprises or consists of a structure of formula II-I, wherein Z is a direct bond.

In one embodiment the organic molecule comprises or consists of a structure of formula Ia, wherein $R^V$ comprises or consists of a structure of formula II-I, wherein m is 1.

In a further embodiment the organic molecule comprises or consists of a structure of formula Ia, wherein $R^V$ comprises or consists of a structure of formula II-I, wherein m is 1 and Z is a direct bond.

In a certain embodiment the organic molecule comprises or consists of a structure of formula Ia, wherein $R^V$ comprises or consists of a structure of formula II-I, wherein $R^a$ is hydrogen.

In one embodiment, $R^{VI}$, $R^{VII}$ and $R^{VIII}$ are at each occurrence independently from each other selected from the group consisting of hydrogen, $C_1$-$C_5$-alkyl, $C_6$-$C_{18}$-aryl, wherein optionally one or more hydrogen atoms are independently from each other substituted by $C_1$-$C_5$-alkyl or $C_6$-$C_{18}$-aryl.

In one embodiment, the organic molecule comprises or consists of a structure of formula Ia, wherein $R^{VI}$, $R^{VII}$ and $R^{VIII}$ are at each occurrence independently from each other selected from the group consisting of hydrogen, Ph and $^t$Bu.

In one embodiment, the organic molecule comprises or consists of a structure of formula Ia, wherein $R^{VI}$ is Ph, and $R^{VII}$ and $R^{VIII}$ are hydrogen.

In one embodiment, the organic molecule comprises or consists of a structure of formula Ia, wherein $R^{VII}$ is Ph, and $R^{VI}$ and $R^{VIII}$ are hydrogen.

In one embodiment, the organic molecule comprises or consists of a structure of formula Ia, wherein $R^{VI}$ is $^t$Bu, and $R^{VII}$ and $R^{VIII}$ are hydrogen.

In one embodiment the organic molecule comprises or consists of a structure of formula Ia, wherein, $R^{VII}$ is $^t$Bu, and $R^{VI}$ and $R^{VIII}$ are hydrogen.

In one embodiment, the organic molecule comprises or consists of a structure of formula Ib:

Formula Ib

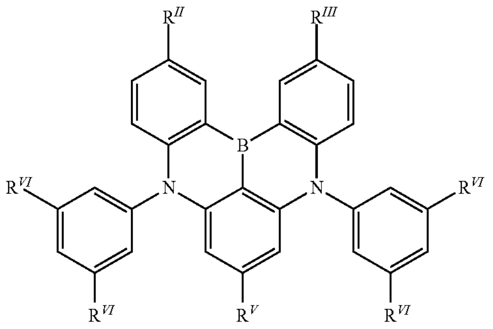

wherein $R^{II}$ and $R^{II}$ are independently from another selected from the group consisting of: hydrogen, deuterium, halogen, Me, $^i$Pr, $^t$Bu, CN, $CF_3$, Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph, and $N(Ph)_2$.

In one embodiment, the organic molecule comprises or consists of a structure of formula Ib, wherein $R^{II}$ and $R^{III}$ are independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, carbazolyl, which is optionally substituted with one or more substituents independently from each other selected from the group consisting of Me, $^i$Pr, $^t$Bu, CN, $CF_3$, and Ph, and $N(Ph)_2$.

In one embodiment, the organic molecule comprises or consists of a structure of formula Ib, wherein $R^{II}$ and $R^{II}$ are each independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, and $N(Ph)_2$.

In one embodiment, the organic molecule comprises or consists of a structure of formula Ib, wherein $R^{II}$ and $R^{III}$ are independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, and $N(Ph)_2$.

In one embodiment, the organic molecule comprises or consists of a structure of formula Ib, wherein $R^{II}$ and $R^{III}$ are independently from another selected from the group consisting of: hydrogen, $^t$Bu, and Ph.

In one embodiment, the organic molecule comprises or consists of a structure of formula Ib, wherein $R^{II}$ is hydrogen.

In one embodiment, the organic molecule comprises or consists of a structure of formula Ib, wherein $R^{II}$ is $^t$Bu.

In one embodiment, the organic molecule comprises or consists of a structure of formula Ib, wherein $R^{II}$ is Ph.

In one embodiment, the organic molecule comprises or consists of a structure of formula Ib, wherein $R^{II}$ is hydrogen.

In one embodiment, the organic molecule comprises or consists of a structure of formula Ib, wherein $R^{II}$ is $^t$Bu.

In one embodiment, the organic molecule comprises or consists of a structure of formula Ib, wherein $R^{III}$ is Ph.

In one embodiment, the organic molecule comprises or consists of a structure of formula Ib, wherein $R^{II}$ is equal to $R^{III}$, i.e. $R^{II}$ and $R^{III}$ are identical.

In one embodiment, the organic molecule comprises or consists of a structure of formula Ib, wherein $R^{II}$ and $R^{III}$ are $^{t}$Bu.

In one embodiment, the organic molecule comprises or consists of a structure of formula Ib, wherein $R^{II}$ and $R^{III}$ are Ph.

In one embodiment, the organic molecule comprises or consists of a structure of formula Ib, wherein $R^{II}$ and $R^{III}$ are hydrogen.

In one embodiment, the organic molecule comprises or consists of a structure of formula Ib, wherein $R^{V}$ is mesityl (Mes) or 2-meta-ter-phenyl.

In one embodiment, the organic molecule comprises or consists of a structure of formula Ib, wherein $R^{V}$ is 2-meta-ter-phenyl.

In one embodiment, the organic molecule comprises or consists of a structure of formula Ib, wherein $R^{V}$ comprises or consists of a structure of formula II:

Formula II

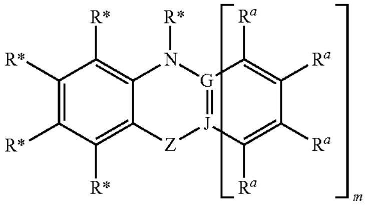

Examples of organic molecules are listed below:

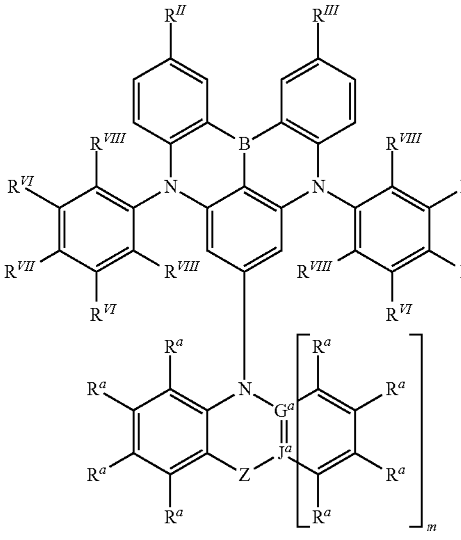

-continued

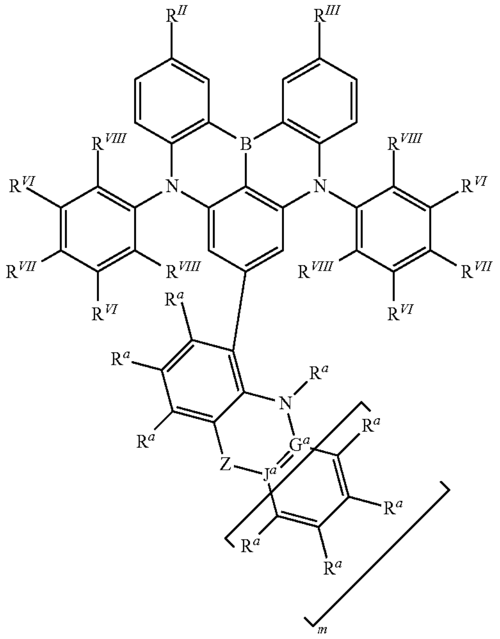

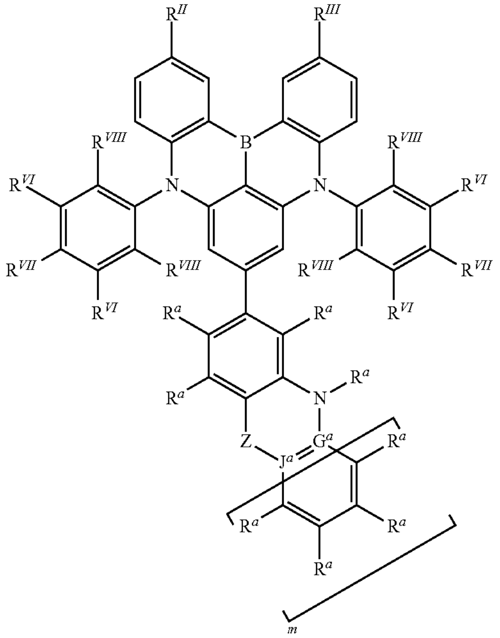

-continued

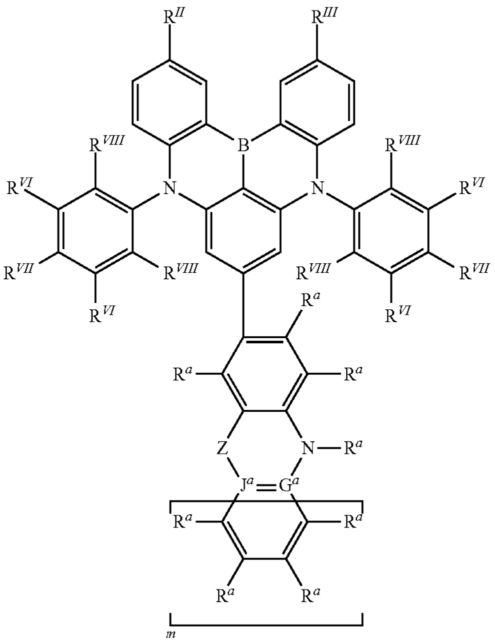

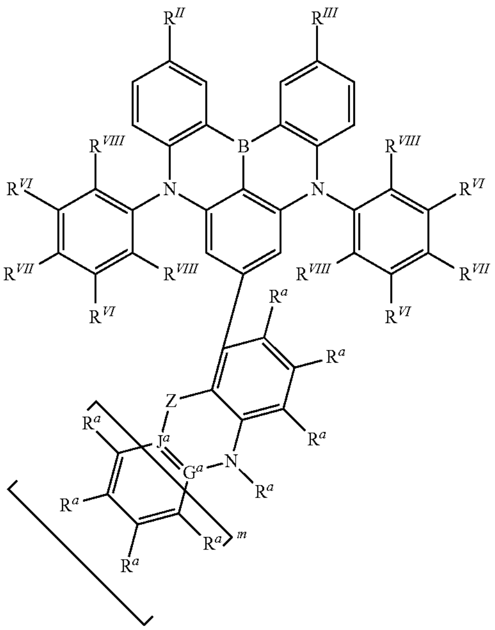

-continued

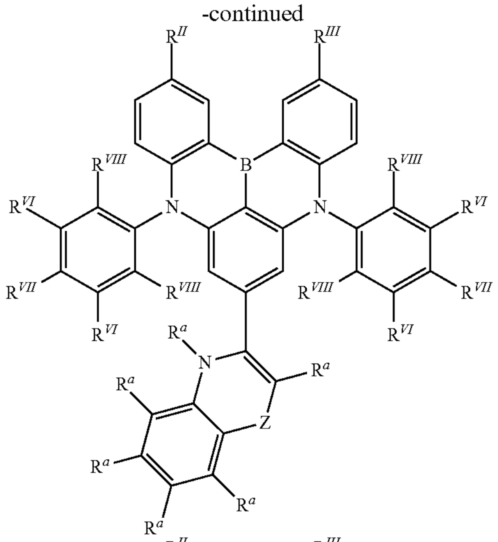

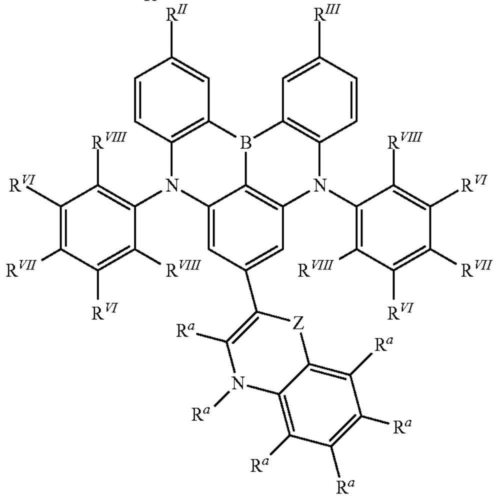

In one embodiment, the organic molecule comprises or consists of a structure of formula Ib, wherein $R^V$ comprises or consists of a structure of formula II, wherein Z is a direct bond.

In one embodiment, the organic molecule comprises or consists of a structure of formula Ib, wherein $R^V$ comprises or consists of a structure of formula II, wherein m is 1.

In one further embodiment, the organic molecule comprises or consists of a structure of formula Ib, wherein $R^V$ comprises or consists of a structure of formula II, wherein m is 1 and Z is a direct bond.

In one embodiment, the organic molecule comprises or consists of a structure of formula Ib, wherein $R^V$ comprises or consists of a structure of formula II-a, II-b or formula II-c:

Formula II-a

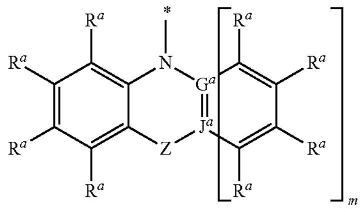

-continued

Formula II-b

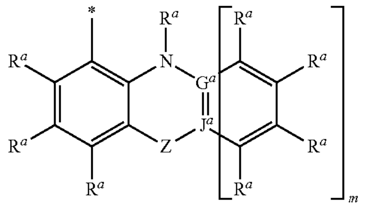

Formula II-c

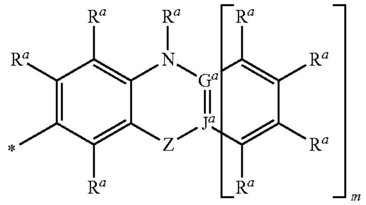

In one embodiment the organic molecule comprises or consists of a structure of formula Ib, wherein $R^V$ comprises or consists of a structure of formula II-a, II-b or formula II-c, wherein Z is a direct bond.

In one embodiment the organic molecule comprises or consists of a structure of formula Ib, wherein $R^V$ comprises or consists of a structure of formula II-a, formula II-b oror formula II-c, wherein m is 1.

In one embodiment the organic molecule comprises or consists of a structure of formula Ib, wherein $R^V$ comprises or consists of a structure of formula II-a, II-b or II-c, wherein m is 1 and Z is a direct bond.

In a further embodiment, the organic molecule comprises or consists of a structure of formula Ib, wherein $R^V$ comprises or consists of a structure of formula II-I, II-II or formula II-III:

Formula II-I

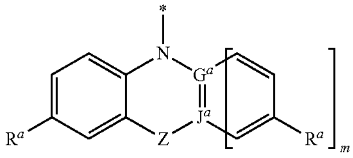

Formula II-II

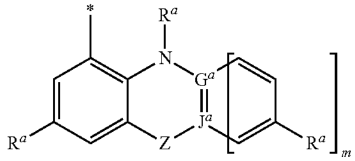

Formula II-III

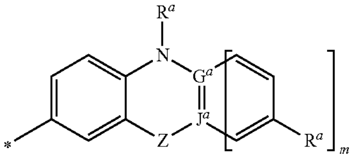

In one embodiment the organic molecule comprises or consists of a structure of formula Ib, wherein $R^V$ comprises or consists of a structure of formula III-I, II-II or II-III, wherein Z is a direct bond.

In one embodiment the organic molecule comprises or consists of a structure of formula Ib, wherein $R^V$ comprises or consists of a structure of formula II-I, II-II or II-III, wherein m is 1.

In one embodiment the organic molecule comprises or consists of a structure of formula Ib, wherein $R^V$ comprises or consists of a structure of formula II-I, II-II or II-III, wherein m is 1 and Z is a direct bond.

In certain embodiments, the organic molecule comprises or consists of a structure of formula Ib, wherein $R^V$ comprises or consists of a structure of formula II-a:

Formula II-a

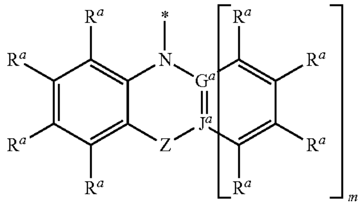

In one embodiment the organic molecule comprises or consists of a structure of formula Ib, wherein $R^V$ comprises or consists of a structure of formula II-a, wherein Z is a direct bond.

In one embodiment the organic molecule comprises or consists of a structure of formula Ib, wherein $R^V$ comprises or consists of a structure of formula II-a, wherein m is 1.

In one embodiment the organic molecule comprises or consists of a structure of formula Ib, wherein $R^V$ comprises or consists of a structure of formula II-a, wherein m is 1 and Z is a direct bond.

In certain embodiments, the organic molecule comprises or consists of a structure of formula Ib, wherein $R^V$ comprises or consists of a structure of formula II-I:

Formula II-I

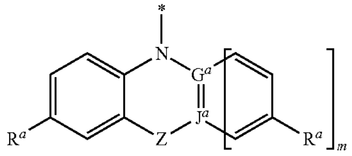

In one embodiment the organic molecule comprises or consists of a structure of formula Ib, wherein $R^V$ comprises or consists of a structure of formula II-I, wherein Z is a direct bond.

In one embodiment the organic molecule comprises or consists of a structure of formula Ib, wherein $R^V$ comprises or consists of a structure of formula II-I, wherein m is 1.

In a further embodiment the organic molecule comprises or consists of a structure of formula Ib, wherein $R^V$ comprises or consists of a structure of formula II-I, wherein m is 1 and Z is a direct bond.

In a certain embodiment the organic molecule comprises or consists of a structure of formula Ib, wherein $R^V$ comprises or consists of a structure of formula II-I, wherein $R^a$ is hydrogen.

In one embodiment, $R^{VI}$, $R^{VII}$ and $R^{VIII}$ are at each occurrence independently from each other selected from the group consisting of hydrogen, $C_1$-$C_5$-alkyl, $C_6$-$C_{18}$-aryl, wherein optionally one or more hydrogen atoms are independently from each other substituted by $C_1$-$C_5$-alkyl or $C_6$-$C_{13}$-aryl.

In one embodiment, the organic molecule comprises or consists of a structure of formula Ib, wherein $R^{VI}$ is at each occurrence independently from each other selected from the group consisting of hydrogen, Ph and $^t$Bu.

In one embodiment, the organic molecule comprises or consists of a structure of formula Ib, wherein $R^{VI}$ is Ph.

In one embodiment, the organic molecule comprises or consists of a structure of formula Ib, wherein $R^{VI}$ is $^t$Bu.

In one embodiment, the organic molecule comprises or consists of a structure of formula Ic:

Formula Ic

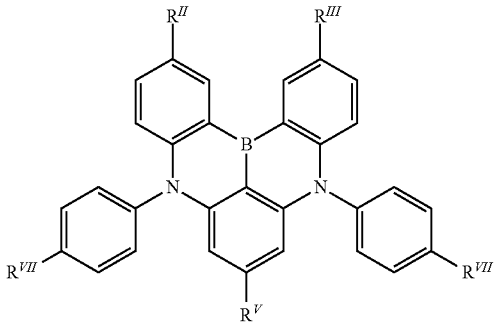

In one embodiment, the organic molecule comprises or consists of a structure of formula Ic, wherein $R^{II}$ and $R^{III}$ are independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, carbazolyl, which is optionally substituted with one or more substituents independently from each other selected from the group consisting of Me, $^i$Pr, $^t$Bu, CN, $CF_3$, and Ph, and $N(Ph)_2$.

In one embodiment, the organic molecule comprises or consists of a structure of formula Ic, wherein $R^{II}$ and $R^{II}$ are each independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, and $N(Ph)_2$.

In one embodiment, the organic molecule comprises or consists of a structure of formula Ic, wherein $R^{II}$ and $R^{III}$ are independently from another selected from the group consisting of: hydrogen, deuterium, Me, $^i$Pr, $^t$Bu, Ph, which is optionally substituted with one or more substituents independently from each other selected from the group consisting of Me, $^i$Pr, $^t$Bu, and Ph, and $N(Ph)_2$.

In one embodiment, the organic molecule comprises or consists of a structure of formula Ic, wherein $R^{II}$ and $R^{III}$ are independently from another selected from the group consisting of: hydrogen, $^t$Bu, and Ph.

In one embodiment, the organic molecule comprises or consists of a structure of formula Ic, wherein $R^{II}$ is hydrogen.

In one embodiment, the organic molecule comprises or consists of a structure of formula Ic, wherein $R^{II}$ is $^t$Bu.

In one embodiment, the organic molecule comprises or consists of a structure of formula Ic, wherein $R^{II}$ is Ph.

In one embodiment, the organic molecule comprises or consists of a structure of formula Ic, wherein $R^{III}$ is hydrogen.

In one embodiment, the organic molecule comprises or consists of a structure of formula Ic, wherein $R^{III}$ is $^t$Bu.

In one embodiment, the organic molecule comprises or consists of a structure of formula-Ic, wherein $R^{III}$ is Ph.

In one embodiment, the organic molecule comprises or consists of a structure of formula Ic, wherein $R^{II}$ is equal to $R^{III}$, in particular, $R^{II}$ and $R^{III}$ are identical.

In one embodiment, the organic molecule comprises or consists of a structure of formula Ic, wherein $R^{II}$ and $R^{III}$ are $^t$Bu.

In one embodiment, the organic molecule comprises or consists of a structure of formula Ic, wherein $R^{II}$ and $R^{III}$ are Ph.

In one embodiment, the organic molecule comprises or consists of a structure of formula Ic, wherein $R^{II}$ and $R^{III}$ are hydrogen.

In one embodiment, the organic molecule comprises or consists of a structure of formula Ic, wherein $R^{V}$ is mesityl (Mes) or 2-meta-ter-phenyl.

In one embodiment, the organic molecule comprises or consists of a structure of formula Ic, wherein $R^{V}$ is 2-meta-ter-phenyl.

In one embodiment, the organic molecule comprises or consists of a structure of formula Ic, wherein $R^{V}$ comprises or consists of a structure of formula II:

Formula II

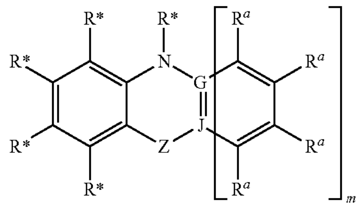

Examples of organic molecules are listed below:

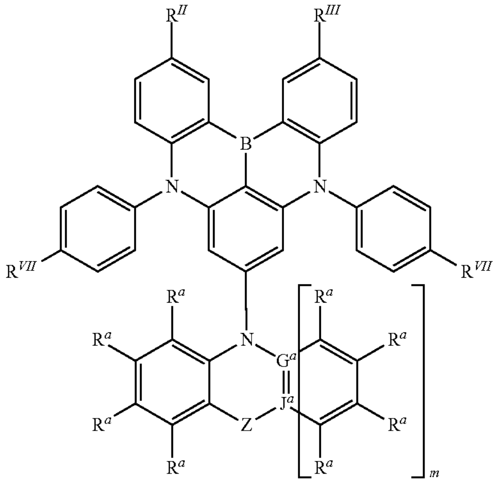

-continued
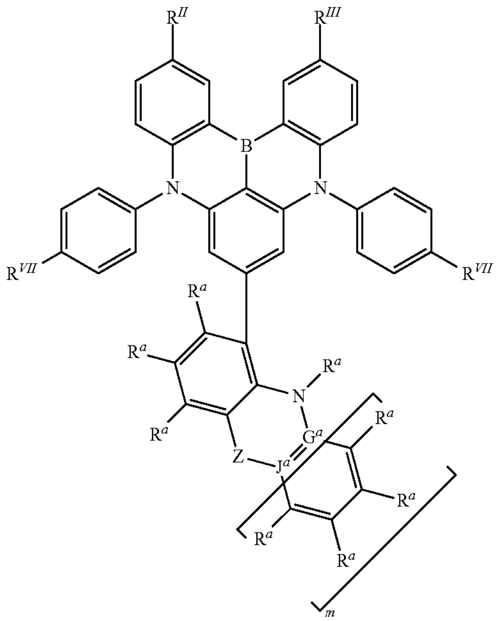
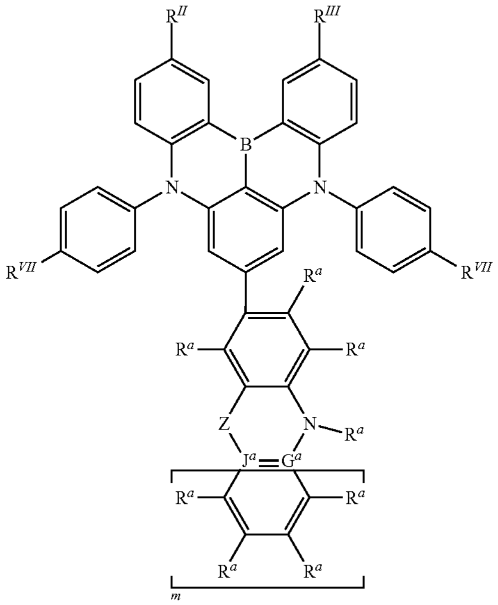
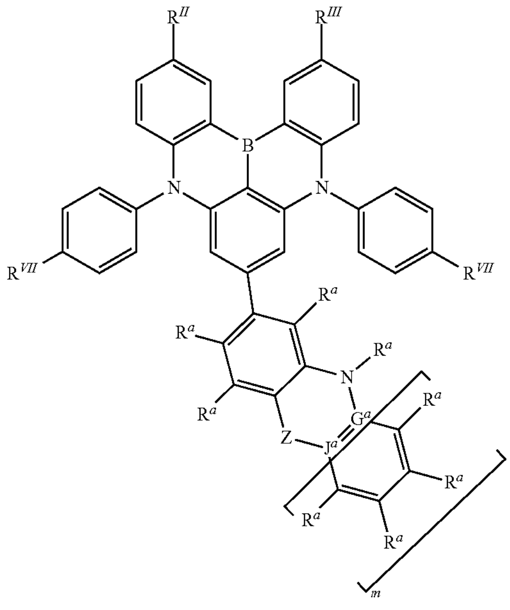
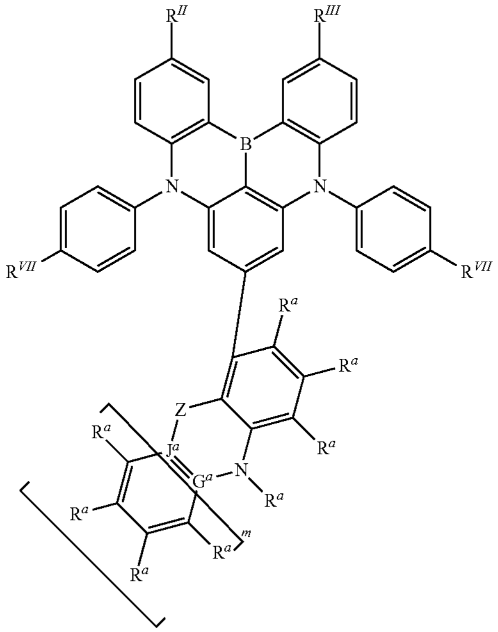

-continued

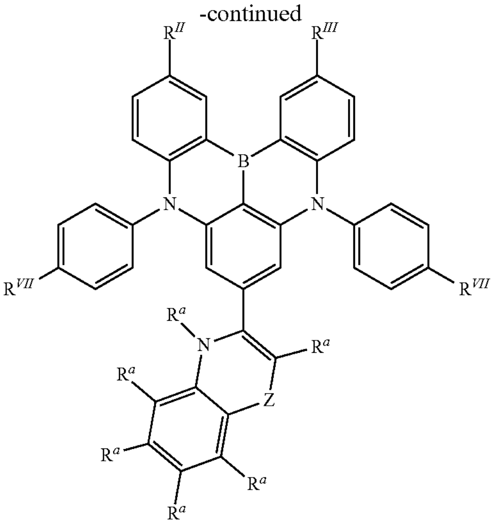

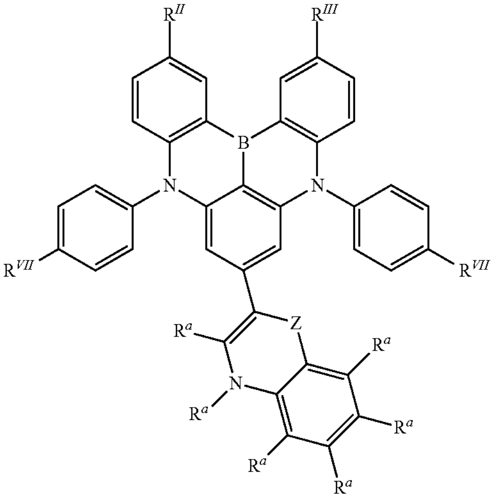

In one embodiment, the organic molecule comprises or consists of a structure of formula Ic, wherein $R^V$ comprises or consists of a structure of formula II, wherein Z is a direct bond.

In one embodiment, the organic molecule comprises or consists of a structure of formula Ic, wherein $R^V$ comprises or consists of a structure of formula II, wherein m is 1.

In a further embodiment, the organic molecule comprises or consists of a structure of formula Ic, wherein $R^V$ comprises or consists of a structure of formula II, wherein m is 1 and Z is a direct bond.

In one embodiment, the organic molecule comprises or consists of a structure of formula Ic, wherein $R^V$ comprises or consists of a structure of formula II-a, II-b or formula II-c:

Formula II-a

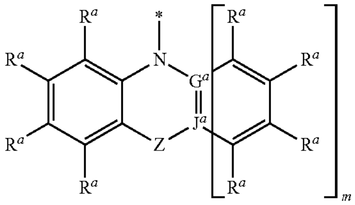

-continued

Formula II-b

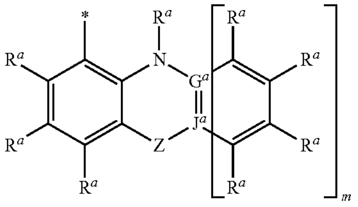

Formula II-c

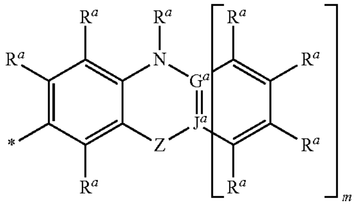

In one embodiment the organic molecule comprises or consists of a structure of formula Ic, wherein $R^V$ comprises or consists of a structure of formula II-a, II-b or II-c, wherein Z is a direct bond.

In one embodiment the organic molecule comprises or consists of a structure of formula Ic, wherein $R^V$ comprises or consists of a structure of formula II-a, II-b or II-c, wherein m is 1.

In a further embodiment the organic molecule comprises or consists of a structure of formula Ic, wherein $R^V$ comprises or consists of a structure of formula II-a, II-b or II-c, wherein m is 1 and Z is a direct bond.

In a further embodiment, the organic molecule comprises or consists of a structure of formula Ic, wherein $R^V$ comprises or consists of a structure of formula II-I, II-II or formula II-III:

Formula II-I

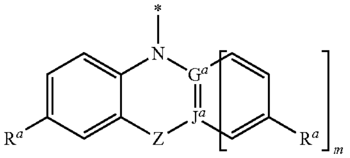

Formula II-II

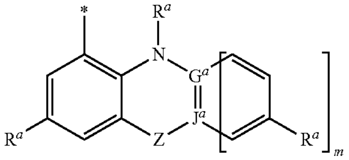

Formula II-III

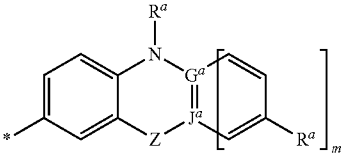

In one embodiment, the organic molecule comprises or consists of a structure of formula Ic, wherein $R^V$ comprises or consists of a structure of formula II-I, II-II or II-III, wherein Z is a direct bond.

In one embodiment, the organic molecule comprises or consists of a structure of formula Ic, wherein $R^V$ comprises or consists of a structure of formula II-I, II-II or II-III, wherein m is 1.

In a further embodiment, the organic molecule comprises or consists of a structure of formula Ic, wherein $R^V$ comprises or consists of a structure of formula II-I, II-II or II-III, wherein m is 1 and Z is a direct bond.

In certain embodiments, the organic molecule comprises or consists of a structure of formula Ic, wherein $R^V$ comprises or consists of a structure of formula II-a:

Formula II-a

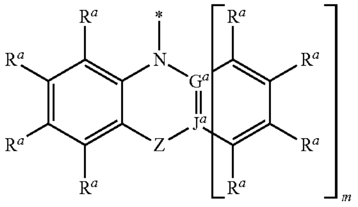

In one embodiment the organic molecule comprises or consists of a structure of formula Ic, wherein $R^V$ comprises or consists of a structure of formula II-a, wherein Z is a direct bond.

In one embodiment the organic molecule comprises or consists of a structure of formula Ic, wherein $R^V$ comprises or consists of a structure of formula II-a, wherein m is 1.

In a further embodiment the organic molecule comprises or consists of a structure of formula Ic, wherein $R^V$ comprises or consists of a structure of formula II-a, wherein m is 1 and Z is a direct bond.

In certain embodiments, the organic molecule comprises or consists of a structure of formula Ic, wherein $R^V$ comprises or consists of a structure of formula II-I:

Formula II-I

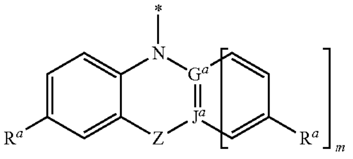

In one embodiment the organic molecule comprises or consists of a structure of formula Ic, wherein $R^V$ comprises or consists of a structure of formula II-I, wherein Z is a direct bond.

In one embodiment the organic molecule comprises or consists of a structure of formula Ic, wherein $R^V$ comprises or consists of a structure of formula II-I, wherein m is 1.

In a further embodiment the organic molecule comprises or consists of a structure of formula Ic, wherein $R^V$ comprises or consists of a structure of formula II-I, wherein m is 1 and Z is a direct bond.

In a certain embodiment the organic molecule comprises or consists of a structure of formula Ic, wherein $R^V$ comprises or consists of a structure of formula II-I, wherein $R^a$ is hydrogen.

In one embodiment, $R^{VI}$, $R^{VII}$ and $R^{VIII}$ are at each occurrence independently from each other selected from the group consisting of hydrogen, $C_1$-$C_5$-alkyl, $C_6$-$C_{18}$-aryl, wherein optionally one or more hydrogen atoms are independently from each other substituted by $C_1$-$C_5$-alkyl or $C_5$-$C_{18}$-aryl.

In one embodiment, the organic molecule comprises or consists of a structure of formula Ic, wherein $R^{VI}$, $R^{VII}$ and $R^{VIII}$ are at each occurrence independently from each other selected from the group consisting of hydrogen, Ph and $^t$Bu.

In one embodiment, the organic molecule comprises or consists of a structure of formula Ic, wherein $R^{VI}$ is $^t$Bu, and $R^{VII}$ and $R^{VIII}$ are hydrogen.

In one embodiment, the organic molecule comprises or consists of a structure of formula Ic, wherein $R^{VII}$ is $^t$Bu, and $R^{VI}$ and $R^{VIII}$ are hydrogen.

In one embodiment, the organic molecule comprises or consists of a structure of formula Ic, wherein $R^{VI}$ is $^t$Bu, and $R^{VII}$ and $R^{VIII}$ are hydrogen.

In one embodiment the organic molecule comprises or consists of a structure of formula Ic, wherein, $R^{VII}$ is $^t$Bu, and $R^{VI}$ and $R^{VIII}$ are hydrogen.

In one embodiment, the organic molecule comprises or consists of a structure of formula I-0:

Formula I-0

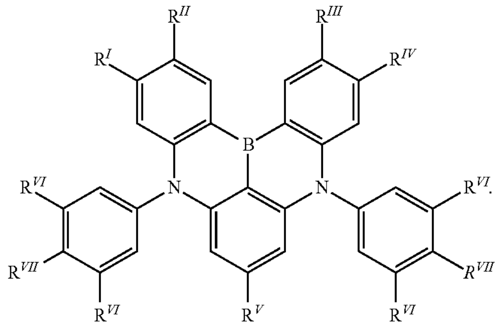

In one embodiment, the organic molecule comprises or consists of a structure of formula I-0:

Formula I-0

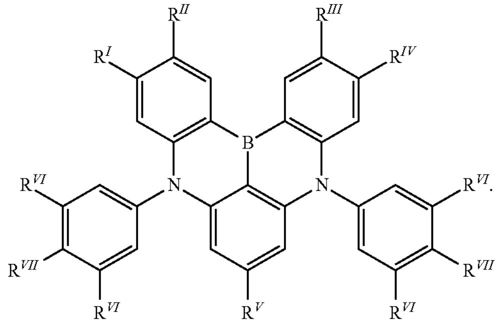

wherein $R^{VI}$ and $R^{VII}$ is each independently from another selected from the group consisting of: hydrogen, deuterium, Me, $^i$Pr, $^t$Bu, Cyclohexyl, Ph wherein optionally one or more hydrogen atoms are independently from each other substituted by $C_1$-$C_5$-alkyl and wherein $R^V$ comprises or consists of a structure of formula II:

Formula II
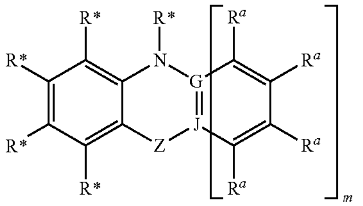
Examples of organic molecules are listed below:
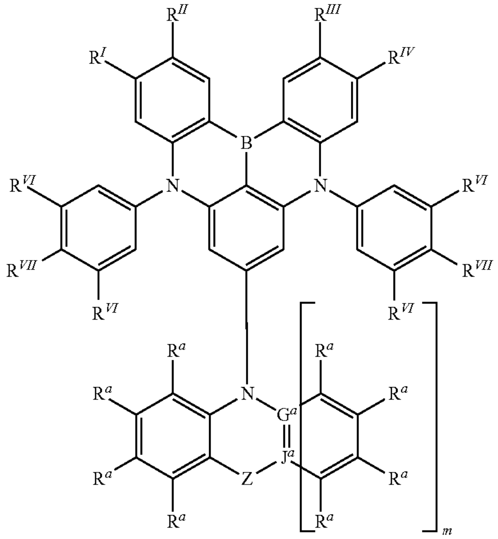
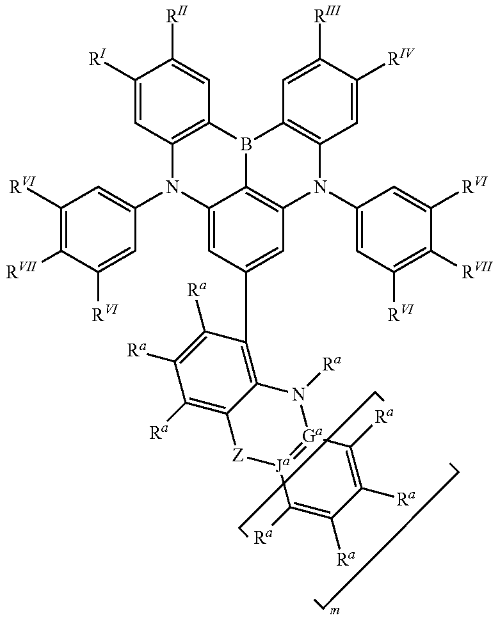
-continued
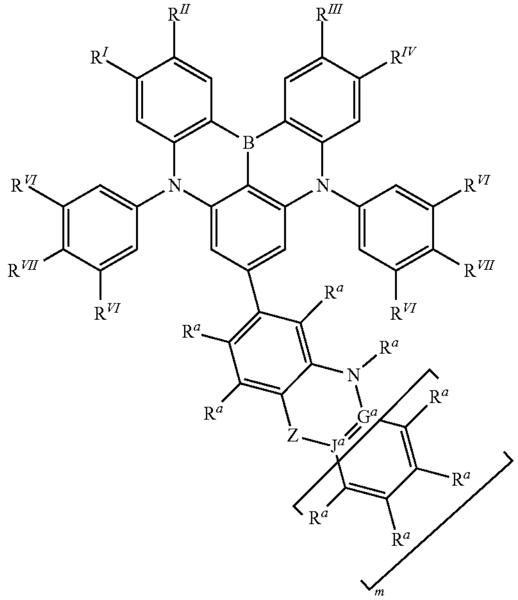
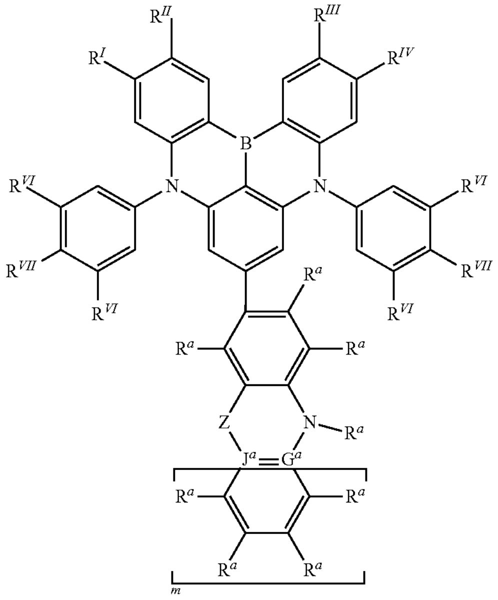

-continued

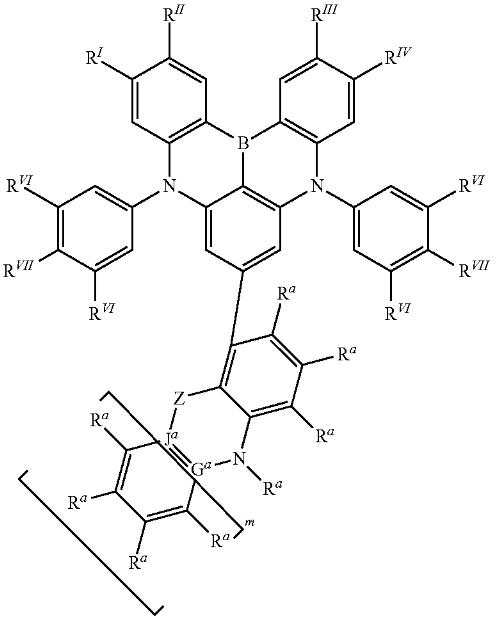

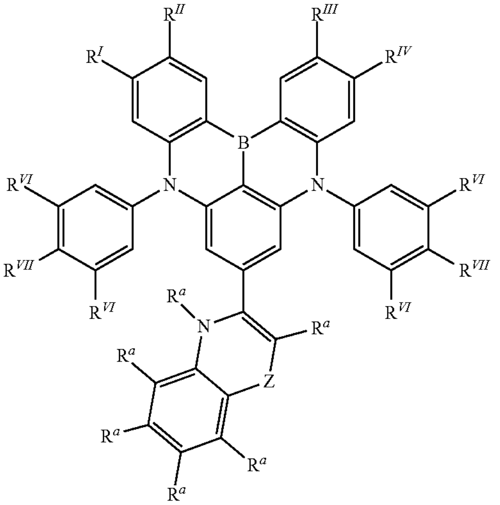

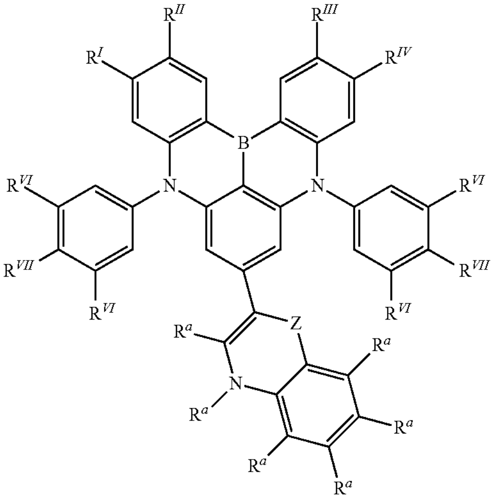

In one embodiment, the organic molecule comprises or consists of a structure of formula I-0, wherein $R^V$ comprises or consists of a structure of formula II, wherein Z is a direct bond.

In one embodiment, the organic molecule comprises or consists of a structure of formula I-0, wherein $R^{VI}$ and $R^{VII}$ is each independently from another selected from the group consisting of: hydrogen, deuterium, Me, $^i$Pr, $^t$Bu, Cyclohexyl, Ph wherein one or more hydrogen atoms are independently from each other substituted by $C_1$-$C_5$-alkyl and wherein $R^V$ comprises or consists of a structure of formula II, wherein m is 1.

In one embodiment, the organic molecule comprises or consists of a structure of formula I-0, wherein $R^{VI}$ and $R^{VII}$ is each independently from another selected from the group consisting of: hydrogen, deuterium, Me, $^i$Pr, $^t$Bu, Cyclohexyl, Ph wherein one or more hydrogen atoms are independently from each other substituted by $C_1$-$C_5$-alkyl and wherein $R^V$ comprises or consists of a structure of formula II, wherein m is 1 and Z is a direct bond.

In one embodiment, the organic molecule comprises or consists of a structure of formula I-0, wherein $R^{VII}$ is each independently from another selected from the group consisting of: hydrogen, deuterium, Me, $^i$Pr, $^t$Bu, Cyclohexyl, and wherein $R^V$ comprises or consists of a structure of formula II.

In one embodiment, the organic molecule comprises or consists of a structure of formula I-0, wherein $R^V$ comprises or consists of a structure of formula II, wherein m is 1.

In a further embodiment, the organic molecule comprises or consists of a structure of formula I-0, wherein $R^V$ comprises or consists of a structure of formula II, wherein m is 1 and Z is a direct bond.

In one embodiment, the organic molecule comprises or consists of a structure of formula I-0, wherein $R^{VII}$ is each independently from another selected from the group consisting of: hydrogen, deuterium, Me, $^i$Pr, $^t$Bu, Cyclohexyl, and wherein $R^V$ comprises or consists of a structure of formula II, wherein m is 1 and Z is a direct bond.

In one embodiment, the organic molecule comprises or consists of a structure of formula I-0, wherein $R^V$ comprises or consists of a structure of formula II-a, II-b or formula II-c:

Formula II-a

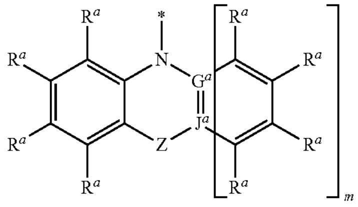

-continued

Formula II-b

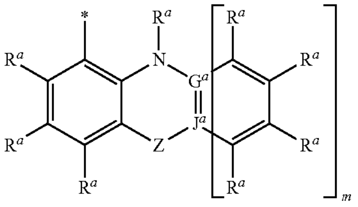

Formula II-c

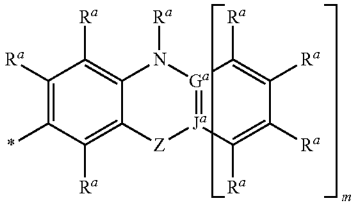

In one embodiment the organic molecule comprises or consists of a structure of formula I-0, wherein $R^V$ comprises or consists of a structure of formula II-a, II-b or II-c, wherein Z is a direct bond.

In one embodiment the organic molecule comprises or consists of a structure of formula I-0, wherein $R^V$ comprises or consists of a structure of formula II-a, II-b or II-c, wherein m is 1.

In a further embodiment the organic molecule comprises or consists of a structure of formula I-0, wherein $R^V$ comprises or consists of a structure of formula II-a, II-b or II-c, wherein m is 1 and Z is a direct bond.

In a further embodiment, the organic molecule comprises or consists of a structure of formula I-0, wherein $R^V$ comprises or consists of a structure of formula II-I, II-II or formula II-II:

Formula II-I

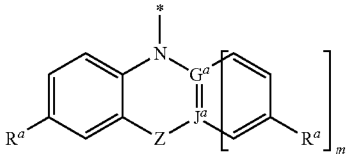

Formula II-II

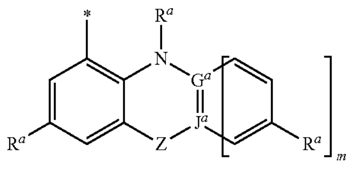

Formula II-III

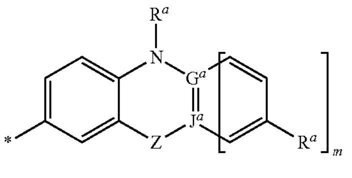

In one embodiment the organic molecule comprises or consists of a structure of formula I-0, wherein $R^V$ comprises or consists of a structure of formula II-I, II-II or II-III, wherein Z is a direct bond.

In one embodiment the organic molecule comprises or consists of a structure of formula I-0, wherein $R^V$ comprises or consists of a structure of formula II-I, II-II or III-III, wherein m is 1.

In a further embodiment the organic molecule comprises or consists of a structure of formula I-0, wherein $R^V$ comprises or consists of a structure of formula I-I, II-I or II-III, wherein m is 1 and Z is a direct bond.

In certain embodiments, the organic molecule comprises or consists of a structure of formula I-0, wherein $R^V$ comprises or consists of a structure of formula II-a:

Formula II-a

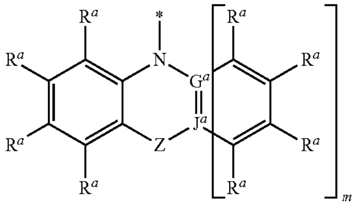

In one embodiment the organic molecule comprises or consists of a structure of formula I-0, wherein $R^V$ comprises or consists of a structure of formula II-a, wherein Z is a direct bond.

In one embodiment the organic molecule comprises or consists of a structure of formula I-0, wherein $R^V$ comprises or consists of a structure of formula II-a, wherein m is 1.

In a further embodiment the organic molecule comprises or consists of a structure of formula I-0, wherein $R^V$ comprises or consists of a structure of formula II-a, wherein m is 1 and Z is a direct bond.

In certain embodiments, the organic molecule comprises or consists of a structure of formula I-0, wherein $R^V$ comprises or consists of a structure of formula II-I:

Formula II-I

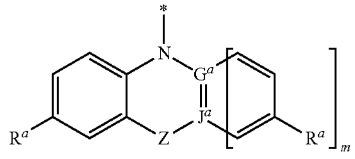

In one embodiment the organic molecule comprises or consists of a structure of formula I-0, wherein $R^V$ comprises or consists of a structure of formula II-I, wherein Z is a direct bond.

In one embodiment the organic molecule comprises or consists of a structure of formula I-0, wherein $R^V$ comprises or consists of a structure of formula II-I, wherein m is 1.

In one further embodiment the organic molecule comprises or consists of a structure of formula I-0, wherein $R^V$ comprises or consists of a structure of formula II-I, wherein m is 1 and Z is a direct bond.

In a certain embodiment the organic molecule comprises or consists of a structure of formula I-0, wherein $R^V$ comprises or consists of a structure of formula II-I, wherein $R^a$ is hydrogen.

In one embodiment, the organic molecule comprises or consists of a structure of formula I-0, wherein $R^I$, $R^{II}$, $R^{III}$, and $R^{IV}$ is each independently from another selected from the group consisting of:

hydrogen, deuterium, Me, $^{i}$Pr, $^{t}$Bu, Cyclohexyl, and Ph,
 wherein optionally one or more hydrogen atoms are independently from each other substituted by $C_1$-$C_5$-alkyl or $C_6$-$C_{18}$-aryl.

In one embodiment, the organic molecule comprises or consists of a structure of formulas Id, Ie, If or Ig:
Formula Id
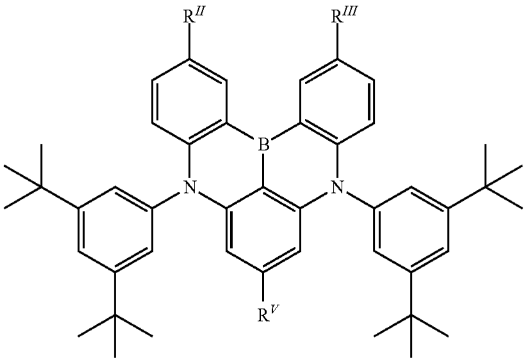
Formula Ie
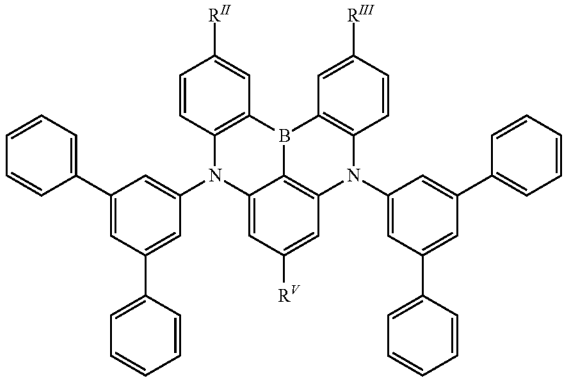
Formula If
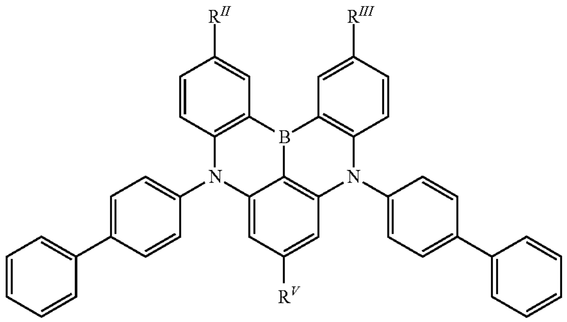
Formula Ig
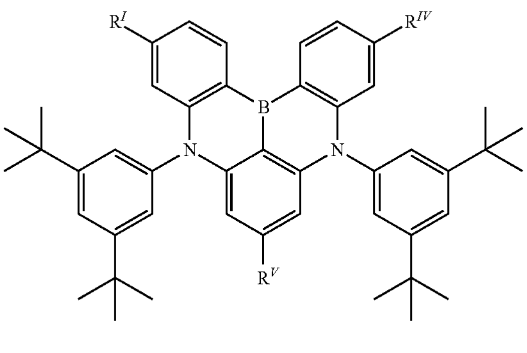
wherein $R^V$ comprises or consists of a structure of formula II:
Formula II
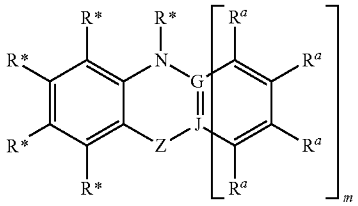
Examples of organic molecules are listed below:
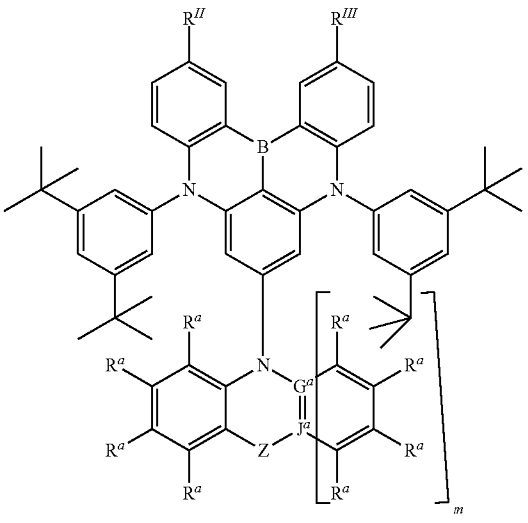
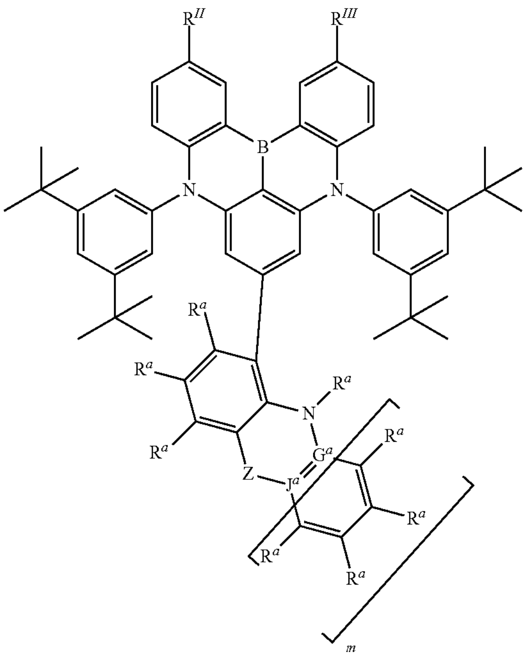

-continued
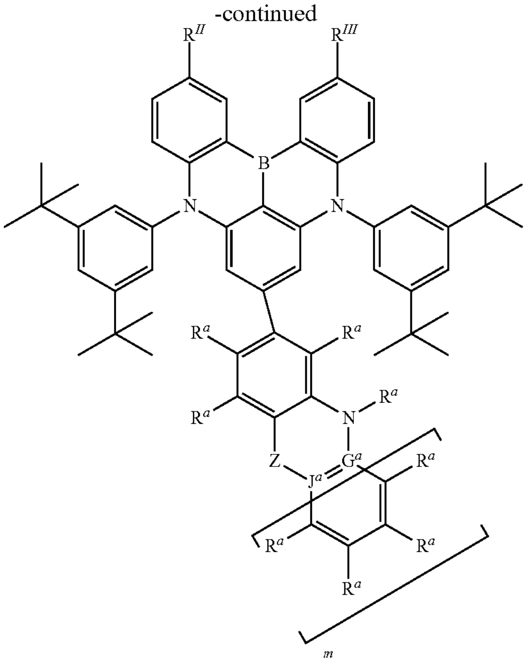
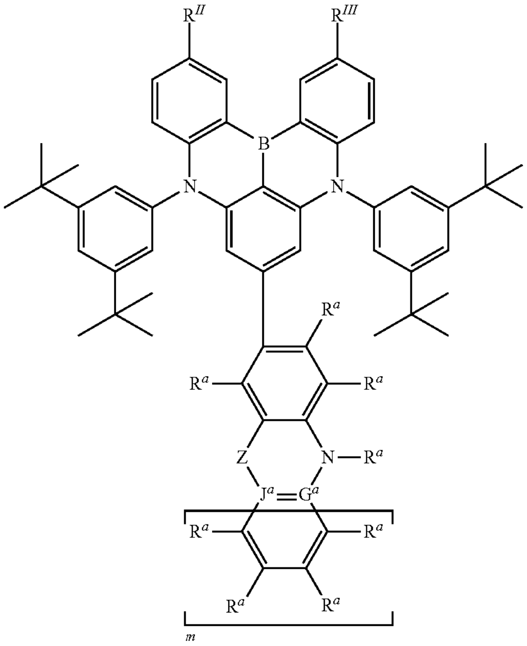
-continued
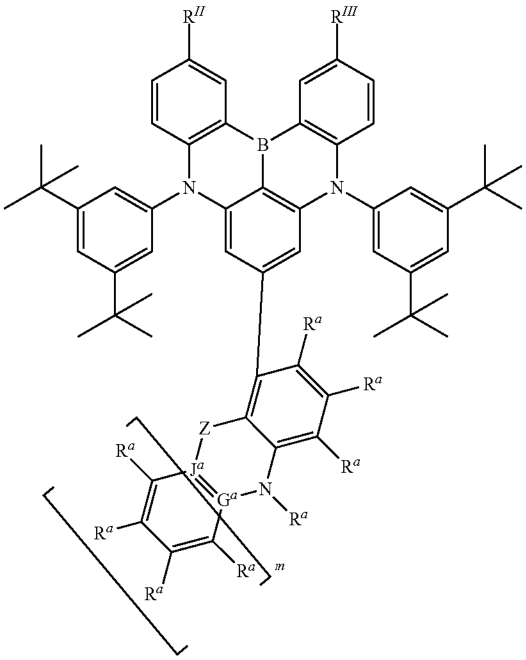
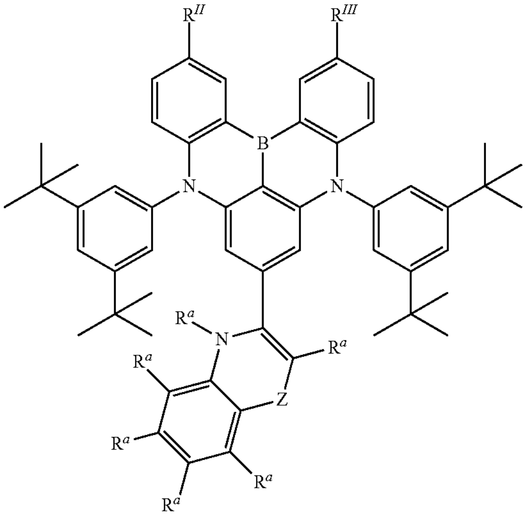
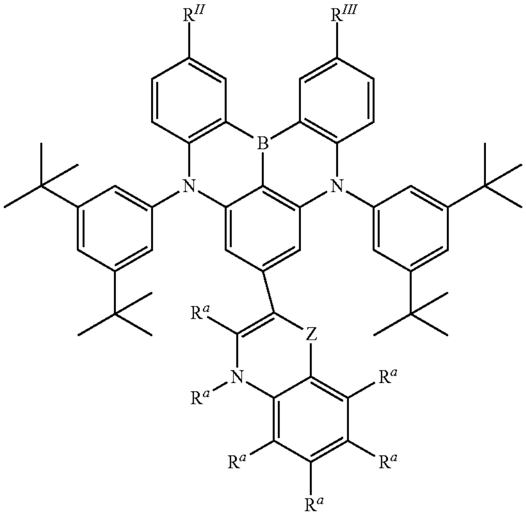

-continued
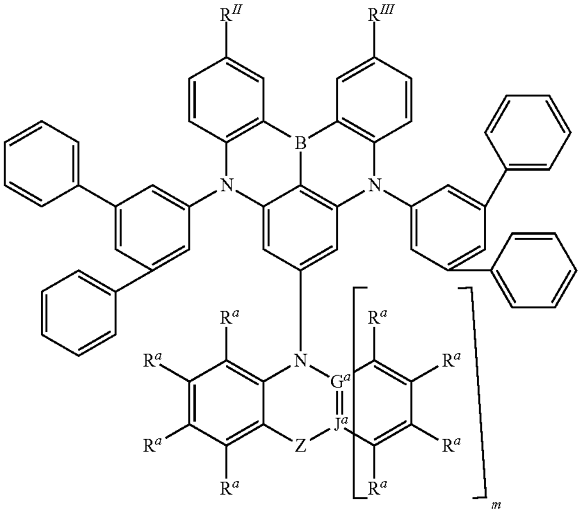
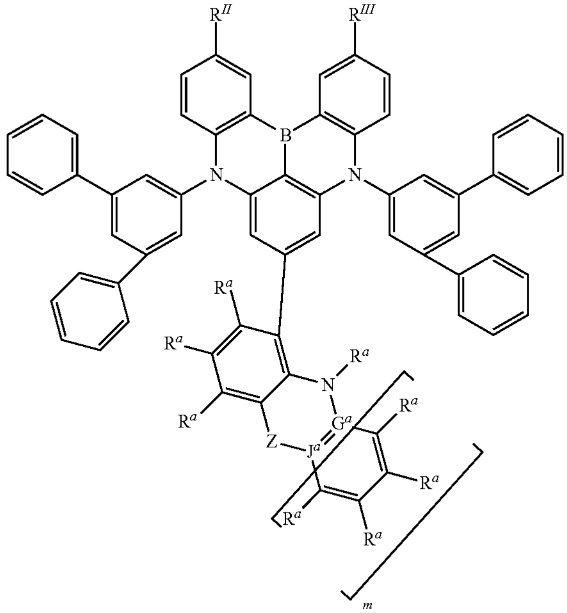
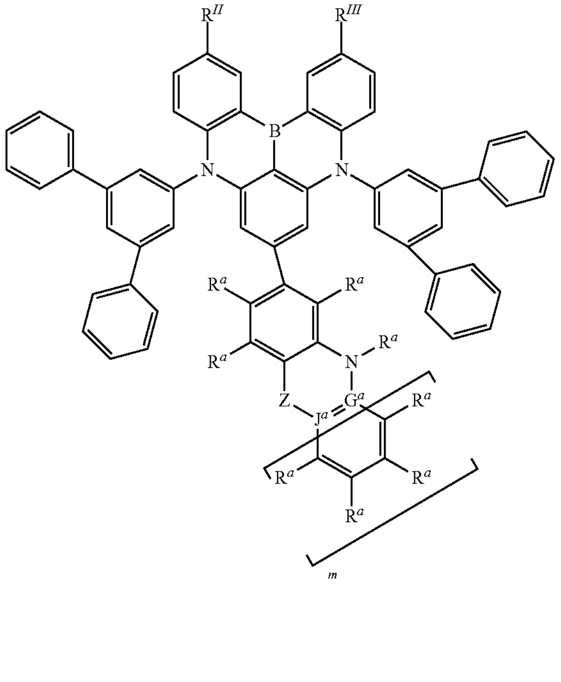
-continued
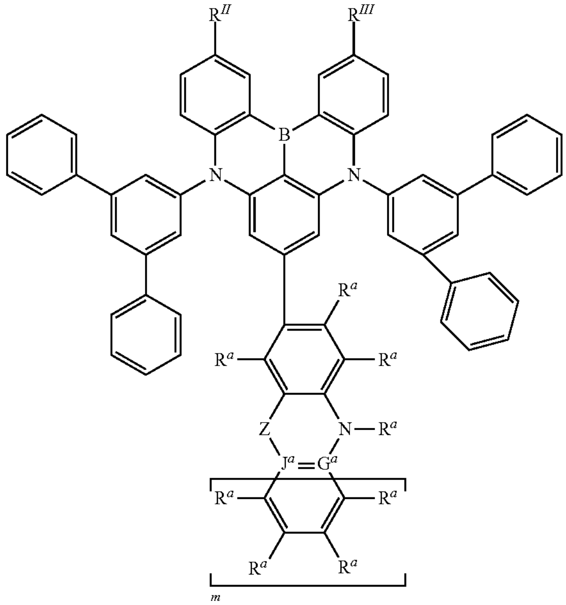
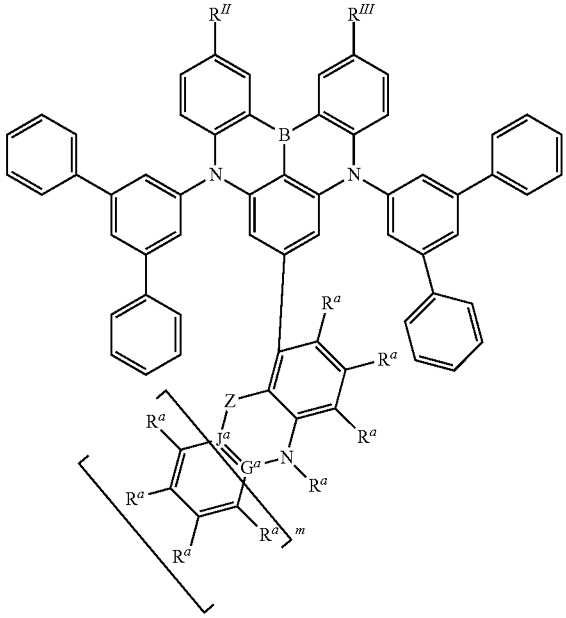
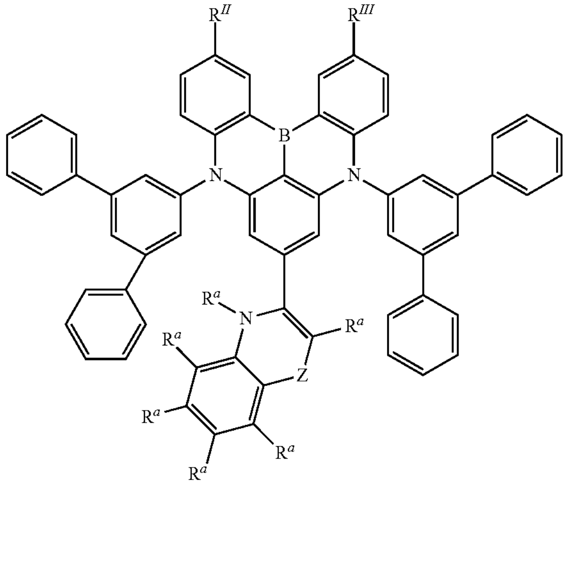

-continued
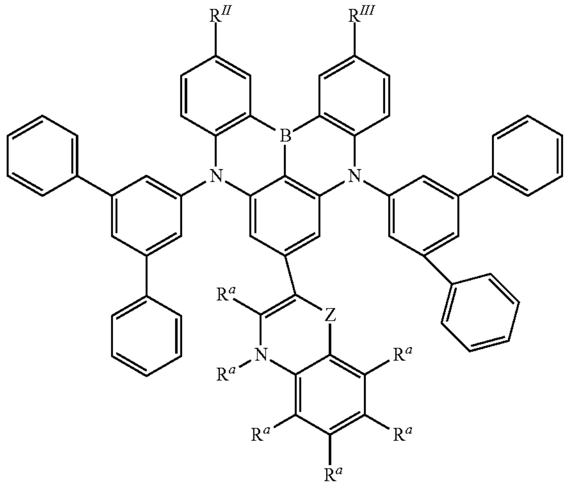
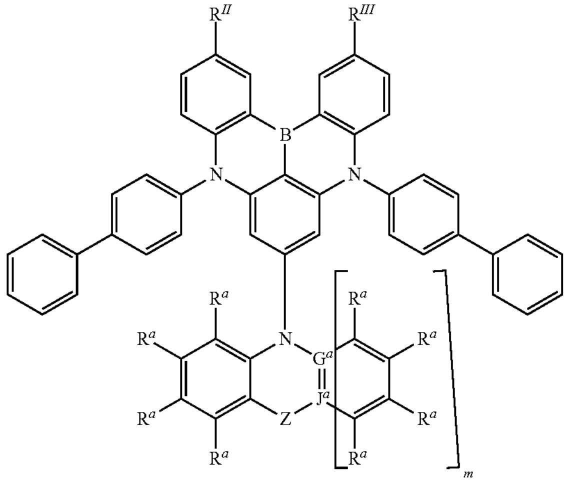
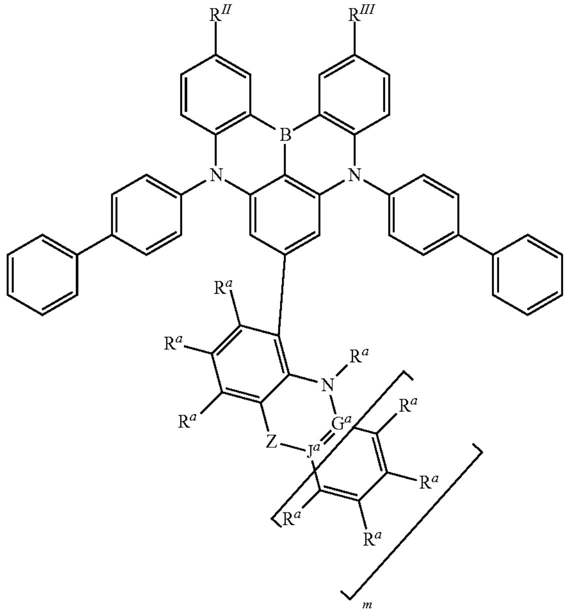
-continued
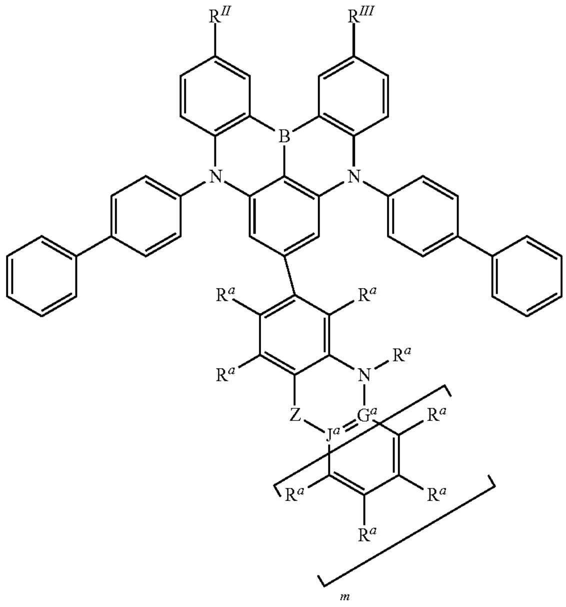
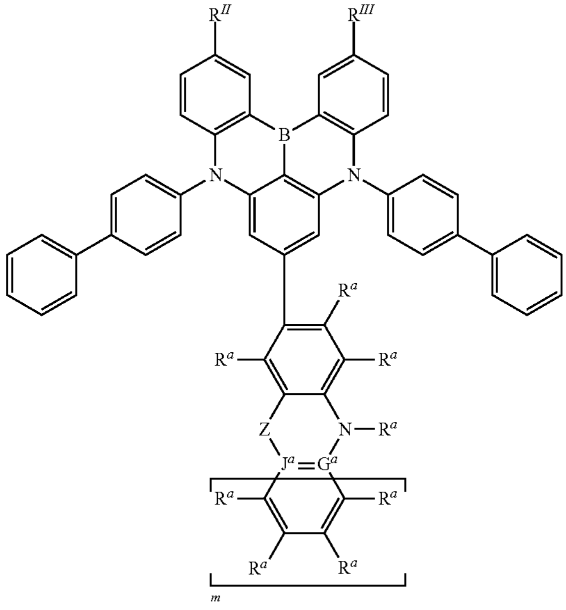

-continued
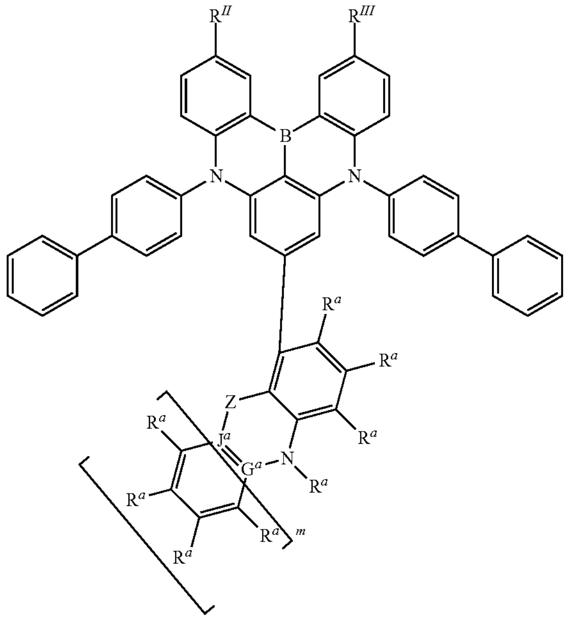
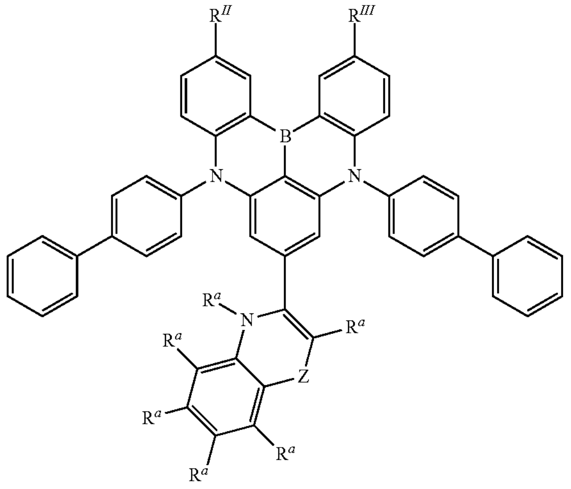
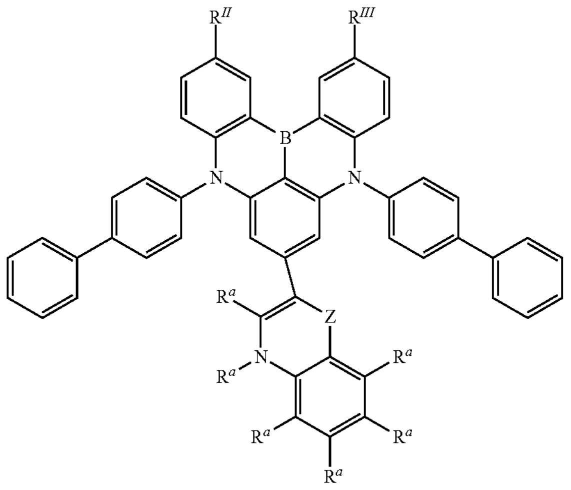
-continued
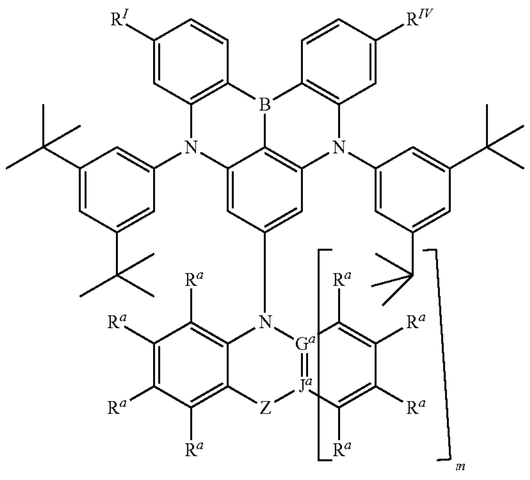
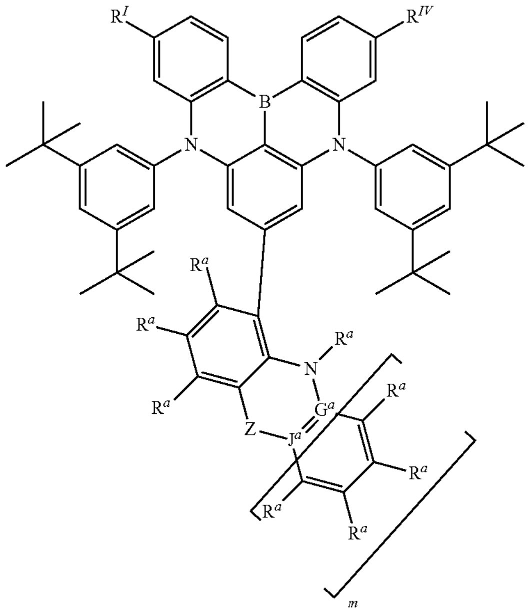
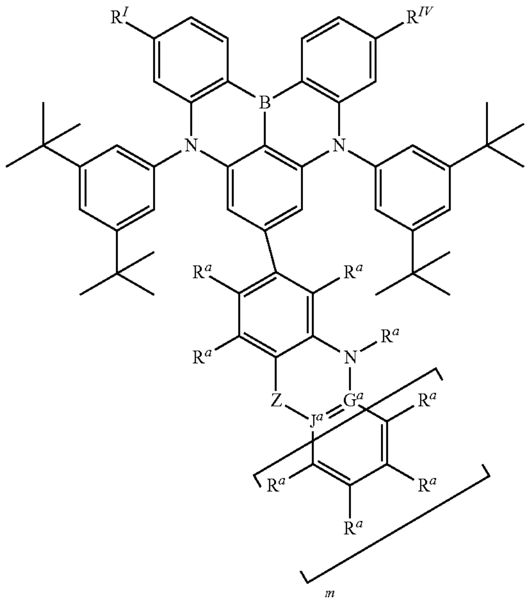

-continued

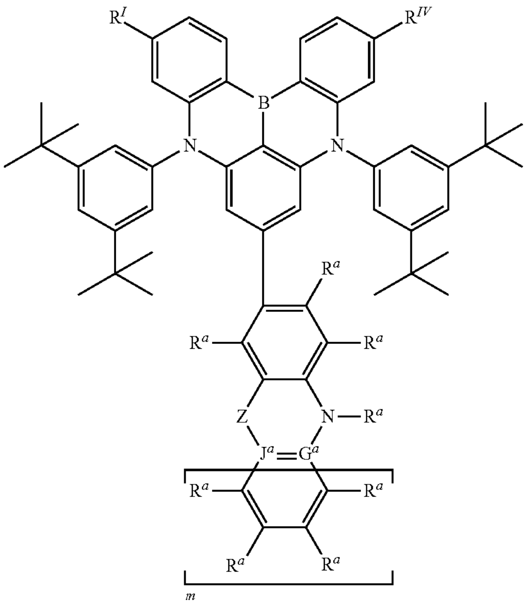

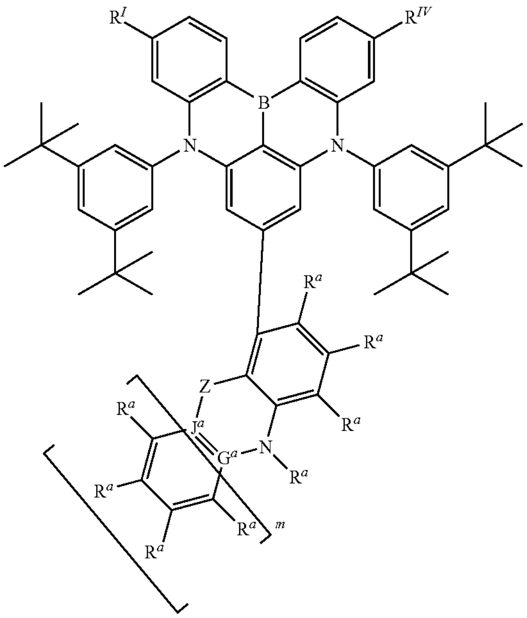

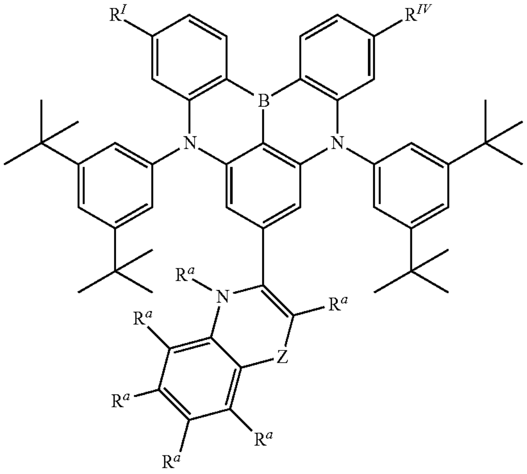

-continued

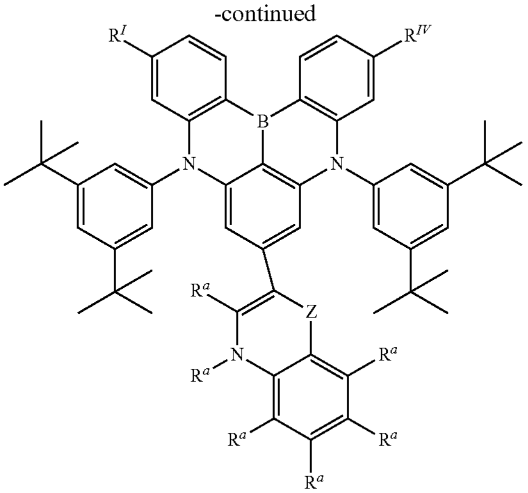

In a further embodiment, the organic molecule comprises or consists of a structure of formula Id, Ie, If or Ig, wherein $R^V$ comprises or consists of a structure of formula II, wherein m is 1 and Z is a direct bond.

In one embodiment, the organic molecule comprises or consists of a structure of formula Id, Ie, If or Ig, wherein $R^V$ comprises or consists of a structure of formula III-a, II-b or formula II-c:

Formula II-a

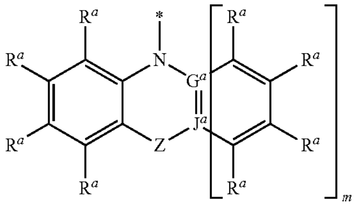

Formula II-b

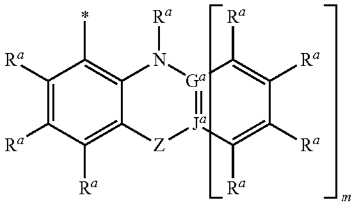

Formula II-c

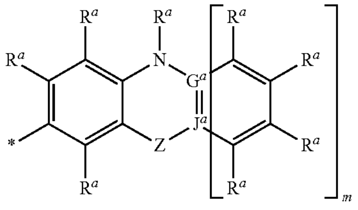

In one embodiment the organic molecule comprises or consists of a structure of formula Id, Ie, If or Ig, wherein $R^V$ comprises or consists of a structure of formula II-a, II-b or II-c, wherein Z is a direct bond.

In one embodiment the organic molecule comprises or consists of a structure of formula Id, Ie, If or Ig, wherein $R^V$ comprises or consists of a structure of formula II-a, II-b or II-c, wherein m is 1.

In a further embodiment the organic molecule comprises or consists of a structure of formula Id, Ie, If or Ig, wherein $R^V$ comprises or consists of a structure of formula II-a, II-b or II-c, wherein m is 1 and Z is a direct bond.

In a further embodiment, the organic molecule comprises or consists of a structure of formula Id, Ie, If or Ig, wherein $R^V$ comprises or consists of a structure of formula II-I, II-II or formula II-III:

Formula II-I

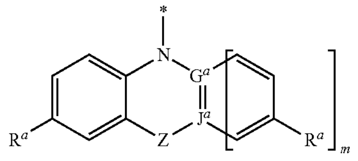

Formula II-II

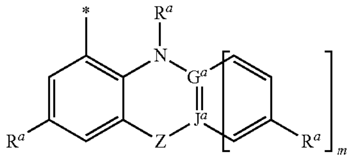

Formula II-III

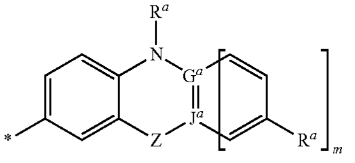

In one embodiment the organic molecule comprises or consists of a structure of formula Id, Ie, If or Ig, wherein $R^V$ comprises or consists of a structure of formula II-I, II-II or II-III, wherein Z is a direct bond.

In one embodiment the organic molecule comprises or consists of a structure of formula Id, Ie, If or Ig, wherein $R^V$ comprises or consists of a structure of formula II-I, II-II or II-III, wherein m is 1.

In a further embodiment the organic molecule comprises or consists of a structure of formula Id, Ie, If or Ig, wherein $R^V$ comprises or consists of a structure of formula II-I, II-II or II-III, wherein m is 1 and Z is a direct bond.

In a preferred embodiment, the organic molecule comprises or consists of a structure of formula Id, Ie, If or Ig, wherein $R^V$ comprises or consists of a structure of formula II-a:

Formula II-a

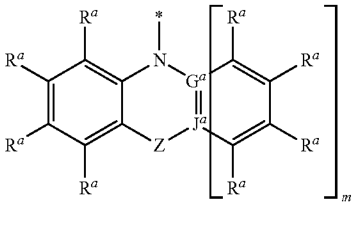

In one embodiment the organic molecule comprises or consists of a structure of formula Id, Ie, If or Ig, wherein $R^V$ comprises or consists of a structure of formula II-a, wherein Z is a direct bond.

In one embodiment the organic molecule comprises or consists of a structure of formula Id, Ie, If or Ig, wherein $R^V$ comprises or consists of a structure of formula II-a, wherein m is 1.

In a further embodiment the organic molecule comprises or consists of a structure of formula Id, Ie, If or Ig, wherein $R^V$ comprises or consists of a structure of formula II-a, wherein m is 1 and Z is a direct bond.

In certain embodiments, the organic molecule comprises or consists of a structure of formula Id, Ie, If or Ig, wherein $R^V$ comprises or consists of a structure of formula II-I:

Formula II-I

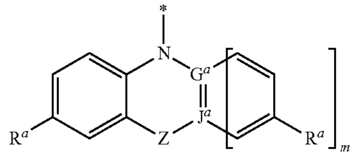

In one embodiment the organic molecule comprises or consists of a structure of formula Id, Ie, If or Ig, wherein $R^V$ comprises or consists of a structure of formula II-I, wherein Z is a direct bond.

In one embodiment the organic molecule comprises or consists of a structure of formula Id, Ie, If or Ig, wherein $R^V$ comprises or consists of a structure of formula II-I, wherein m is 1.

In one further embodiment the organic molecule comprises or consists of a structure of formula Id, Ie, If or Ig, wherein $R^V$ comprises or consists of a structure of formula II-I, wherein m is 1 and Z is a direct bond.

In certain embodiments, the organic molecule comprises or consists of a structure of one of formulas Id, Ie, If or Ig, wherein $R^V$ comprises or consists of a structure of formula II-I, wherein $R^a$ is hydrogen.

In one embodiment, the organic molecule comprises or consists of a structure of formula Id:

Formula Id

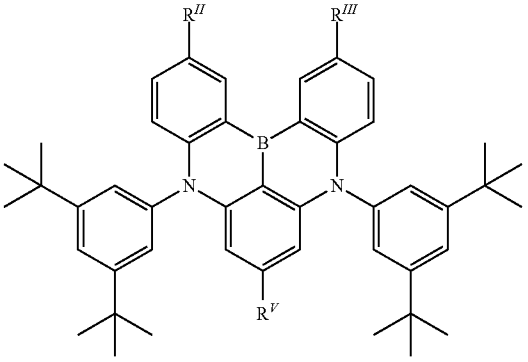

wherein $R^V$ is selected from the group of mesityl (Mes) or 2-meta-ter-phenyl.

In one embodiment, the organic molecule comprises or consists of a structure of formula Id, wherein $R^V$ is 2-meta-ter-phenyl.

In one embodiment, the organic molecule comprises or consists of a structure of formula Id, wherein $R^V$ is 2-meta-ter-phenyl; $R^{II}$ and $R^{III}$ are hydrogen.

In one embodiment, the organic molecule comprises or consists of a structure of formula Id-1:

Formula Id-1

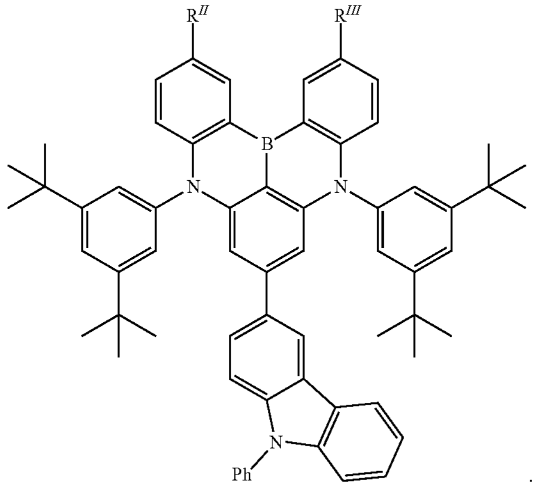

In one embodiment, the organic molecule comprises or consists of a structure of formula Id-2:

Formula Id-2

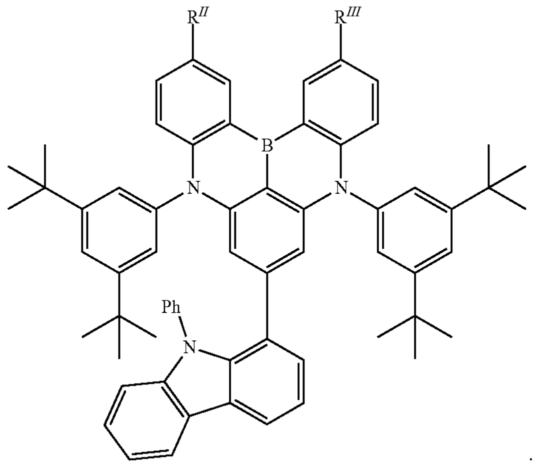

In one embodiment, the organic molecule comprises or consists of a structure of formula Id-3:

Formula Id-3

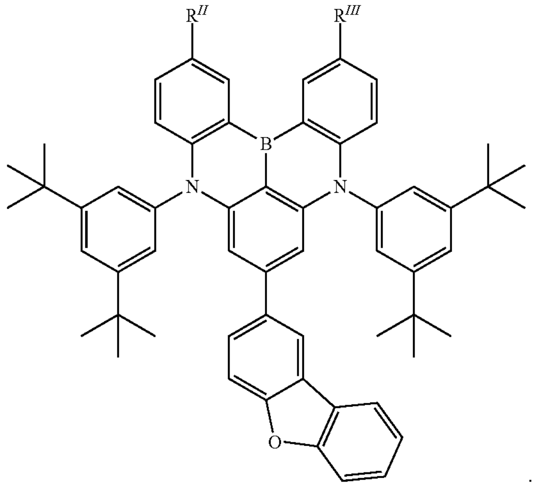

In one embodiment, the organic molecule comprises or consists of a structure of formula Id-4:

Formula Id-4

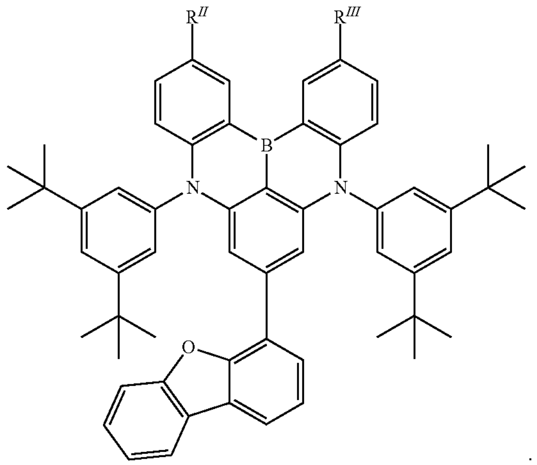

In certain embodiments, the organic molecule comprises or consists of a structure of formula Id-5:

Formula Id-5

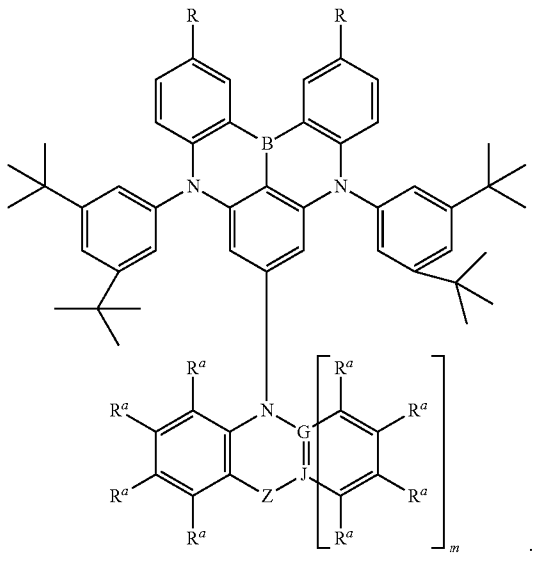

In a further embodiment, the organic molecule comprises or consists of a structure of formula Id-5, wherein $R^a$ is hydrogen.

In a further embodiment, the organic molecule comprises or consists of a structure of formula Id-6:

Formula Id-6

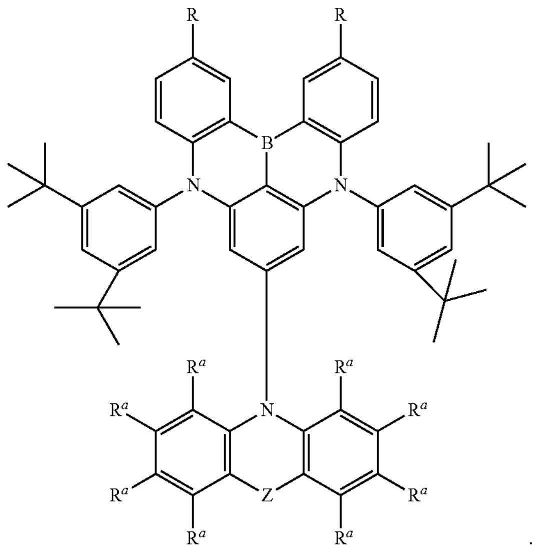

In a certain embodiment, the organic molecule comprises or consists of a structure of formula Id-7:

Formula Id-7

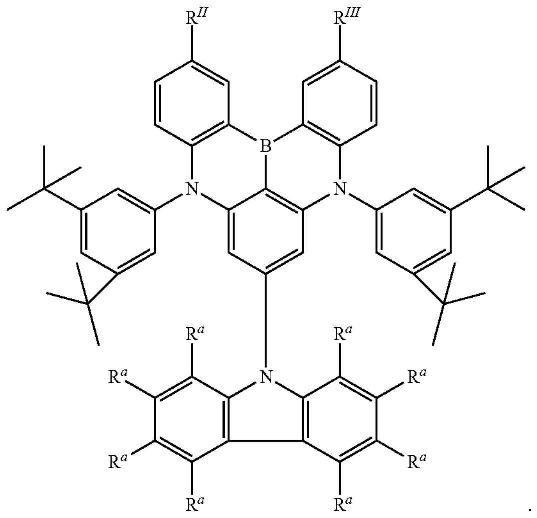

In a further embodiment, the organic molecule comprises or consists of a structure of formula Id-8:

Formula Id-8

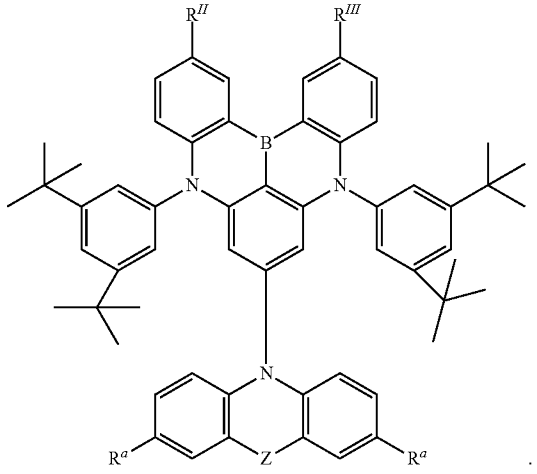

In a further embodiment, the organic molecule comprises or consists of a structure of formula Id-8, wherein $R^a$ is hydrogen.

In a certain embodiment, the organic molecule comprises or consists of a structure of formula Id-9:

Formula Id-9

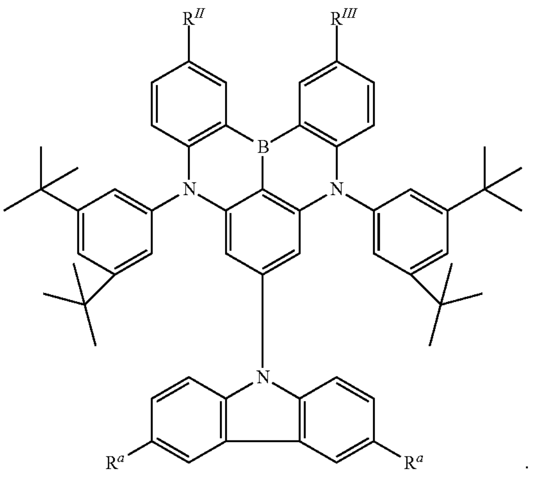

In a further embodiment, the organic molecule comprises or consists of a structure of formula Id-9, wherein $R^a$ is hydrogen.

In one embodiment, the organic molecule comprises or consists of a structure of formula Ie:

Formula Ie

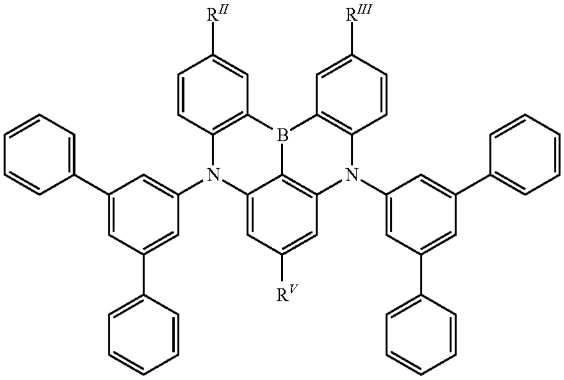

wherein $R^V$ is selected from the group of mesityl (Mes) or 2-meta-ter-phenyl.

In one embodiment, the organic molecule comprises or consists of a structure of formula Ie, wherein $R^V$ is 2-meta-ter-phenyl.

In one embodiment, the organic molecule comprises or consists of a structure of formula Ie, wherein $R^V$ is 2-meta-ter-phenyl; $R^{II}$ and $R^{III}$ are hydrogen.

In one embodiment, the organic molecule comprises or consists of a structure of formula Ie-1:

Formula Ie-1

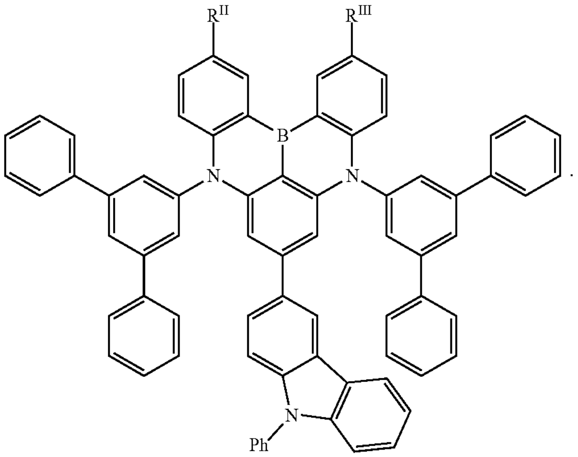

In one embodiment, the organic molecule comprises or consists of a structure of formula Ie-2:

Formula Ie-2

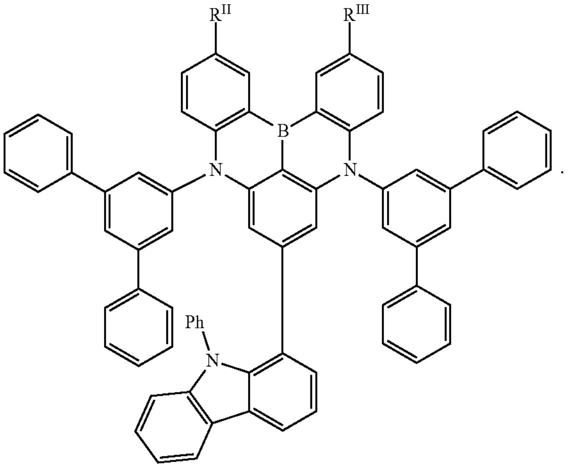

In one embodiment, the organic molecule comprises or consists of a structure of formula Ie-3:

Formula Ie-3

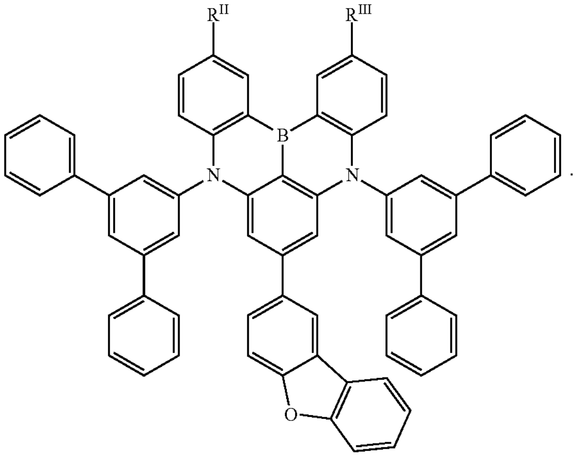

In one embodiment, the organic molecule comprises or consists of a structure of formula Ie-4:

Formula Ie-4

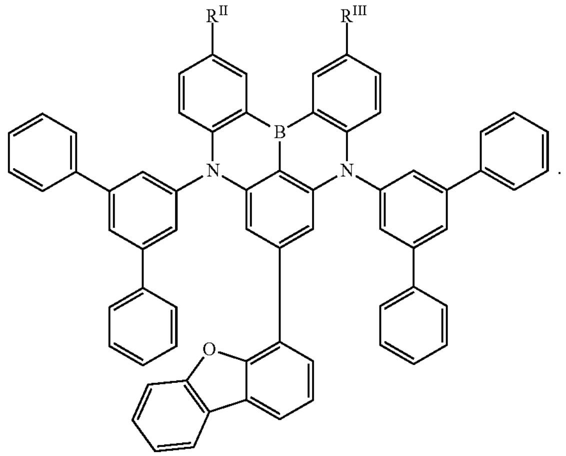

In certain embodiments, the organic molecule comprises or consists of a structure of formula Ie-5:

Formula Ie-5

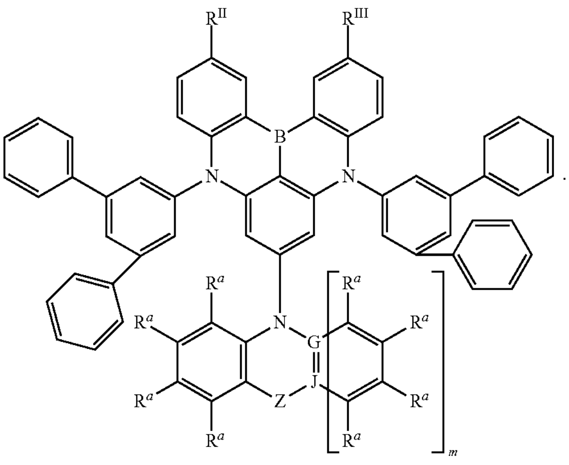

In a further embodiment, the organic molecule comprises or consists of a structure of formula Ie-5, wherein $R^a$ is hydrogen.

In a further embodiment, the organic molecule comprises or consists of a structure of formula Ie-6:

Formula Ie-6

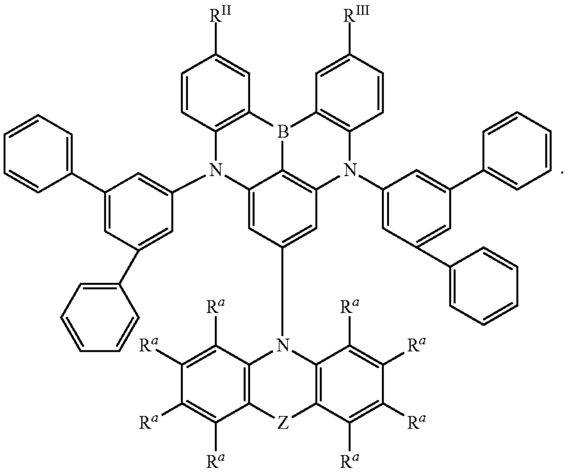

In a certain embodiment, the organic molecule comprises or consists of a structure of formula Ie-7:

Formula Ie-7

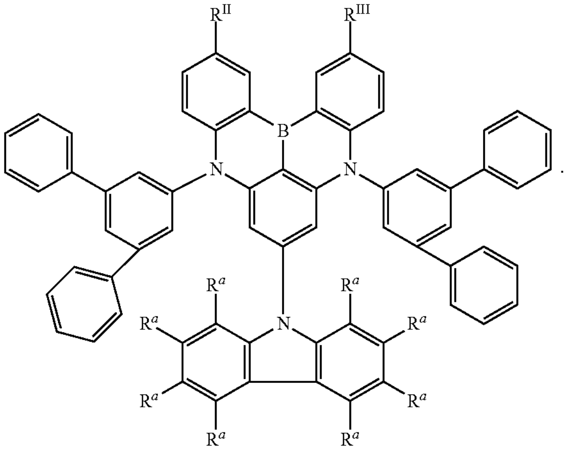

In a further embodiment, the organic molecule comprises or consists of a structure of formula Ie-8:

Formula Ie-8

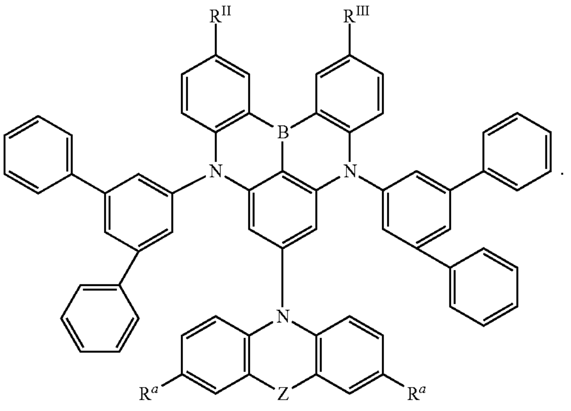

In a further embodiment, the organic molecule comprises or consists of a structure of formula Ie-8, wherein $R^a$ is hydrogen.

In a certain embodiment, the organic molecule comprises or consists of a structure of formula Ie-9:

Formula Ie-9

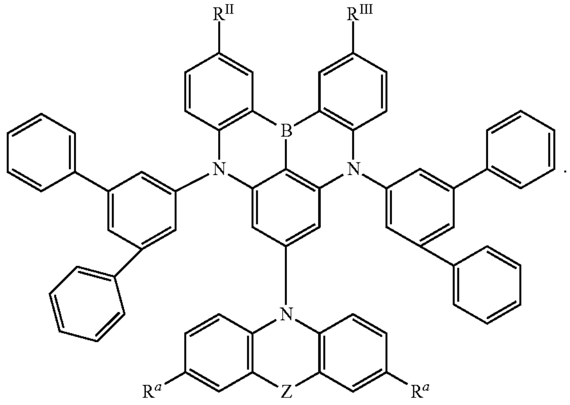

In a further embodiment, the organic molecule comprises or consists of a structure of formula Ie-9, wherein $R^a$ is hydrogen.

In one embodiment, the organic molecule comprises or consists of a structure of formula If:

Formula If

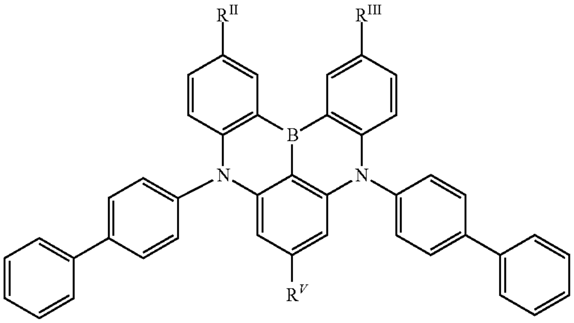

wherein $R^V$ is selected from the group of mesityl (Mes) or 2-meta-ter-phenyl.

In one embodiment, the organic molecule comprises or consists of a structure of formula If, wherein $R^V$ is 2-meta-ter-phenyl.

In one embodiment, the organic molecule comprises or consists of a structure of formula If, wherein $R^V$ is 2-meta-ter-phenyl; $R^{II}$ and $R^{III}$ are hydrogen.

In one embodiment, the organic molecule comprises or consists of a structure of formula If-1:

Formula If-1

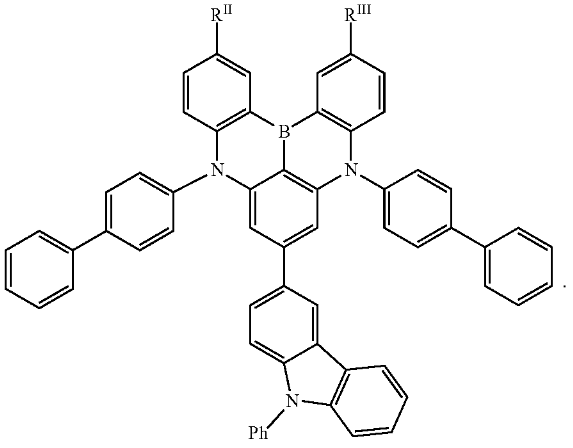

In one embodiment, the organic molecule comprises or consists of a structure of formula If-2:

Formula If-2

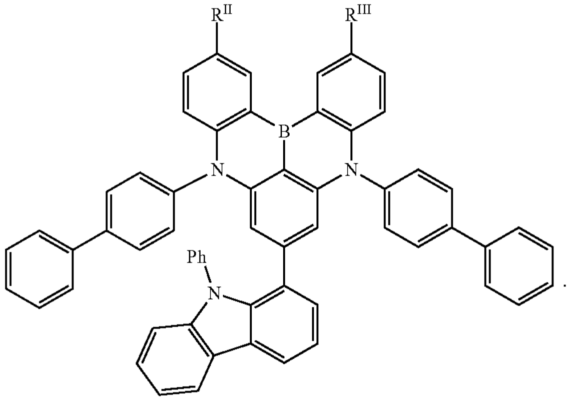

In one embodiment, the organic molecule comprises or consists of a structure of formula If-3:

Formula If-3

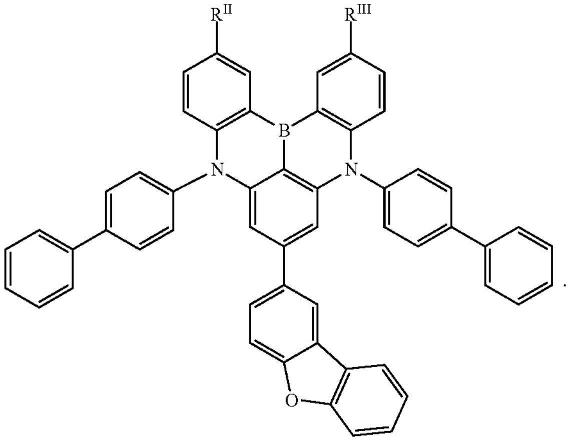

In one embodiment, the organic molecule comprises or consists of a structure of formula If-4:

Formula If-4

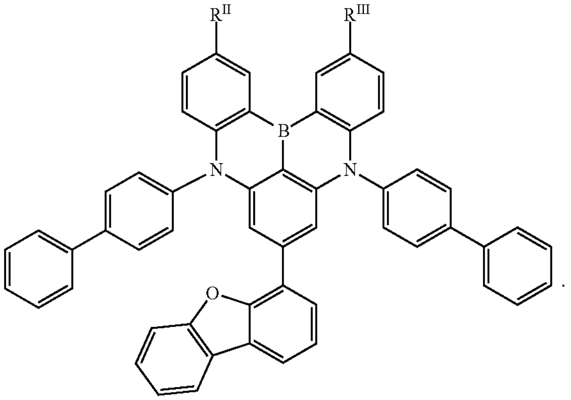

In some embodiments, at least one (i.e. 1, 2, 3 or 4) of $R^{I}$, $R^{II}$, $R^{III}$, and $R^{IV}$ is not hydrogen.

In certain embodiments, the organic molecule comprises or consists of a structure of formula If-5:

Formula If-5

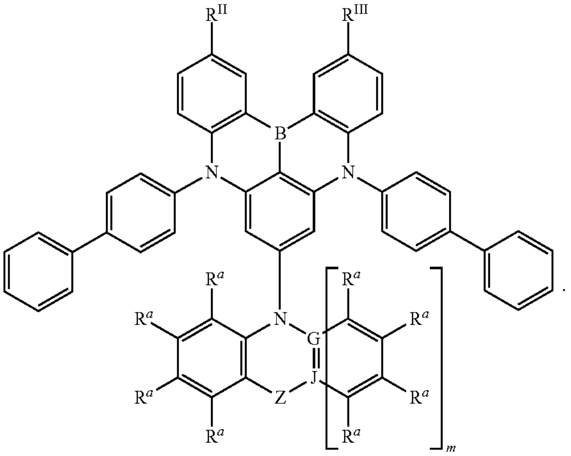

In a further embodiment, the organic molecule comprises or consists of a structure of formula If-5, wherein $R^{a}$ is hydrogen.

In a further embodiment, the organic molecule comprises or consists of a structure of formula If-6:

Formula If-6

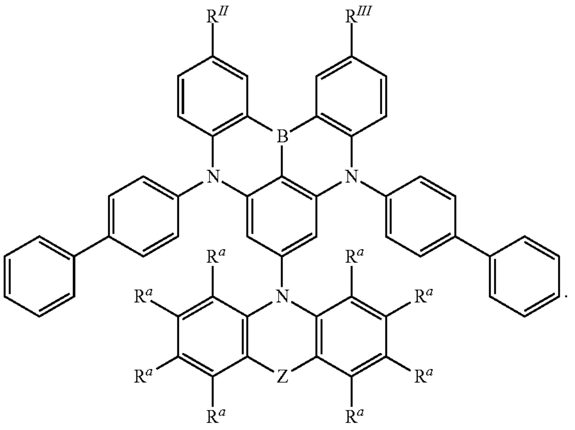

In a certain embodiment, the organic molecule comprises or consists of a structure of formula If-7:

Formula If-7

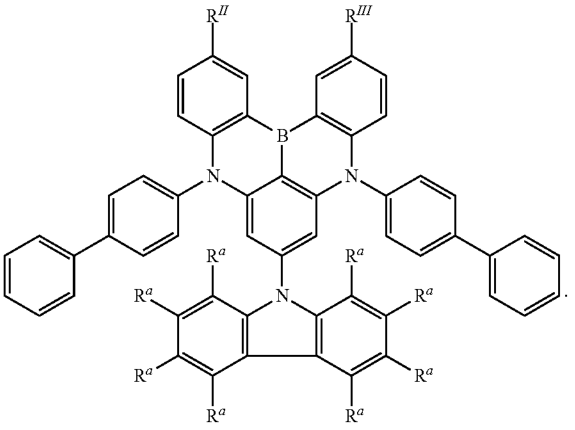

In a further embodiment, the organic molecule comprises or consists of a structure of formula If-8:

Formula If-8

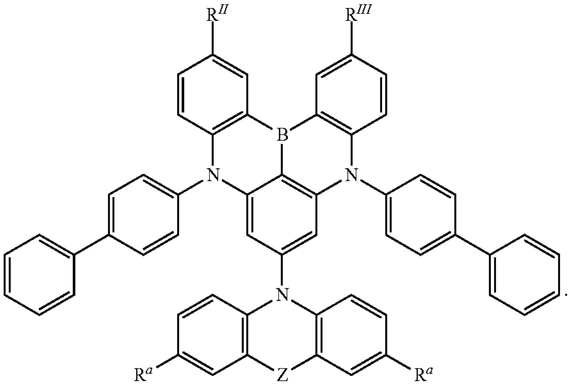

In a further embodiment, the organic molecule comprises or consists of a structure of formula If-8, wherein $R^{a}$ is hydrogen.

In a certain embodiment, the organic molecule comprises or consists of a structure of formula If-9:

Formula If-9

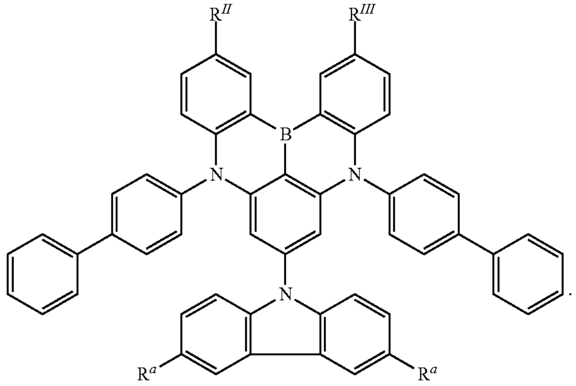

In a further embodiment, the organic molecule comprises or consists of a structure of formula If-9, wherein $R^a$ is hydrogen.

In one embodiment, the organic molecule comprises or consists of a structure of formula Ig:

Formula Ig

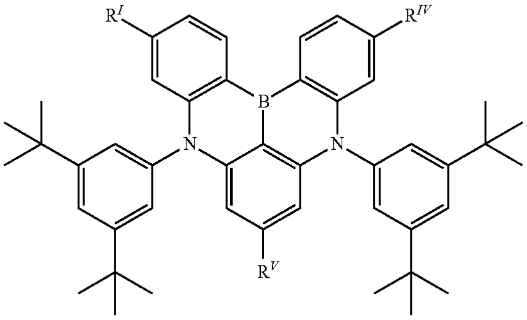

wherein $R^V$ comprises or consists of a structure of formula II.

In one embodiment, the organic molecule comprises or consists of a structure of formula Ig, wherein $R^V$ is 2-meta-ter-phenyl.

In one embodiment, the organic molecule comprises or consists of a structure of formula Ig, wherein $R^V$ is 2-meta-ter-phenyl; $R^1$ and $R^{IV}$ are hydrogen.

In one embodiment, the organic molecule comprises or consists of a structure of formula Ig-1:

Formula Ig-1

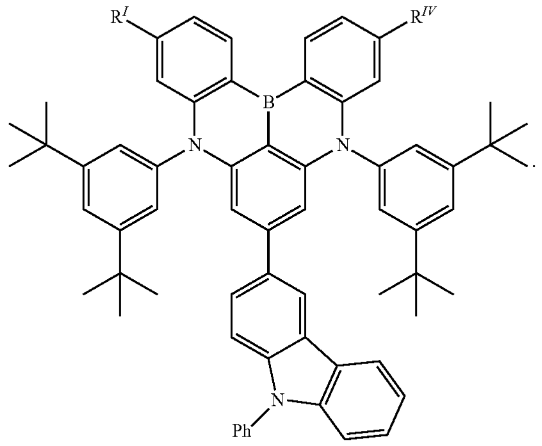

In one embodiment, the organic molecule comprises or consists of a structure of formula Ig-2:

Formula Ig-2

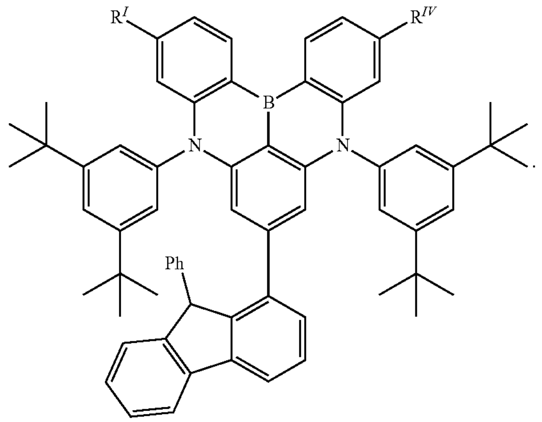

In certain embodiments, the organic molecule comprises or consists of a structure of formula Ig-3:

Formula Ig-3

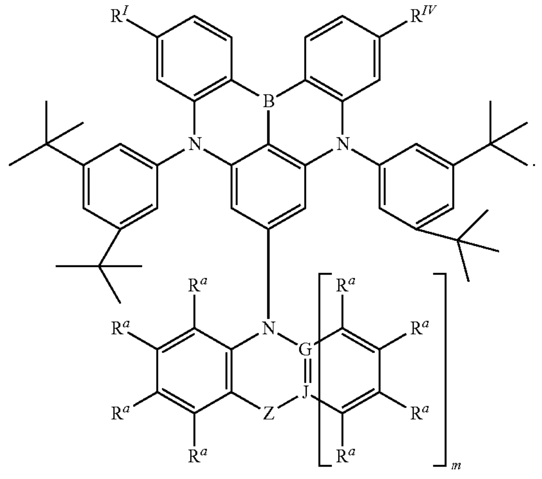

In a further embodiment, the organic molecule comprises or consists of a structure of formula Ig-3, wherein $R^a$ is hydrogen.

In a further embodiment, the organic molecule comprises or consists of a structure of formula Ig-4:

Formula Ig-4

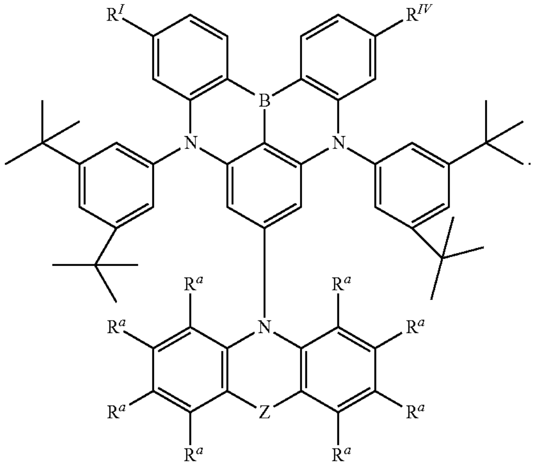

In a certain embodiment, the organic molecule comprises or consists of a structure of formula Ig-5:

Formula Ig-5

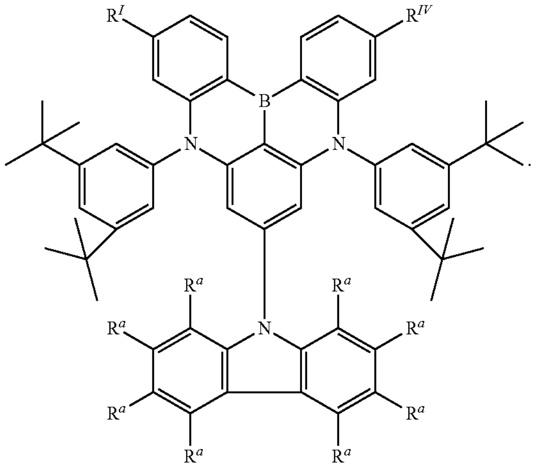

In a further embodiment, the organic molecule comprises or consists of a structure of formula Ig-6:

Formula Ig-6

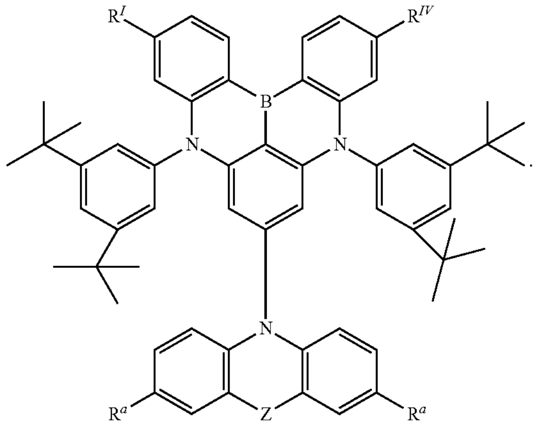

In a further embodiment, the organic molecule comprises or consists of a structure of formula Ig-6, wherein $R^a$ is hydrogen.

In a certain embodiment, the organic molecule comprises or consists of a structure of formula Ig-7:

Formula Ig-7

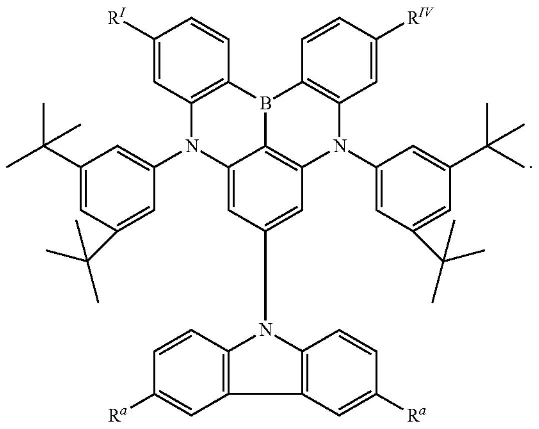

In a further embodiment, the organic molecule comprises or consists of a structure of formula Ig-7, wherein $R^a$ is hydrogen.

As used throughout the present application, the terms "aryl" and "aromatic" may be understood in the broadest sense as any mono-, bi- or polycyclic aromatic moieties. Accordingly, an aryl group contains 6 to 60 aromatic ring atoms, and a heteroaryl group contains 5 to 60 aromatic ring atoms, of which at least one is a heteroatom. Notwithstanding, throughout the application the number of aromatic ring atoms may be given as subscripted number in the definition of certain substituents. In particular, the heteroaromatic ring includes one to three heteroatoms. Again, the terms "heteroaryl" and "heteroaromatic" may be understood in the broadest sense as any mono-, bi- or polycyclic heteroaromatic moieties that include at least one heteroatom. The heteroatoms may at each occurrence be the same or different and be individually selected from the group consisting of N, O and S. Accordingly, the term "arylene" refers to a divalent substituent that bears two binding sites to other molecular structures and thereby serving as a linker structure. In case, a group in the exemplary embodiments is defined differently from the definitions given here, for example, the number of aromatic ring atoms or number of heteroatoms differs from the given definition, the definition in the exemplary embodiments is to be applied. According to the invention, a condensed (annulated) aromatic or heteroaromatic polycycle is built of two or more single aromatic or heteroaromatic cycles, which formed the polycycle via a condensation reaction.

In particular, as used throughout, the term "aryl group or heteroaryl group" comprises groups which can be bound via any position of the aromatic or heteroaromatic group, derived from benzene, naphthaline, anthracene, phenanthrene, pyrene, dihydropyrene, chrysene, perylene, fluoranthene, benzanthracene, benzphenanthrene, tetracene, pentacene, benzpyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, napthooxazole, anthroxazol, phenanthroxazol, isoxazole, 1,2-thiazole, 1,3-thiazole, benzothiazole, pyridazine, benzopyridazine, pyrimidine, benzopyrimidine, 1,3,5-triazine, quinoxaline, pyrazine, phenazine, naphthyridine, carboline, benzocarboline, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, purine, pteridine, indolizine and benzothiadiazole or combinations of the abovementioned groups.

As used throughout, the term "cyclic group" may be understood in the broadest sense as any mono-, bi- or polycyclic moieties.

As used throughout, the term "biphenyl" as a substituent may be understood in the broadest sense as ortho-biphenyl, meta-biphenyl, or para-biphenyl, wherein ortho, meta and para is defined in regard to the binding site to another chemical moiety.

As used throughout, the term "alkyl group" may be understood in the broadest sense as any linear, branched, or cyclic alkyl substituent. In particular, the term alkyl comprises the substituents methyl (Me), ethyl (Et), n-propyl ($^{n}$Pr), i-propyl ($^{i}$Pr), cyclopropyl, n-butyl ($^{n}$Bu), i-butyl ($^{i}$Bu), s-butyl ($^{s}$Bu), t-butyl ($^{t}$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl) octyl, 3-(3,7-dimethyl)octyl, adamantyl, 2,2,2-trifluorethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyln-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl and 1-(n-decyl)-cyclohex-1-yl.

As used throughout, the term "alkenyl" comprises linear, branched, and cyclic alkenyl substituents. The term "alkenyl group", for example, comprises the substituents ethenyl, propenyl, butenyl, pentenyl, cyclopentenyl, hexenyl, cyclohexenyl, heptenyl, cycloheptenyl, octenyl, cyclooctenyl or cyclooctadienyl.

As used throughout, the term "alkynyl" comprises linear, branched, and cyclic alkynyl substituents. The term "alkynyl group", for example, comprises ethynyl, propynyl, butynyl, pentynyl, hexynyl, heptynyl or octynyl.

As used throughout, the term "alkoxy" comprises linear, branched, and cyclic alkoxy substituents. The term "alkoxy group" exemplarily comprises methoxy, ethoxy, n-propoxy, i-propoxy, n-butoxy, i-butoxy, s-butoxy, t-butoxy and 2-methylbutoxy.

As used throughout, the term "thioalkoxy" comprises linear, branched, and cyclic thioalkoxy substituents, in which the O of the exemplarily alkoxy groups is replaced by S.

As used throughout, the terms "halogen" and "halo" may be understood in the broadest sense as being preferably fluorine, chlorine, bromine or iodine.

Whenever hydrogen (H) is mentioned herein, it could also be replaced by deuterium at each occurrence.

It is understood that when a molecular fragment is described as being a substituent or otherwise attached to another moiety, its name may be written as if it were a fragment (e.g. naphtyl, dibenzofuryl) or as if it were the whole molecule (e.g. naphthalene, dibenzofuran). As used herein, these different ways of designating a substituent or attached fragment are considered to be equivalent.

In one embodiment, the organic molecules according to the invention have an excited state lifetime of not more than 150 μs, of not more than 100 μs, in particular of not more than 50 μs, more preferably of not more than 10 μs or not more than 7 μs in a film of poly(methyl methacrylate) (PMMA) with 5% by weight of organic molecule at room temperature.

In a further embodiment of the invention, the organic molecules according to the invention have an emission peak in the visible or nearest ultraviolet range, i.e., in the range of a wavelength of from 380 nm to 800 nm, with a full width at half maximum of less than 0.23 eV, preferably less than 0.20 eV, more preferably less than 0.19 eV, even more preferably less than 0.18 eV or even less than 0.17 eV in a film of poly(methyl methacrylate) (PMMA) with 5% by weight of organic molecule at room temperature.

Orbital and excited state energies can be determined either by means of experimental methods. The energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, wherein $E^{gap}$ is determined as follows: For host compounds, the onset of the emission spectrum of a film with 10% by weight of host in poly (methyl methacrylate) (PMMA) is used as $E^{gap}$, unless stated otherwise. For emitter molecules, $E^{gap}$ is determined as the energy at which the excitation and emission spectra of a film with 10% by weight of emitter in PMMA cross. For the organic molecules according to the invention, $E^{gap}$ is determined as the energy at which the excitation and emission spectra of a film with 5% by weight of emitter in PMMA cross.

The energy of the first excited triplet state T1 is determined from the onset of the emission spectrum at low temperature, typically at 77 K. For host compounds, where the first excited singlet state and the lowest triplet state are energetically separated by >0.4 eV, the phosphorescence is usually visible in a steady-state spectrum in 2-Me-THF. The triplet energy can thus be determined as the onset of the phosphorescence spectrum. For TADF emitter molecules, the energy of the first excited triplet state T1 is determined from the onset of the delayed emission spectrum at 77 K, if not otherwise stated, measured in a film of PMMA with 10% by weight of emitter and in case of the organic molecules according to the invention with 1% by weight of the organic molecules according to the invention. Both for host and emitter compounds, the energy of the first excited singlet state S1 is determined from the onset of the emission spectrum, if not otherwise stated, measured in a film of PMMA with 10% by weight of host or emitter compound and in case of the organic molecules according to the invention with 1% by weight of the organic molecules according to the invention.

The onset of an emission spectrum is determined by computing the intersection of the tangent to the emission spectrum with the x-axis. The tangent to the emission spectrum is set at the high-energy side of the emission band and at the point at half maximum of the maximum intensity of the emission spectrum.

In one embodiment, the organic molecules according to the invention have an onset of the emission spectrum, which is energetically close to the emission maximum, i.e. the energy difference between the onset of the emission spectrum and the energy of the emission maximum is below 0.14 eV, preferably below 0.13 eV, or even below 0.12 eV, while the full width at half maximum (FWHM) of the organic molecules is less than 0.23 eV, preferably less than 0.20 eV, more preferably less than 0.19 eV, even more preferably less than 0.18 eV or even less than 0.17 eV in a film of poly(methyl methacrylate) (PMMA) with 5% by weight of organic molecule at room temperature, resulting in a CIEy coordinate below 0.20, preferably below 0.18, more preferably below 0.16 or even more preferred below 0.14.

A further aspect of the invention relates to the use of an organic molecule of the invention as a luminescent emitter or as an absorber, and/or as a host material and/or as an electron transport material, and/or as a hole injection material, and/or as a hole blocking material in an optoelectronic device.

A preferred embodiment relates to the use of an organic molecule according to the invention as a luminescent emitter in an optoelectronic device.

The optoelectronic device may be understood in the broadest sense as any device based on organic materials that is suitable for emitting light in the visible or nearest ultraviolet (UV) range, i.e., in the range of a wavelength of from 380 to 800 nm. More preferably, the optoelectronic device may be able to emit light in the visible range, i.e., of from 400 nm to 800 nm.

In the context of such use, the optoelectronic device is more particularly selected from the group consisting of:

- organic light-emitting diodes (OLEDs),
- light-emitting electrochemical cells,
- OLED sensors, especially in gas and vapor sensors that are not hermetically shielded to the surroundings,
- organic diodes,
- organic solar cells,
- organic transistors,
- organic field-effect transistors,
- organic lasers, and
- down-conversion elements.

In a preferred embodiment in the context of such use, the optoelectronic device is a device selected from the group consisting of an organic light emitting diode (OLED), a light emitting electrochemical cell (LEC), and a light-emitting transistor.

In the case of the use, the fraction of the organic molecule according to the invention in the emission layer in an optoelectronic device, more particularly in an OLED, is 0.1% to 99% by weight, more particularly 1% to 80% by weight. In an alternative embodiment, the proportion of the organic molecule in the emission layer is 100% by weight.

In one embodiment, the light-emitting layer comprises not only the organic molecules according to the invention, but also a host material whose triplet (T1) and singlet (S1) energy levels are energetically higher than the triplet (T1) and singlet (S1) energy levels of the organic molecule.

A further aspect of the invention relates to a composition comprising or consisting of:

(a) at least one organic molecule according to the invention, in particular in the form of an emitter and/or a host, and (b) one or more emitter and/or host materials, which differ from the organic molecule according to the invention and (c) optional one or more dyes and/or one or more solvents.

In one embodiment, the light-emitting layer comprises (or essentially consists of) a composition comprising or consisting of:

(a) at least one organic molecule according to the invention, in particular in the form of an emitter and/or a host, and (b) one or more emitter and/or host materials, which differ from the organic molecule according to the invention and (c) optional one or more dyes and/or one or more solvents.

In a particular embodiment, the light-emitting layer EML comprises (or essentially consists of) a composition comprising or consisting of:

(i) 0.1-10% by weight, preferably 0.5-5% by weight, in particular 1-3% by weight, of one or more organic molecules according to the invention;

(ii) 5-99% by weight, preferably 15-85% by weight, in particular 20-75% by weight, of at least one host compound H; and (iii) 0.9-94.9% by weight, preferably 14.5-80% by weight, in particular 24-77% by weight, of at least one further host compound D with a structure differing from the structure of the molecules according to the invention; and (iv) optionally 0-94% by weight, preferably 0-65% by weight, in particular 0-50% by weight, of a solvent; and (v) optionally 0-30% by weight, in particular 0-20% by weight, preferably 0-5% by weight, of at least one further emitter molecule F with a structure differing from the structure of the molecules according to the invention.

Preferably, energy can be transferred from the host compound H to the one or more organic molecules according to the invention, in particular transferred from the first excited triplet state T1(H) of the host compound H to the first excited triplet state T1(E) of the one or more organic molecules according to the invention E and/or from the first excited singlet state S1(H) of the host compound H to the first excited singlet state S1(E) of the one or more organic molecules according to the invention E.

In one embodiment, the host compound H has a highest occupied molecular orbital HOMO(H) having an energy $E^{HOMO}(H)$ in the range of from −5 to −6.5 eV and the at least one further host compound D has a highest occupied molecular orbital HOMO(D) having an energy $E^{HOMO}(D)$, wherein $E^{HOMO}(H)>E^{HOMO}(D)$ In a further embodiment, the host compound H has a lowest unoccupied molecular orbital LUMO(H) having an energy $E^{LUMO}(H)$ and the at least one further host compound D has a lowest unoccupied molecular orbital LUMO(D) having an energy $E^{LUMO}(D)$, wherein $E^{LUMO}(H)>E^{LUMO}(D)$.

In one embodiment, the host compound H has a highest occupied molecular orbital HOMO(H) having an energy $E^{HOMO}(H)$ and a lowest unoccupied molecular orbital LUMO(H) having an energy $E^{LUMO}(H)$, and the at least one further host compound D has a highest occupied molecular orbital HOMO(D) having an energy $E^{HOMO}(D)$ and a lowest unoccupied molecular orbital LUMO(D) having an energy $E^{LUMO}(D)$, the organic molecule according to the invention E has a highest occupied molecular orbital HOMO(E) having an energy $E^{HOMO}(E)$ and a lowest unoccupied molecular orbital LUMO(E) having an energy $E^{LUMO}(E)$, wherein $E^{HOMO}(H)>E^{HOMO}(D)$ and the difference between the energy level of the highest occupied molecular orbital HOMO(E) of the organic molecule according to the invention E ($E^{HOMO}(E)$) and the energy level of the highest occupied molecular orbital HOMO(H) of the host compound H ($E^{HOMO}(H)$) is between −0.5 eV and 0.5 eV, more preferably between −0.3 eV and 0.3 eV, even more preferably between −0.2 eV and 0.2 eV or even between −0.1 eV and 0.1 eV; and $E^{LUMO}(H)>E^{LUMO}(D)$ and the difference between the energy level of the lowest unoccupied molecular orbital LUMO(E) of the organic molecule according to the invention E ($E^{LUMO}(E)$) and the lowest unoccupied molecular orbital LUMO(D) of the at least one further host compound D ($E^{LUMO}(D)$) is between −0.5 eV and 0.5 eV, more preferably between −0.3 eV and 0.3 eV, even more preferably between −0.2 eV and 0.2 eV or even between −0.1 eV and 0.1 eV.

In one embodiment of the invention the host compound D and/or the host compound H is a thermally-activated delayed fluorescence (TADF)-material. TADF materials exhibit a $\Delta E_{ST}$ value, which corresponds to the energy difference between the first excited singlet state (S1) and the first excited triplet state (T1), of less than 2500 $cm^{-1}$. Preferably the TADF material exhibits a $\Delta E_{ST}$ value of less than 3000 $cm^{-1}$, more preferably less than 1500 $cm^{-1}$, even more preferably less than 1000 $cm^{-1}$ or even less than 500 $cm^{-1}$.

In one embodiment, the host compound D is a TADF material and the host compound H exhibits a $\Delta E_{ST}$ value of more than 2500 $cm^{-1}$. In a particular embodiment, the host compound D is a TADF material and the host compound H is selected from group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In one embodiment, the host compound H is a TADF material and the host compound D exhibits a $\Delta E_{ST}$ value of more than 2500 $cm^{-1}$. In a particular embodiment, the host compound H is a TADF material and the host compound D is selected from group consisting of T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine).

In a further aspect, the invention relates to an optoelectronic device comprising an organic molecule or a composition of the type described here, more particularly in the form of a device selected from the group consisting of organic light-emitting diode (OLED), light-emitting electrochemical cell, OLED sensor, more particularly gas and vapour sensors not hermetically externally shielded, organic diode, organic solar cell, organic transistor, organic field-effect transistor, organic laser and down-conversion element.

In a preferred embodiment, the optoelectronic device is a device selected from the group consisting of an organic light emitting diode (OLED), a light emitting electrochemical cell (LEC), and a light-emitting transistor.

In one embodiment of the optoelectronic device of the invention, the organic molecule according to the invention E is used as emission material in a light-emitting layer EML.

In one embodiment of the optoelectronic device of the invention, the light-emitting layer EML consists of the composition according to the invention described here.

When the optoelectronic device is an OLED, it may, for example, have the following layer structure:

1. substrate
2. anode layer A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL
10. cathode layer, wherein the OLED comprises each layer selected from the group of HIL, HTL, EBL, HBL, ETL, and EIL only optionally, different layers may be merged and the OLED may comprise more than one layer of each layer type defined above.

Furthermore, the optoelectronic device may, in one embodiment, comprise one or more protective layers protecting the device from damaging exposure to harmful species in the environment including, for example, moisture, vapor and/or gases.

In one embodiment of the invention, the optoelectronic device is an OLED, with the following inverted layer structure:

1. substrate
2. cathode layer
3. electron injection layer, EIL
4. electron transport layer, ETL
5. hole blocking layer, HBL
6. emitting layer, B
7. electron blocking layer, EBL
8. hole transport layer, HTL
9. hole injection layer, HIL
10. anode layer A wherein the OLED comprises each layer selected from the group of HIL, HTL, EBL, HBL, ETL, and EIL only optionally, different layers may be merged and the OLED may comprise more than one layer of each layer types defined above.

In one embodiment of the invention, the optoelectronic device is an OLED, which may have a stacked architecture. In this architecture, contrary to the typical arrangement in which the OLEDs are placed side by side, the individual units are stacked on top of each other. Blended light may be generated with OLEDs exhibiting a stacked architecture, in particular white light may be generated by stacking blue, green and red OLEDs. Furthermore, the OLED exhibiting a stacked architecture may comprise a charge generation layer (CGL), which is typically located between two OLED subunits and typically consists of a n-doped and p-doped layer with the n-doped layer of one CGL being typically located closer to the anode layer.

In one embodiment of the invention, the optoelectronic device is an OLED, which comprises two or more emission layers between anode and cathode. In particular, this so-called tandem OLED comprises three emission layers, wherein one emission layer emits red light, one emission layer emits green light and one emission layer emits blue light, and optionally may comprise further layers such as charge generation layers, blocking or transporting layers between the individual emission layers. In a further embodiment, the emission layers are adjacently stacked. In a further embodiment, the tandem OLED comprises a charge generation layer between each two emission layers. In addition, adjacent emission layers or emission layers separated by a charge generation layer may be merged.

The substrate may be formed by any material or composition of materials. Most frequently, glass slides are used as substrates. Alternatively, thin metal layers (e.g., copper, gold, silver or aluminum films) or plastic films or slides may be used. This may allow for a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. Preferably, the anode layer A comprises a large content or even consists of transparent conductive oxides (TCOs). Such anode layer A may, for example, comprise indium tin oxide, aluminum zinc oxide, fluorine doped tin oxide, indium zinc oxide, PbO, SnO, zirconium oxide, molybdenum oxide, vanadium oxide, tungsten oxide, graphite, doped Si, doped Ge, doped GaAs, doped polyaniline, doped polypyrrol and/or doped polythiophene.

The anode layer A (essentially) may consist of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL).

Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may, for example, comprise PEDOT:PSS (poly-3,4-ethylendioxy thiophene: polystyrene sulfonate), PEDOT (poly-3,4-ethylendioxy thiophene), mMTDATA (4,4',4"-tris [phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL), a hole transport layer (HTL) is typically located. Herein, any hole transport compound may be used. For example, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). Preferably, hole transport compounds bear comparably high energy levels of their triplet states T1. For example, the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may, for example, be used as inorganic dopant. Tetrafluorotetracyanoquinodimethane (F4-TCNQ), copper-pentafluorobenzoate (Cu(I)pFBz) or transition metal complexes may, for example, be used as organic dopant.

The EBL may, for example, comprise mCP (1,3-bis(carbazol-9-yl)benzene), TCTA, 2-TNATA, mCBP (3,3-di(9H-carbazol-9-yl)biphenyl), tris-Pcz, CzSi (9-(4-tert-Butylphenyl)-3,6-bis(triphenylsilyl)-9H-carbazole), and/or DCB (N,N'-dicarbazolyl-1,4-dimethylbenzene).

Adjacent to the hole transport layer (HTL), the light-emitting layer EML is typically located. The light-emitting layer EML comprises at least one light emitting molecule. Particularly, the EML comprises at least one light emitting molecule according to the invention E. In one embodiment, the light-emitting layer comprises only the organic molecules according to the invention. Typically, the EML additionally comprises one or more host materials H. For example, the host material H is selected from CBP (4,4'-Bis-(N-carbazolyl)-biphenyl), mCP, mCBP Sif87 (dibenzo [b,d]thiophen-2-yltriphenylsilane), CzSi, Sif88 (dibenzo[b,d]thiophen-2-yl)diphenylsilane), DPEPO (bis[2-(diphenylphosphino)phenyl]ether oxide), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris (biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). The host material H typically should be selected to exhibit first triplet (T1) and first singlet (S1) energy levels, which are energetically higher than the first triplet (T1) and first singlet (S1) energy levels of the organic molecule.

In one embodiment of the invention, the EML comprises a so-called mixed-host system with at least one hole-dominant host and one electron-dominant host. In a particular embodiment, the EML comprises exactly one light emitting organic molecule according to the invention and a mixed-host system comprising T2T as electron-dominant host and a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host. In a further embodiment the EML comprises 50-80% by weight, preferably 60-75% by weight of a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole; 10-45% by weight, preferably 15-30% by weight of T2T and 5-40% by weight, preferably 10-30% by weight of light emitting molecule according to the invention.

Adjacent to the light-emitting layer EML, an electron transport layer (ETL) may be located. Herein, any electron transporter may be used. Exemplarily, electron-poor compounds such as, e.g., benzimidazoles, pyridines, triazoles, oxadiazoles (e.g., 1,3,4-oxadiazole), phosphinoxides and sulfone, may be used. An electron transporter may also be a star-shaped heterocycle such as 1,3,5-tri(1-phenyl-1H-benzo[d]imidazol-2-yl)phenyl (TPBi). The ETL may comprise NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1'-biphenyl). Optionally, the ETL may be doped with materials such as Liq. The electron transport layer (ETL) may also block holes or a holeblocking layer (HBL) is introduced. The HBL may, for example, comprise BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), and/or TCB/TCP (1,3,5-tris(N-carbazolyl)benzol/ 1,3,5-tris(carbazol)-9-yl) benzene).

Adjacent to the electron transport layer (ETL), a cathode layer C may be located. The cathode layer C may, for example, comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscalic silver wires.

An OLED may further, optionally, comprise a protection layer between the electron transport layer (ETL) and the cathode layer C (which may be designated as electron injection layer (EIL)). This layer may comprise lithium fluoride, cesium fluoride, silver, Liq (8-hydroxyquinolinolatolithium), $Li_2O$, $BaF_2$, MgO and/or NaF.

Optionally, the electron transport layer (ETL) and/or a hole blocking layer (HBL) may also comprise one or more host compounds H.

In order to modify the emission spectrum and/or the absorption spectrum of the light-emitting layer EML further, the light-emitting layer EML may further comprise one or more further emitter molecules F. Such an emitter molecule F may be any emitter molecule known in the art. Preferably such an emitter molecule F is a molecule with a structure differing from the structure of the molecules according to the invention E. The emitter molecule F may optionally be a TADF emitter. Alternatively, the emitter molecule F may optionally be a fluorescent and/or phosphorescent emitter molecule which is able to shift the emission spectrum and/or the absorption spectrum of the light-emitting layer EML. Exemplarily, the triplet and/or singlet excitons may be transferred from the organic emitter molecule according to the invention to the emitter molecule F before relaxing to the ground state S0 by emitting light typically red-shifted in comparison to the light emitted by an organic molecule. Optionally, the emitter molecule F may also provoke two-photon effects (i.e., the absorption of two photons of half the energy of the absorption maximum).

Optionally, an optoelectronic device (e.g., an OLED) may, for example, be an essentially white optoelectronic device. For example, such white optoelectronic device may comprise at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows: violet: wavelength range of >380-420 nm;

deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to emitter molecules, such colors refer to the emission maximum. Therefore, for example, a deep blue emitter has an emission maximum in the range of from >420 to 480 nm, a sky blue emitter has an emission maximum in the range of from >480 to 500 nm, a green emitter has an emission maximum in a range of from >500 to 560 nm, a red emitter has an emission maximum in a range of from >620 to 800 nm.

A deep blue emitter may preferably have an emission maximum of below 480 nm, more preferably below 470 nm, even more preferably below 465 nm or even below 460 nm. It will typically be above 420 nm, preferably above 430 nm, more preferably above 440 nm or even above 450 nm.

Accordingly, a further aspect of the present invention relates to an OLED, which exhibits an external quantum efficiency at 1000 $cd/m^2$ of more than 8%, more preferably of more than 10%, more preferably of more than 13%, even more preferably of more than 15% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 $cd/m^2$ of more than 100 h, preferably more than 200 h, more preferably more than 400 h, even more preferably more than 750 h or even more than 1000 h. Accordingly, a further aspect of the present invention relates to an OLED, whose emission exhibits a CIEy color coordinate of less than 0.45, preferably less than 0.30, more preferably less than 0.20 or even more preferably less than 0.15 or even less than 0.10.

A further aspect of the present invention relates to an OLED, which emits light at a distinct color point. According to the present invention, the OLED emits light with a narrow emission band (small full width at half maximum (FWHM)). In one aspect, the OLED according to the invention emits light with a FWHM of the main emission peak of less than 0.30 eV, preferably less than 0.25 eV, more preferably less than 0.20 eV, even more preferably less than 0.19 eV or even less than 0.17 eV.

A further aspect of the present invention relates to an OLED, which emits light with CIEx and CIEy color coordinates close to the CIEx (=0.131) and CIEy (=0.046) color coordinates of the primary color blue (CIEx=0.131 and ClEy=0.046) as defined by ITU-R Recommendation BT.2020 (Rec. 2020) and thus is suited for the use in Ultra High Definition (UHD) displays, e.g. UHD-TVs. Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

In a further aspect, the invention relates to a method for producing an optoelectronic component. In this case an organic molecule of the invention is used.

The optoelectronic device, in particular the OLED according to the present invention can be fabricated by any means of vapor deposition and/or liquid processing.

Accordingly, at least one layer is prepared by means of a sublimation process, prepared by means of an organic vapor phase deposition process, prepared by means of a carrier gas sublimation process, solution processed or printed.

The methods used to fabricate the optoelectronic device, in particular the OLED according to the present invention are known in the art. The different layers are individually and successively deposited on a suitable substrate by means of subsequent deposition processes. The individual layers may be deposited using the same or differing deposition methods.

Vapor deposition processes, for example, comprise thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process, for example, comprise spin coating, dip coating and jet printing. Liquid processing may optionally be carried out in an inert atmosphere (e.g., in a nitrogen atmosphere) and the solvent may be completely or partially removed by means known in the state of the art.

EXAMPLES

General Synthesis Scheme I

General synthesis scheme I provides a synthesis scheme for organic molecules according to the invention wherein $R^{I}=R^{IV}$, $R^{II}=R^{III}$:

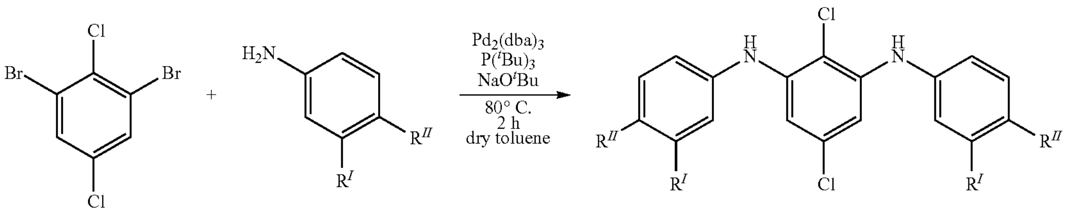

E1 I1

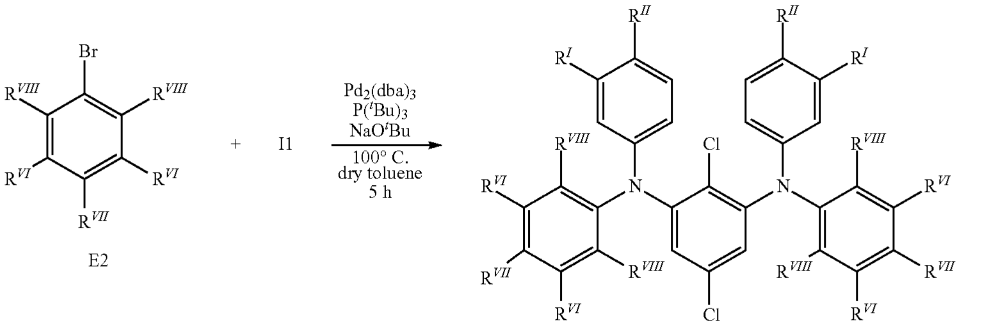

I2

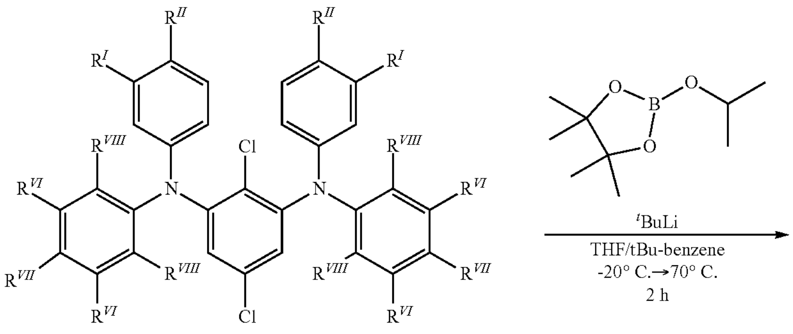

I2

-continued
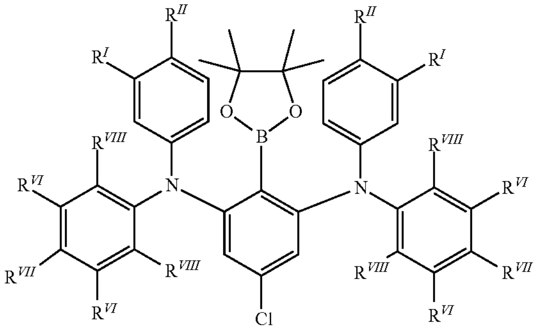
I3
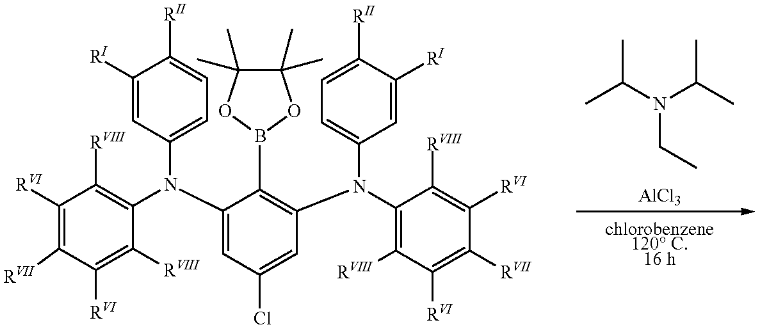
I3
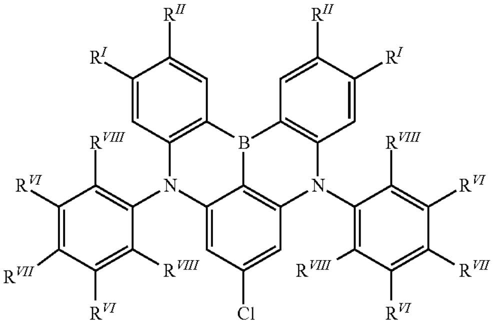
I4
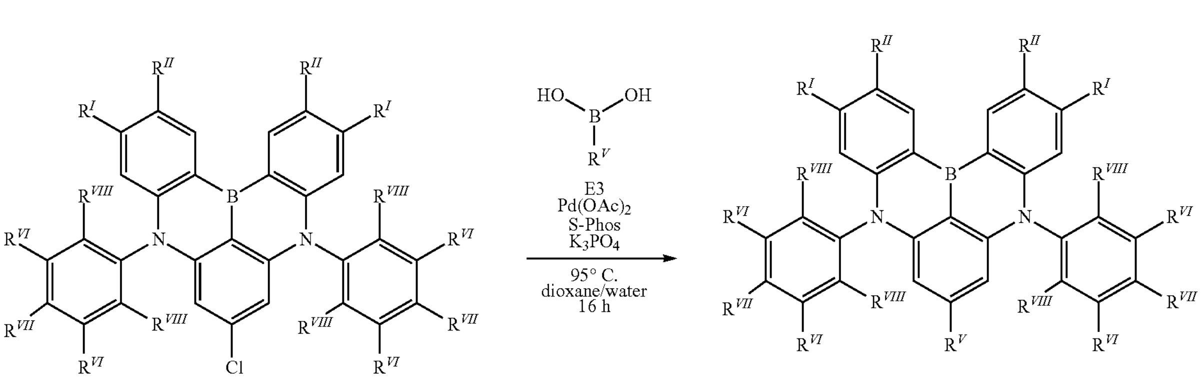
I4
P1

Alternative route to introduce $R^V$:

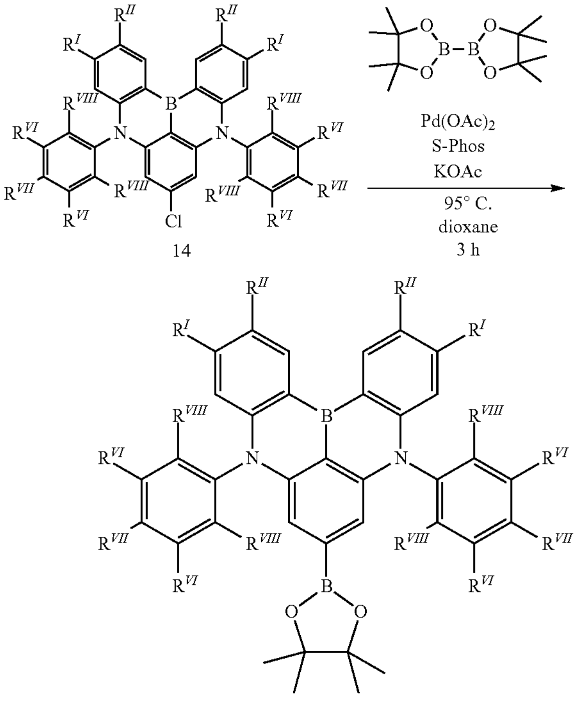

14

15

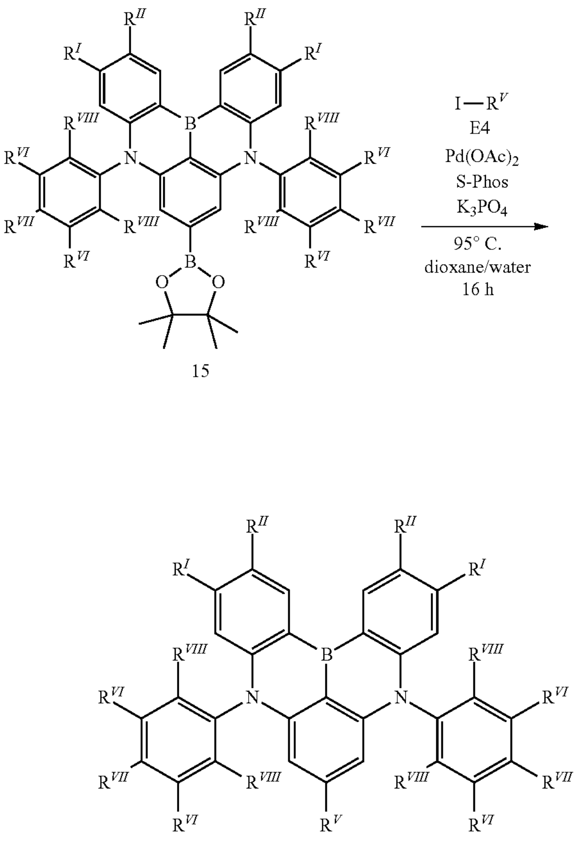

15

P1

General Procedure for Synthesis AAV1

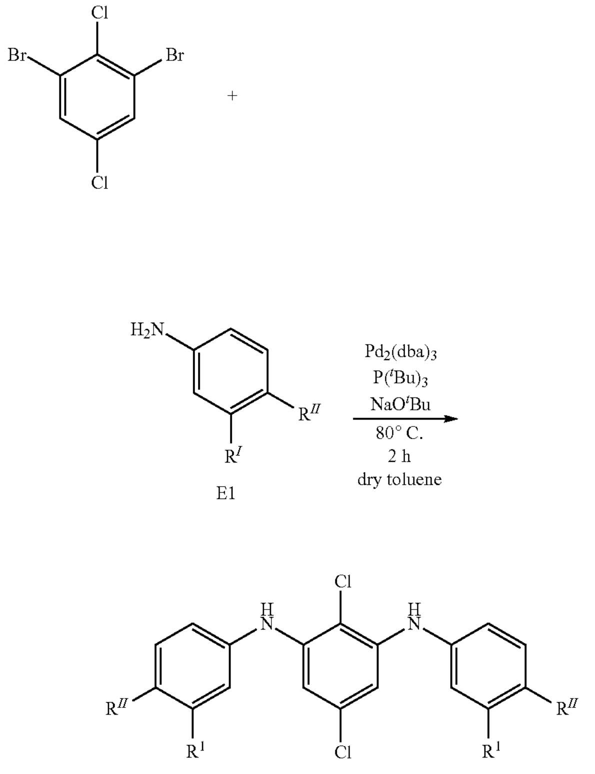

E1

I1

1,3-Dibromo-2,5-dichlorbenzene (CAS: 81067-41-6, 1.00 equivalents), E1 (2.20 equivalents), tris(dibenzylideneacetone)dipalladium $Pd_2(dba)_3$ (0.02 equivalents; CAS: 51364-51-3), tri-tert-butyl-phosphine ($P(^tBu)_3$, CAS: 13716-12-6, 0.08 equivalents) and sodium tert-butoxide ($NaO^tBu$; 6.00 equivalents) are stirred under nitrogen atmosphere in toluene at 80° C. for 2 h. After cooling down to room temperature (rt) the reaction mixture is extracted with toluene and brine and the phases are separated. The combined organic layers are dried over $MgSO_4$ and then the solvent is removed under reduced pressure. The crude product obtained is purified by recrystallization or column chromatography and I1 is obtained as solid.

General Procedure for Synthesis AAV2

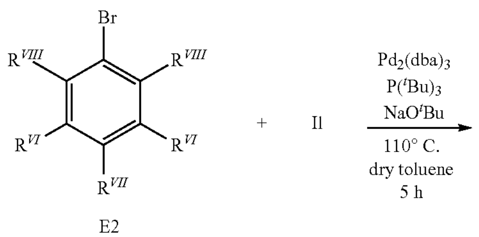

E2

-continued

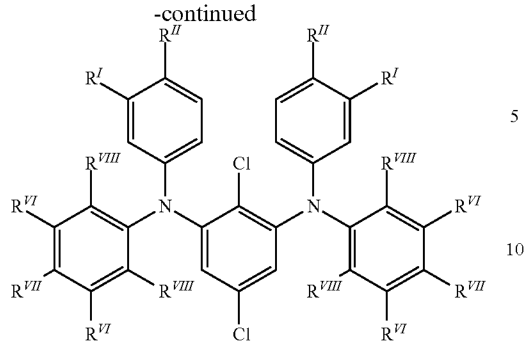

I2

I1 (1.00 equivalents), E2 (2.20 equivalents,, tris(dibenzylideneacetone)dipalladium $Pd_2(dba)_3$ (0.02 equivalents; CAS: 51364-51-3), tri-tert-butyl-phosphine (0.08 equivalents, $P(^tBu)_3$, CAS: 13716-12-6) and sodium tert-butoxide ($NaO^tBu$; 5.00 equivalents) are stirred under nitrogen atmosphere in toluene at 100° C. for 5 h. After cooling down to room temperature (rt) the reaction mixture is extracted with toluene and brine and the phases are separated. The combined organic layers are dried over $MgSO_4$ and then the solvent is removed under reduced pressure. The crude product obtained is purified by recrystallization or column chromatography and 12 is obtained as solid.

General Procedure for Synthesis AAV3

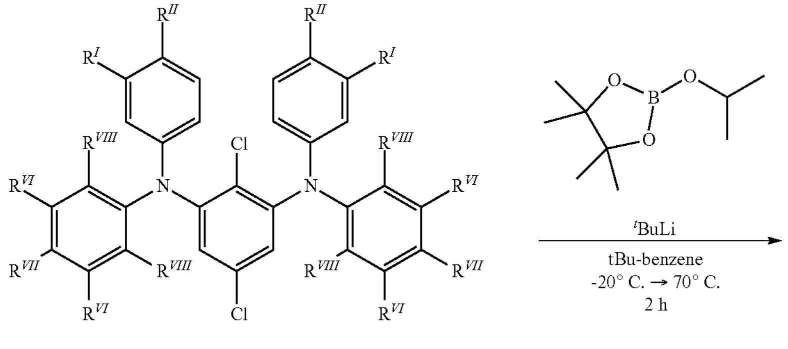

I2

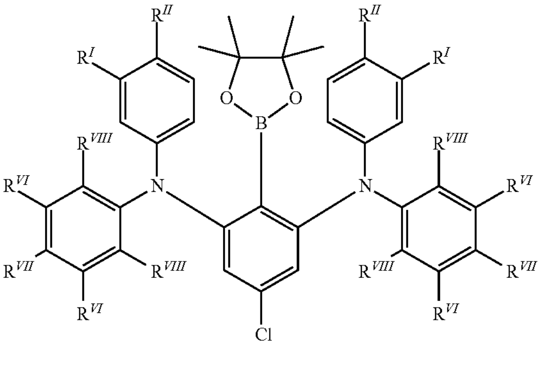

I3

After dissolving I2 (1 equivalent) under nitrogen atmosphere in THE and cooling to −20° C. or in tert-butylbenzene and cooling to −10° C., $^t$BuLi (2 equivalents, CAS: 594-19-4) is added and the reaction mixture is stirred at 0° C. After complete lithiation, 1,3,2-dioxaborolane (2 equivalents, CAS: 61676-62-8) is added and the reaction mixture is stirred under reflux at 70° C. for 2 h. After cooling down to room temperature (rt), the reaction mixture is extracted between toluene and brine and the phases are separated. The combined organic layers are dried over $MgSO_4$ and then the solvent is removed under reduced pressure. The crude product obtained is purified by recrystallization or column chromatography and I3 is obtained as solid.

General Procedure for Synthesis AAV3-a

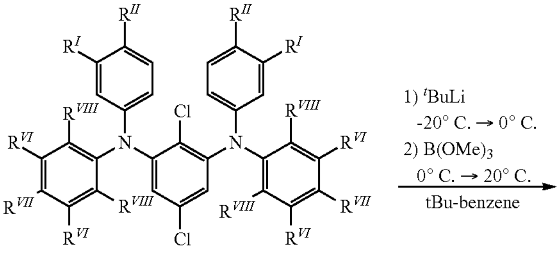

I2

-continued

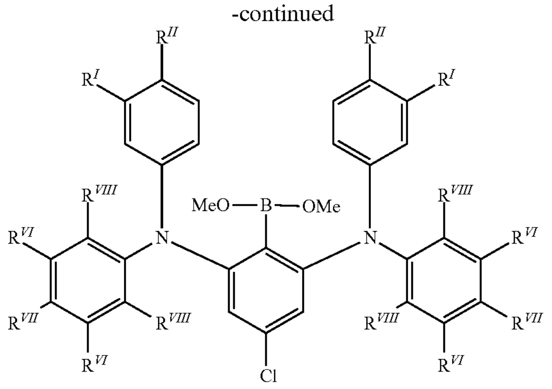

I3-a

Under nitrogen atmosphere I2 (1 equivalent) is dissolved in tert-butylbenzene. At −10° C., $^{t}$BuLi (2.2 equivalents, CAS: 594-19-4) is added and stirring continued at 0° C. After completion of the lithiation, at 0° C., trimethyl borate (6 equivalents, CAS: 121-43-7) is added and stirring continued at 20° C. for 2 h. After completion of the borylation, water is added and the resulting biphasic mixture vigorously stirred for 15 min. Subsequently, the phases are separated and the aqueous layer extracted with ethyl acetate. The combined organic layers are dried over $MgSO_4$, filtered and concentrated under reduced pressure. The crude product obtained is purified by recrystallization or column chromatography and I3-a is obtained as solid.

General Procedure for Synthesis AAV4

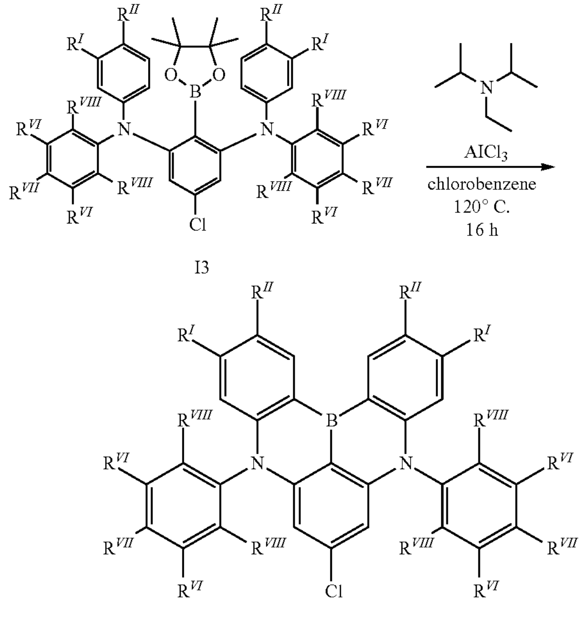

I3

I4

I3 (1 equivalent), N,N-diisopropylethylamine (10 equivalents, CAS: 7087-68-5) and AlCl3 (10 equivalents, CAS: 7446-70-0) are stirred under nitrogen atmosphere in chlorobenzene at 120° C. for 16 h. After cooling down to room temperature (rt) the reaction mixture is extracted between toluene and brine and the phases are separated.

The combined organic layers are dried over $MgSO_4$ and then the solvent is removed under reduced pressure. The crude product obtained is purified by recrystallization or column chromatography and I4 is obtained as solid.

General Procedure for Synthesis AAV4-a

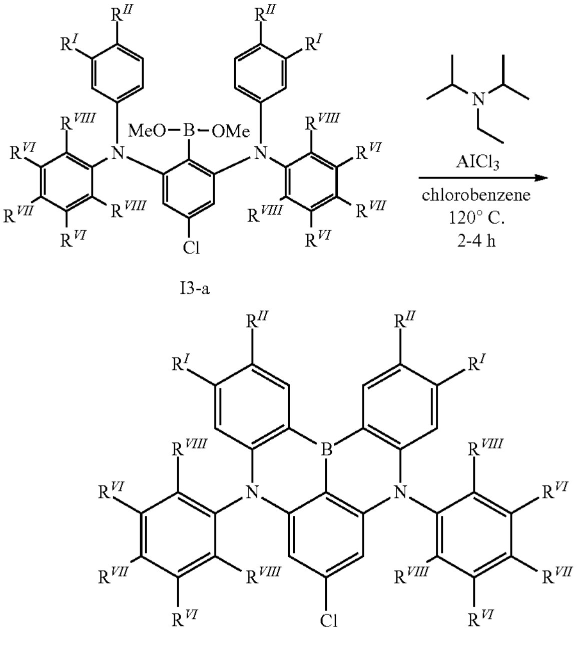

I3-a

I4

I3-a (1 equivalent), N,N-diisopropylethylamine (10 equivalents, CAS: 7087-68-5) and AlCl3 (10 equivalents, CAS: 7446-70-0) are stirred under nitrogen atmosphere in chlorobenzene at 120° C. for 2-4 h. After completion, the reaction is quenched by adding water at 0° C. Subsequently, the phases are separated and aqueous layer extracted with ethyl acetate. The combined organic layers are washed with water and brine, dried over $MgSO_4$, filtered and subsequently concentrated under reduced pressure. The crude product obtained is purified by recrystallization or column chromatography and I4 is obtained as solid.

General Procedure for Synthesis AAV5

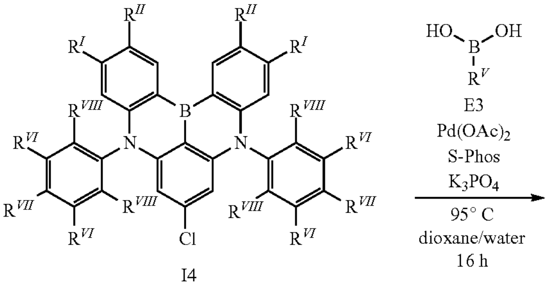

I4

-continued

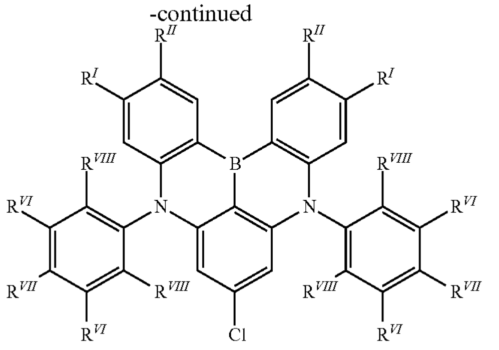

P1

I4 (1 equivalent), E3 (1.1 equivalents), palladium(II) acetate (CAS: 3375-31-3, 0.1 equivalents), S-Phos (CAS: 657408-07-6, 0.24 equivalents) and potassium phosphate tribasic (5 equivalents) are stirred under nitrogen atmosphere in dioxane/water 5:1 at 100° C. for 16 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and P1 is obtained as solid.

General Procedure for Synthesis AAV6

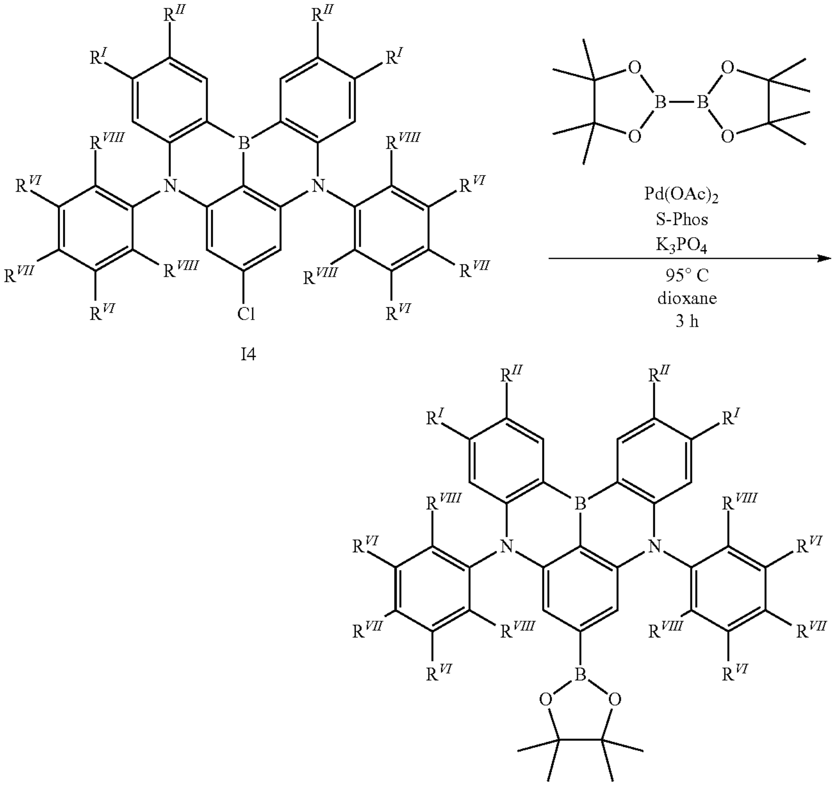

I4

I5

I4 (1 equivalent), bis(pinacolato)diboron (CAS: 73183-34-3, 1.5 equivalents), palladium(II) acetate (CAS: 3375-31-3, 0.1 equivalents), S-Phos (CAS: 657408-07-6, 0.2 equivalents,) and potassium phosphate tribasic ($K_3PO_4$; 5 equivalents) are stirred under nitrogen atmosphere in dioxane at 100° C. for 3 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I5 is obtained as solid.

General Procedure for Synthesis AAV7

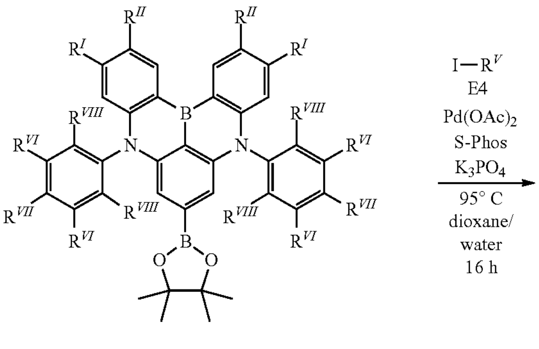

I5

-continued

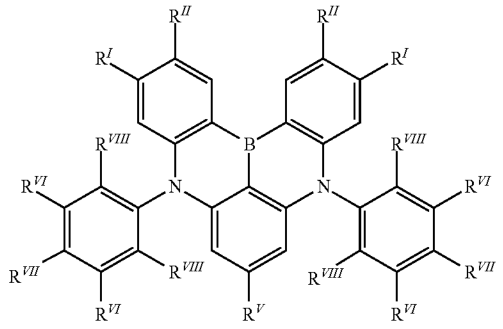

P1

I5 (1 equivalent), E4 (1.2 equivalents), palladium(II) acetate (CAS: 3375-31-3, 0.1 equivalents), S-Phos (CAS: 657408-07-6, 0.24 equivalents) and potassium phosphate tribasic ($K_3PO_4$; 5 equivalents) are stirred under nitrogen atmosphere in dioxane/water 10:1 at 100° C. for 16 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and P1 is obtained as solid.

General Synthesis Scheme II

General synthesis scheme II provides another synthesis scheme for organic molecules according to the invention, wherein $R^I$ =$R^{IV}$ and $R^{II}$=$R^{III}$.

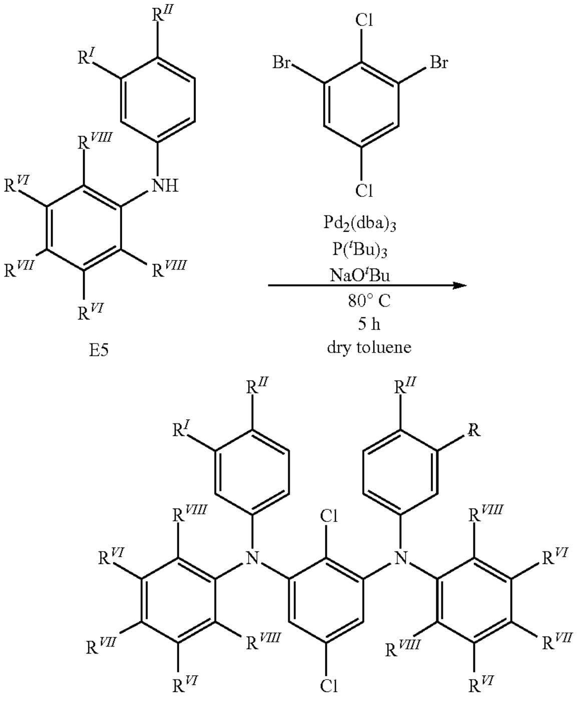

E5

I2

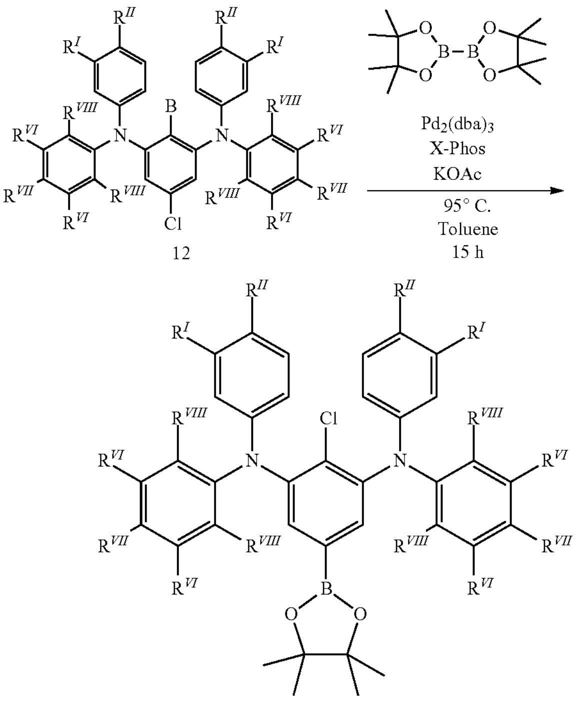

12

16

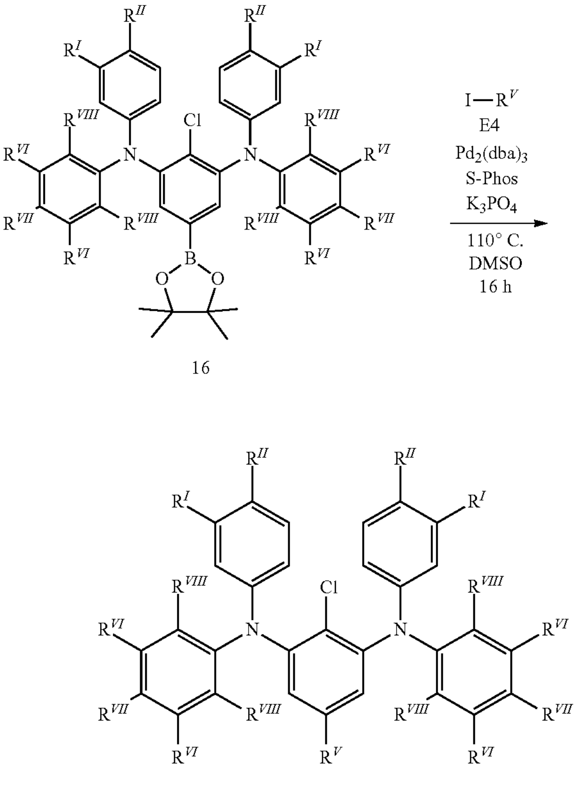

16

I7

-continued

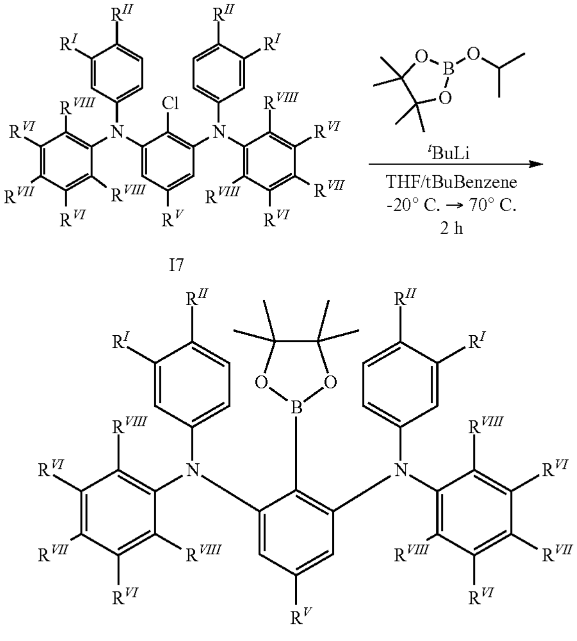

I7

I8

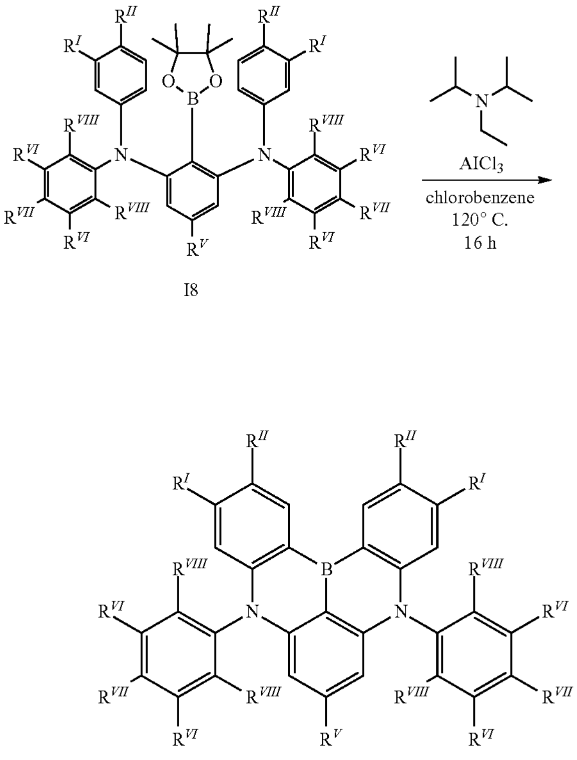

I8

P1

General Procedure for Synthesis AAV8

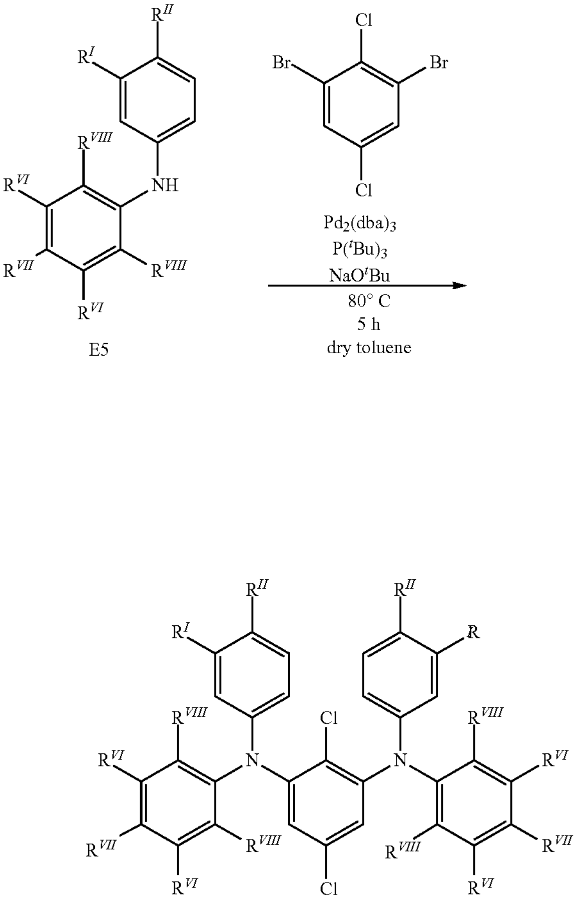

E5

I2

1,3-Dibromo-2,5-dichlorbenzene (CAS: 81067-41-6, 1.00 equivalents), E5 (2.10 equivalents), tris(dibenzylideneacetone)dipalladium $Pd_2(dba)_3$ (0.01 equivalents; CAS: 51364-51-3), tri-tert-butyl-phosphine ($P(^tBu)_3$, CAS: 13716-12-6, 0.02 equivalents) and sodium tert-butoxide ($NaO^tBu$; 3.00 equivalents) are stirred under nitrogen atmosphere in toluene at 80° C. for 8 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I2 is obtained as solid.

General Procedure for Synthesis AAV9

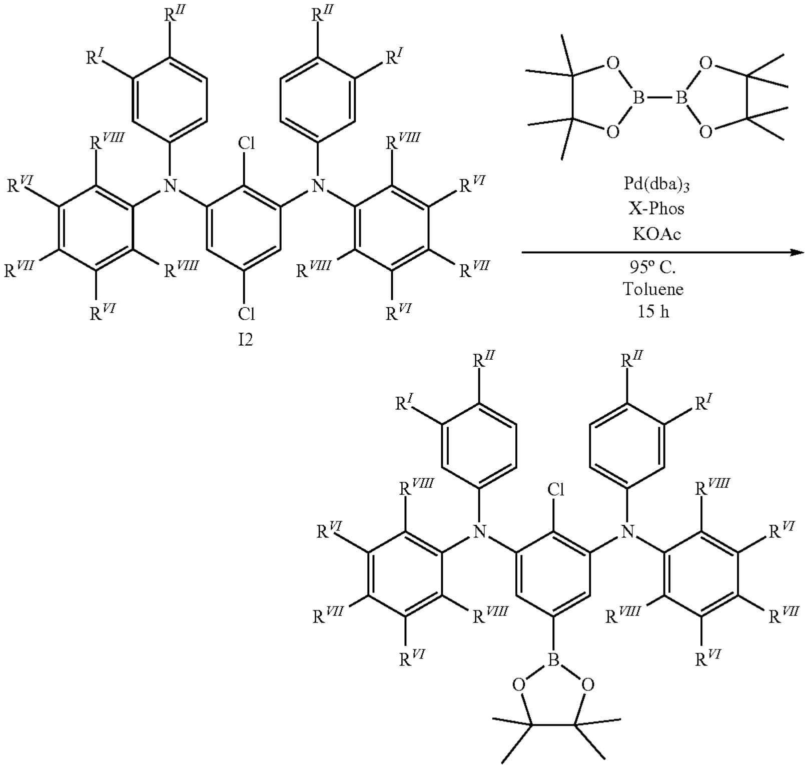

I2

I6

I2 (1 equivalent), bis(pinacolato)diboron (CAS: 73183-34-3, 1.5 equivalents), tris(dibenzylideneacetone)dipalladium $Pd_2(dba)_3$ (0.1 equivalents; CAS: 51364-51-3), X-Phos (CAS: 564483-18-7, 0.2 equivalents,) and potassium acetate (4.00 equivalents) are stirred under nitrogen atmosphere in toluene at 95° C. for 16 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I6 is obtained as solid.

General Procedure for Synthesis AAV10

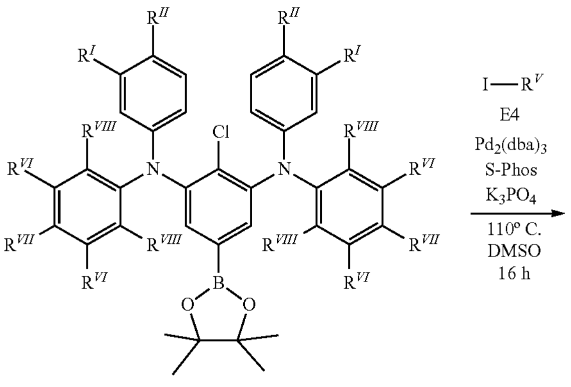

I6

-continued

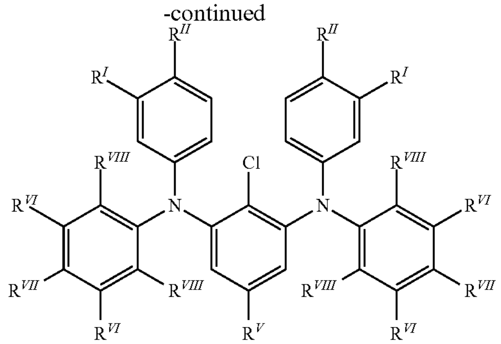

I7

I6 (1.00 equivalents), E4 (1.50 equivalents), tris(dibenzylideneacetone)dipalladium $Pd_2(dba)_3$ (0.04 equivalents; CAS: 51364-51-3), S-Phos (CAS: 657408-07-6, 0.08 equivalents) and potassium phosphate tribasic ($K_3PO_4$; 4.00 equivalents) are stirred under nitrogen atmosphere in DMSO at 110° C. for 16 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I7 is obtained as solid.

General Procedure for Synthesis AAV10-a

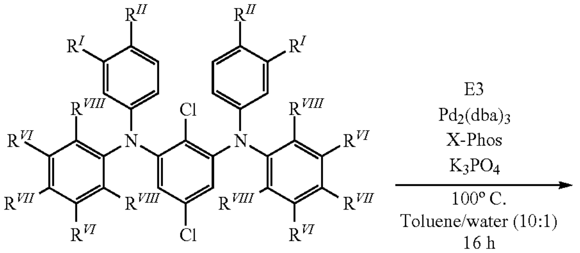

I2

-continued

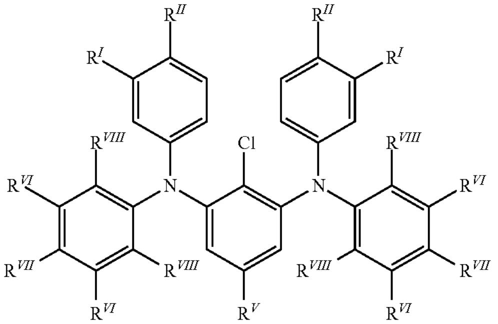
I7

Under nitrogen atmosphere, I2 (1 equivalent), the boronic acid E3 (1.5 equivalents), tris(dibenzylideneacetone)dipalladium $Pd_2(dba)_3$ (0.01 equivalents; CAS: 51364-51-3), X-Phos (CAS: 564483-18-7, 0.04 equivalents,) and tribasic potassium phosphate (3.00 equivalents) are stirred in toluene at 100° C. for 16 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I7 is obtained as solid.

General procedure for the synthesis AAV11:

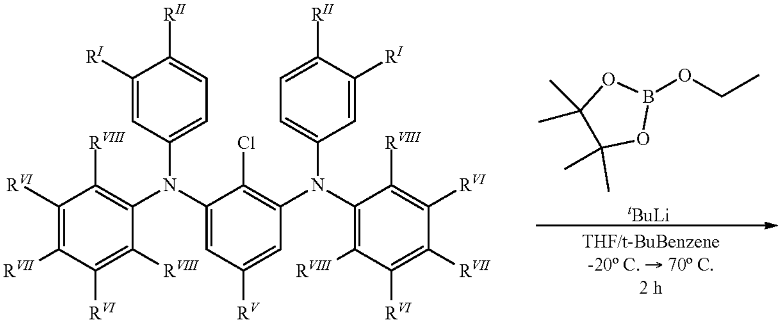

I7

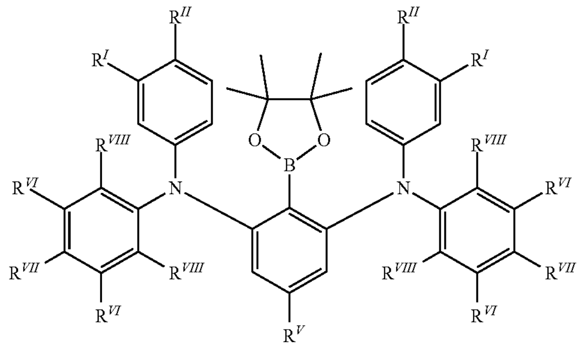
I8

After dissolving I7 (1 equivalent) under nitrogen atmosphere in THE and cooling to −20° C. or in tert-butylbenzene and cooling to −10° C., $^{t}$BuLi (2 equivalents, CAS: 594-19-4) is added and the reaction mixture is stirred at 0° C. After complete lithiation, the reaction is quenched and 1,3,2-dioxaborolane (2 equivalents, CAS: 61676-62-8) is added and the reaction mixture is stirred under reflux at 70° C. for 2 h. After cooling down to room temperature (rt), the reaction mixture is extracted between toluene and brine and the phases are separated. The combined organic layers are dried over $MgSO_4$ and then the solvent is removed under reduced pressure. The crude product obtained is purified by recrystallization or column chromatography and 18 is obtained as solid.

General Procedure for Synthesis AAV11-a

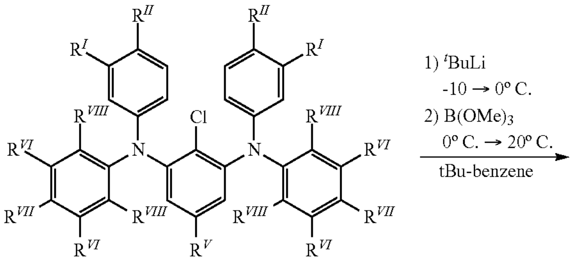

I7

-continued

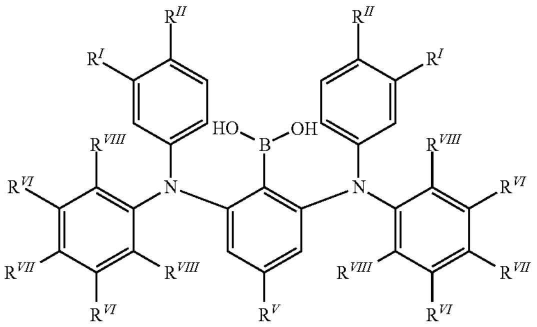

I8-a

Under nitrogen atmosphere I7 (1 equivalent) is dissolved in tert-butylbenzene. At −10° C., $^{t}$BuLi (2.2 equivalents, CAS: 594-19-4) is added and stirring continued at 0° C. After completion of the lithiation, at 0° C., trimethyl borate (6 equivalents, CAS: 121-43-7) is added and stirring continued at 20° C. for 2 h. After completion of the borylation, water is added and the resulting biphasic mixture vigorously stirred for 15 min. Subsequently, the phases are separated and the aqueous layer extracted with ethyl acetate. The combined organic layers are dried over $MgSO_4$, filtered and concentrated under reduced pressure. The crude product obtained is purified by recrystallization or column chromatography and I8-a is obtained as solid.

General Procedure for the Synthesis AAV12:

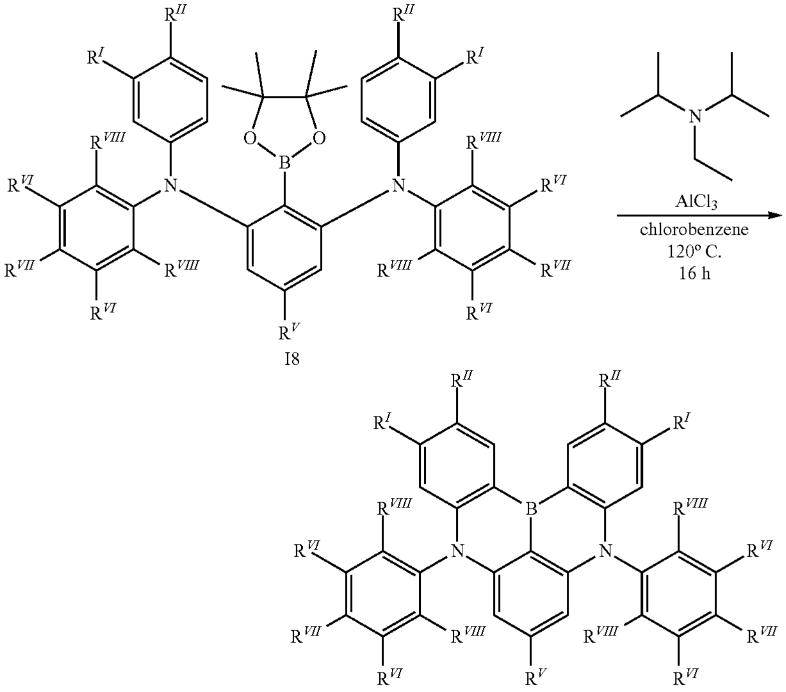

I8

P1

I8 (1 equivalent), N,N-diisopropylethylamine (10 equivalents, CAS: 7087-68-5) and AlCl3 (10 equivalents, CAS: 7446-70-0) are stirred under nitrogen atmosphere in chlorobenzene at 120° C. for 16 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and P1 is obtained as solid.

General Synthesis Scheme III

General synthesis scheme III provides a synthesis scheme for organic molecules according to the invention, where the limitations of scheme I and II (i.e. $R^{I}$=$R^{IV}$ and $R^{II}$=$R^{III}$) do not exist

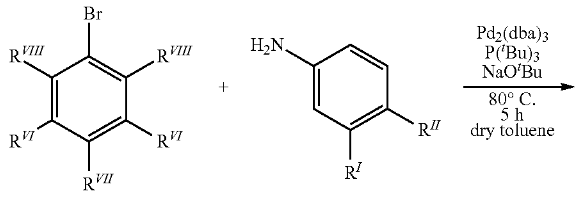

E2

E1

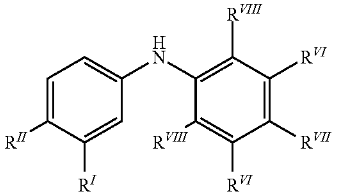

I4.1

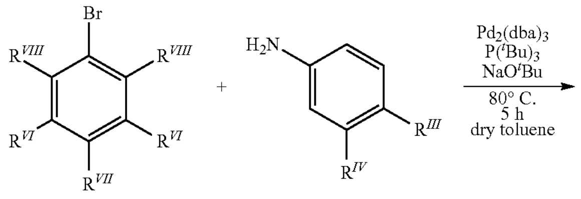

E2

E1.1

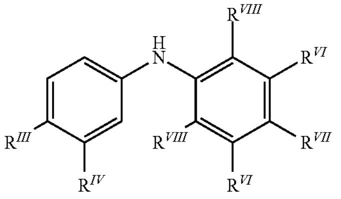

I4.2

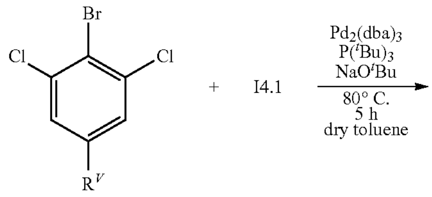

E6

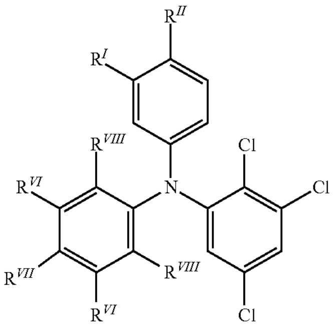

I9

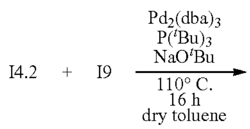

-continued

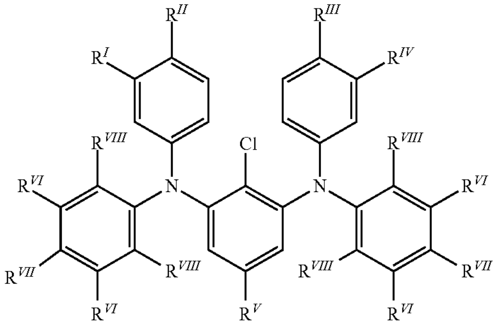

I10

General Procedure for Synthesis AAV13

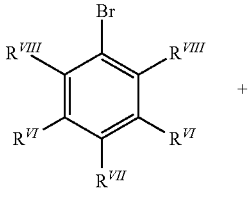

E2

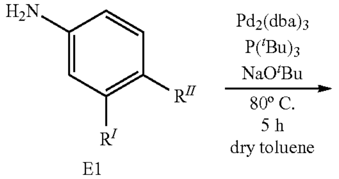

E1

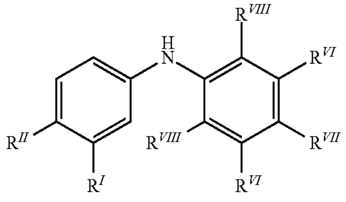

I4.1

1-Bromo-3,5-diphenylbenzene (1 equivalents, CAS: 103068-20-8), E1 (2.20 equivalents), tris(dibenzylideneacetone)dipalladium $Pd_2(dba)_3$ (0.01 equivalents; CAS: 51364-51-3), tri-tert-butyl-phosphine ($P(^tBu)_3$, CAS: 13716-12-6, 0.02 equivalents) and sodium tert-butoxide ($NaO^tBu$; 3.00 equivalents) are stirred under nitrogen atmosphere in toluene at 80° C. for 5 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I4.1 is obtained as solid.

General Procedure for Synthesis AAV14

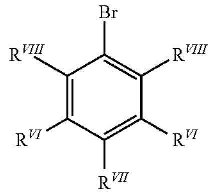

E2

+

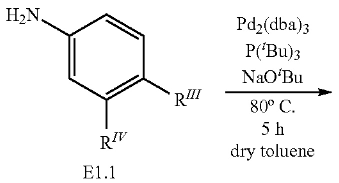

E1.1

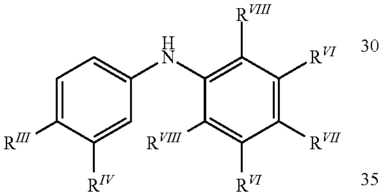

I4.2

1-Bromo-3,5-diphenylbenzene (1 equivalents, CAS: 103068-20-8), E1.1 (2.20 equivalents), tris(dibenzylideneacetone)dipalladium $Pd_2(dba)_3$ (0.02 equivalents; CAS: 51364-51-3), tri-tert-butyl-phosphine ($P(^tBu)_3$, CAS: 13716-12-6, 0.02 equivalents) and sodium tert-butoxide ($NaO^tBu$; 3.00 equivalents) are stirred under nitrogen atmosphere in toluene at 80° C. for 5 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I4.2 is obtained as solid.

General Procedure for Synthesis AAV15

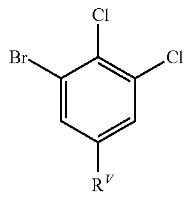

E6

+ I4.1

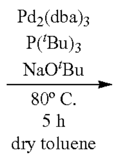

-continued

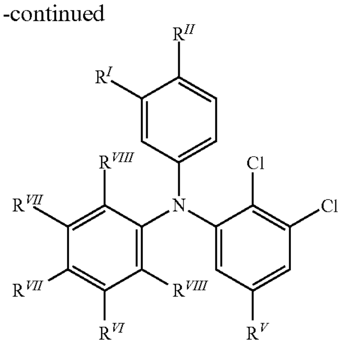

I9

E6 (1.00 equivalent), I4.1 (1.10 equivalents), tris(dibenzylideneacetone)dipalladium $Pd_2(dba)_3$ (0.01 equivalents, CAS: 51364-51-3), tri-tert-butyl-phosphine $P(^tBu)_3$ (0.02 equivalents, CAS: 13716-12-6) and sodium tert-butoxide $NaO^tBu$ (3.00 equivalents, CAS: 865-48-5) are stirred under nitrogen atmosphere in toluene at 80° C. for 5 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I9 is obtained as solid.

General Procedure for Synthesis AAV16

I4.2 + I9

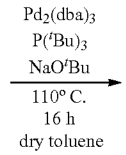

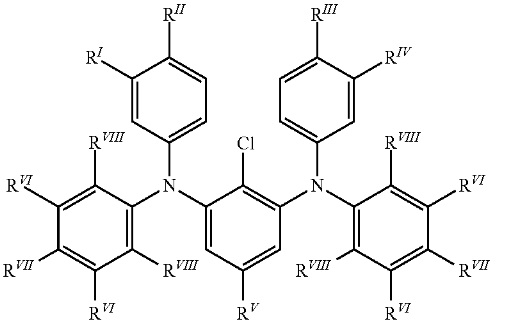

I10

I4.2 (1.00 equivalent), I9 (1.10 equivalents), tris(dibenzylideneacetone)dipalladium $Pd_2(dba)_3$ (0.01 equivalents; CAS: 51364-51-3), tri-tert-butyl-phosphine $P(^tBu)_3$ (0.02 equivalents, CAS: 13716-12-6) and sodium tert-butoxide $NaO^tBu$ (3.00 equivalents, CAS: 865-48-5) are stirred under nitrogen atmosphere in toluene at 110° C. for 16 h. After cooling down to room temperature (rt) the reaction mixture is extracted between toluene and brine and the phases are separated. The combined organic layers are dried over $MgSO_4$ and then the solvent is removed under reduced pressure. The crude product obtained is purified by recrystallization or column chromatography and I10 is obtained as solid.

The last synthesis steps of the general scheme III from I10 to P1 is carried out under similar conditions as described in AAV11 and AAV12.

General Synthesis Scheme IV

General Synthesis Scheme IV:

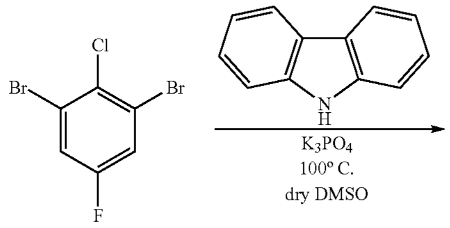

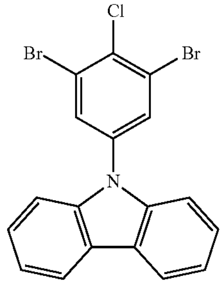

A-1a

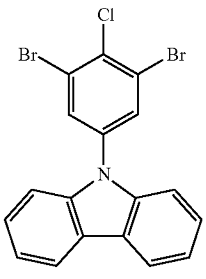

A-1a

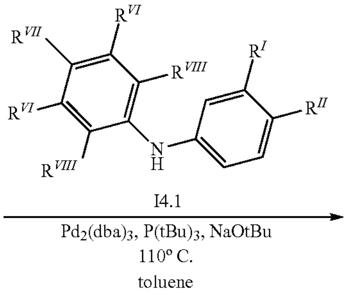

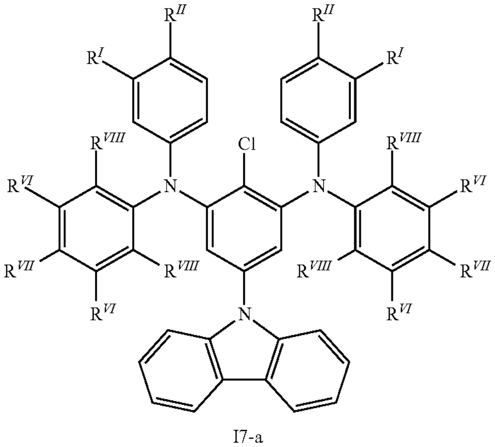

I7-a

General Procedure for Synthesis AAV17

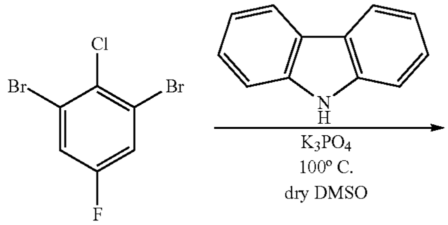

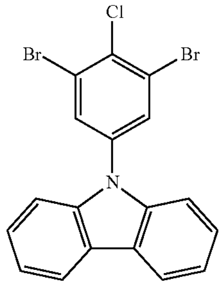

A-1a

Under $N_2$ atmosphere, a two-necked flask is charged with 1-chloro-2,6-dibromo-4-fluorobenzene [179897-90-6](1.0 equiv.), potassium triphosphate [7778-53-2](3 equiv.) and the corresponding carbazole derivative (1.05 equiv.). Dry DMSO (4 mL/mmol aryl fluoride) is added and the resulting suspension heated at 100° C. overnight. After cooling down to rt, the mixture is poured into a beaker of water (400 mL). The precipitate is filtered off and abundantly washed with water, followed by ethanol. The filter cake is collected and purified by recrystallization, yielding the desired product A-1a as a solid.

General Procedure for Synthesis AAV18

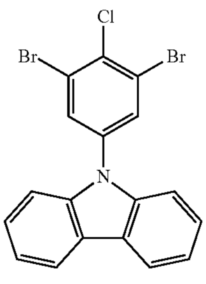

A-1a

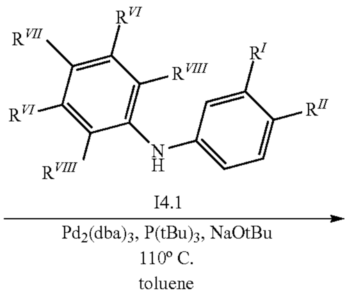

-continued

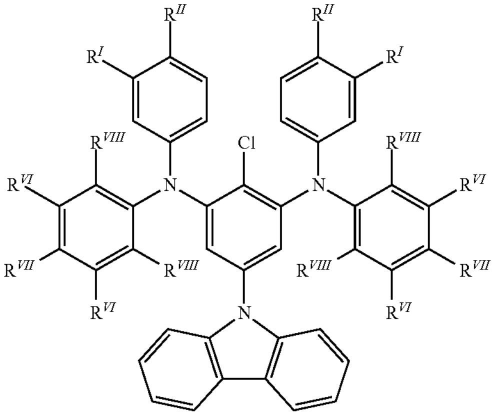

I7-a

Under $N_2$ atmosphere, a two-necked flask is charged with a 1,3-dibromo-2-chlorobenzene derivative A-1a (1.0 equiv.), a diarylamine derivative I4.1 (2.2 equiv.), $Pd_2(dba)_3$ [51364-51-3](0.02 equiv.) and sodium tert-butoxide [865-48-5](3.3 equiv.). Dry toluene (10 mL/mmol P-1.1a) and tri-tert-butylphosphine [13716-12-6](0.08 equiv.) are added and the resulting suspension degassed for 10 min. Subsequently, the mixture is heated at 110° C. overnight. After cooling down to room temperature (rt), ethyl acetate and water are added, the phases separated, the aqueous layer extracted with ethyl acetate and the combined organic layers dried over $MgSO_4$, filtered and concentrated. The crude product is purified with MPLC or recrystallization to obtain the corresponding product I7-a as a solid.

The last synthesis steps of the general scheme IV from 17-a to P1 is carried out under similar conditions as described in AAV11-a and AAV4-a.

General Synthesis Scheme V

General synthesis scheme V provides another synthesis scheme for organic molecules according to the invention, wherein $R^{II}=R^{VII}$.

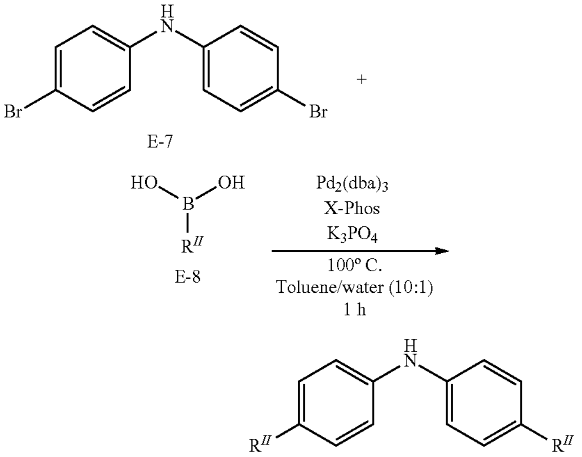

E-7

E-8

I-11

-continued

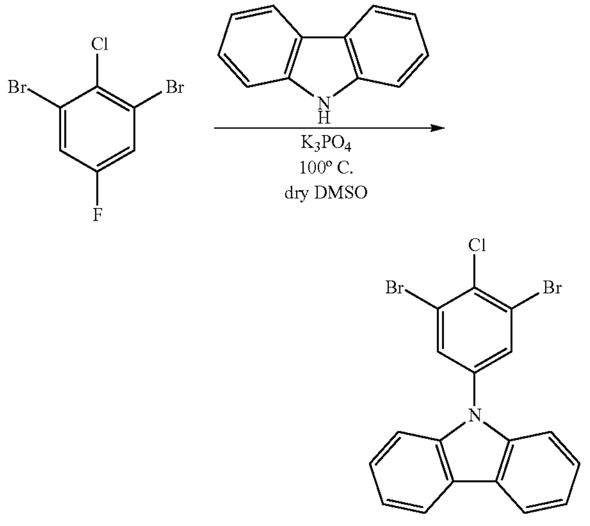

A-1a

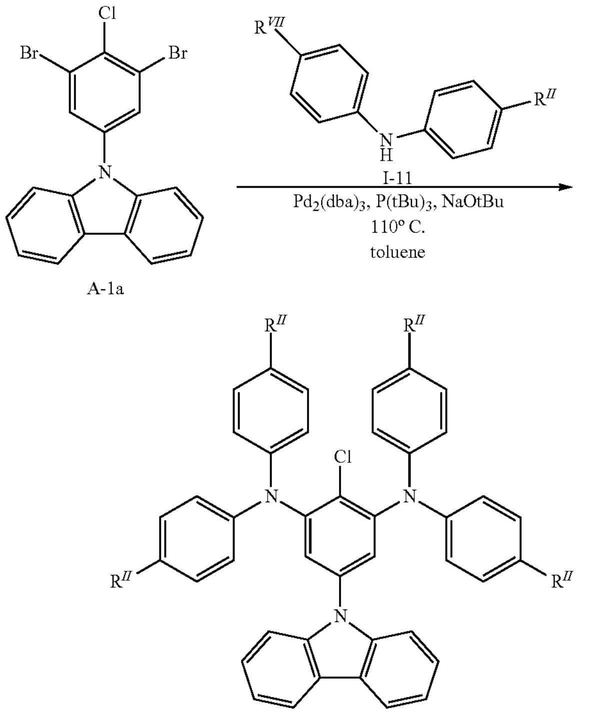

A-1a

I7-a

General Procedure for Synthesis AAV19

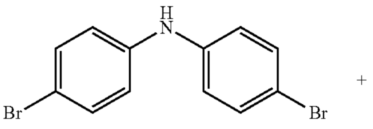

E-7

-continued

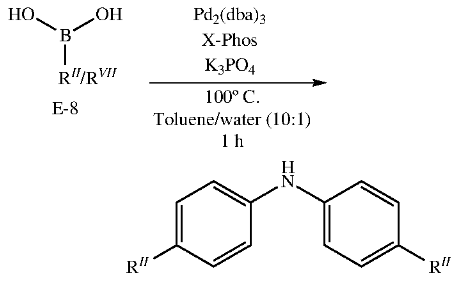

E-8

I-11

Under nitrogen atmosphere bis(4-bromophenyl)amine (E-7) (1.0 equivalent, CAS-no. 16292-17-4), o-Tolylboronic acid (E-8) (2.2 equivalents, CAS-no. 16419-60-6), Tris (dibenzylideneacetone)-dipalladium(0) (0.04 equivalents, CAS-no. 51364-51-3), 2-dicyclohexylphosphino-2', 4', 6'-tri-isopropyl-1,1'-biphenyl (0.02 equivalents, X-Phos, CAS-no. 564483-18-7) and tribasic potassium phosphate (3.0 equivalents, CAS-no. 7778-53-2) were suspended in toluene/water (10:1 by volume). The mixture was heated at 100° C. for 1 h. After cooling down to room temperature, the phases were separated and the organic aqueous extracted with ethyl acetate. The combined organic layers were stirred at rt for 15 min with a 1:1:1 mixture of charcoal/celite© (kieselgur)/$MgSO_4$, filtered and concentrated. The crude was purified by recrystallization from ethanol to yield the desired secondary amine (I-II) with 87% yield.

The last synthesis steps of the general scheme V are carried out under similar conditions as described in general synthesis scheme IV.

Cyclic Voltammetry

Cyclic voltammograms are measured from solutions having concentration of $10^{-3}$ mol/L of the organic molecules in dichloromethane or a suitable solvent and a suitable supporting electrolyte (e.g. 0.1 mol/L of tetrabutylammonium hexafluorophosphate).

The measurements are conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against a saturated calomel electrode (SCE).

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration are used. The Turbomole program package is used for all calculations.

Photophysical Measurements

Sample pretreatment: Spin-coating

Apparatus: Spin 150, SPS euro.

The sample concentration is 10 mg/ml, dissolved in a suitable solvent.

Program: 1) 3 s at 400 U/min; 20 s at 1000 U/min at 1000 Upm/s. 3) 10 s at 4000 U/min at 1000 Upm/s. After coating, the films are dried at 70° C. for 1 min.

Photoluminescence Spectroscopy and Time-Correlated Single-Photon Counting (TCSPC)

Steady-state emission spectroscopy is measured by a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1.1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) is done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields CD in % and CIE coordinates as x,y values.

PLQY is determined using the following protocol:

1) Quality assurance: Anthracene in ethanol (known concentration) is used as reference
2) Excitation wavelength: the absorption maximum of the organic molecule is determined and the molecule is excited using this wavelength
3) Measurement Quantum yields are measured, for sample, of solutions or films under nitrogen atmosphere. The yield is calculated using the equation:

$$\Phi_{PL} = \frac{n_{photon}, \text{ emited}}{n_{photon}, \text{ absorbed}} = \frac{\int \frac{\lambda}{hc}\left[\text{Int}_{emitted}^{sample}(\lambda) - Int_{absorbed}^{sample}(\lambda)\right]d\lambda}{\int \frac{\lambda}{hc}\left[\text{Int}_{emitted}^{reference}(\lambda) - Int_{absorbed}^{reference}(\lambda)\right]d\lambda}$$

wherein $n_{photon}$ denotes the photon count and Int. the intensity.

Production and Characterization of Optoelectronic Devices

Optoelectronic devices, in particular OLED devices, comprising organic molecules according to the invention can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT95 to the time point, at which the measured luminance decreased to 95% of the initial luminance, etc.

Accelerated lifetime measurements are performed (e.g. applying increased current densities). For example, LT80 values at 500 cd/$m^2$ are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given.

HPLC-MS

HPLC-MS analysis is performed on an HPLC byAgilent (1100 series) with MS-detector (Thermo LTQ XL).

Exemplarily a typical HPLC method is as follows: a reverse phase column 4.6 mm×150 mm, particle size 3.5 μm from Agilent (ZORBAX Eclipse Plus 95 Å C18, 4.6×150 mm, 3.5 μm HPLC column) is used in the HPLC. The HPLC-MS measurements are performed at room temperature (rt) following gradients

| Flow rate [ml/min] | Time [min] | A [%] | B [%] | C [%] |
|---|---|---|---|---|
| 2.5 | 0 | 40 | 50 | 10 |
| 2.5 | 5 | 40 | 50 | 10 |
| 2.5 | 25 | 10 | 20 | 70 |
| 2.5 | 35 | 10 | 20 | 70 |
| 2.5 | 35.01 | 40 | 50 | 10 |
| 2.5 | 40.01 | 40 | 50 | 10 |
| 2.5 | 41.01 | 40 | 50 | 10 |

using the following solvent mixtures:

| | | |
|---|---|---|
| Solvent A: | $H_2O$ (90%) | MeCN (10%) |
| Solvent B: | $H_2O$ (10%) | MeCN (90%) |
| Solvent C: | THF (50%) | MeCN (50%) |

An injection volume of 5 μL from a solution with a concentration of 0.5 mg/mL of the analyte is taken for the measurements.

Ionization of the probe is performed using an atmospheric pressure chemical ionization (APCI) source either in positive (APCI+) or negative (APCI−) ionization mode.

Concentration Dependent Spectral Purity

The organic molecules described herein in particular comprise severely decreased tendency to form intermolecular aggregates which are known to cause broadening of the photo luminescence (PL) spectra in doped films with increasing concentration. A measure of this spectral broadening in doped films (e.g. spin coated thin films containing 1 wt % or more of the organic molecule in PMMA matrix) with increasing concentration is the Concentration Dependent Spectral Purity (CDSP) value.

The CDSP is represented by the following relation:

$$CDSP = (\lambda_{max} * CIEy)/c$$

wherein $\lambda_{max}$ is the maximum of the PL spectrum of a given organic molecule in nm, CIEy is the CIEy coordinate (Comission Internationale de I'Eclairage) derived from the PL spectrum of the organic molecule and c is the concentration of the organic molecule by weight in % in doped film.

The CDSP can be interpreted as follows:

If two different organic molecules have a comparable $\lambda_{max}$ in doped films of the same concentration, the one with a lower CDSP is preferred in terms of spectral purity. Especially the difference |ΔCDSP| between two concentrations provides an indication whether a material shows a high tendency to aggregate or not: the smaller the ΔCDSP value, the lower the aggregation tendency of a material.

Comparable values are especially obtained for concentrations c≥2 wt %.

Example 1

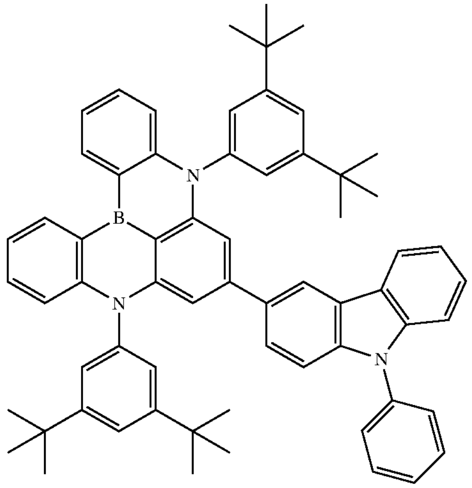 [SMILES: CC(C)(C)c1cc(N2c3ccccc3B3c4ccccc4N(c4cc(C(C)(C)C)cc(C(C)(C)C)c4)c4cc(-c5ccc6c(c5)c5ccccc5n6-c5ccccc5)cc2c43)cc(C(C)(C)C)c1]

Example 1 was synthesized according to

AAV1 (75% yield), wherein aniline (CAS: 62-53-3, 2.1 equivalents) was used as reactant E1;

AAV2 (69% yield), wherein 1-bromo-3,5-ditert-butylbenzene (2.20 equivalents, CAS: 22385-77-9) was used as reactant E2;

AAV3 (67% yield);

AAV4 (75% yield) and

AAV5 (70% yield) wherein (9-phenyl-9H-carbazol-3-yl) boronic acid (1.3 equivalents, CAS: 854952-58-2) was used as reactant E3.

MS (HPLC-MS), m/z (retention time): 886.80 (10.81 min).

The emission maximum of example 1 (5% by weight in PMMA) is at 463 nm, the full width at half maximum (FWHM) is 0.15 eV, the CIEy coordinate is 0.11 and the CIEx coordinate is 0.13. The PLQY is 78%.

Example 2

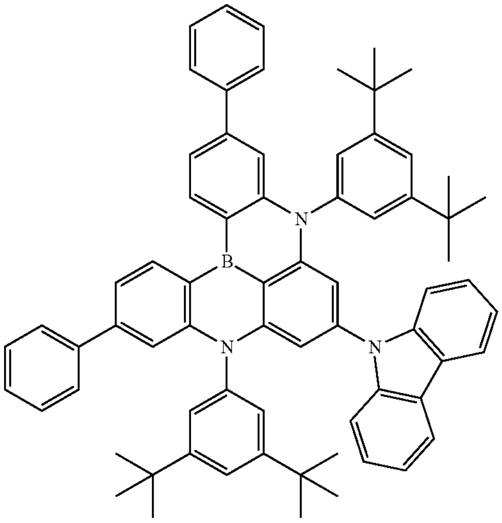 [SMILES: CC(C)(C)c1cc(N2c3cc(-c4ccccc4)ccc3B3c4ccc(-c5ccccc5)cc4N(c4cc(C(C)(C)C)cc(C(C)(C)C)c4)c4cc(-n5c6ccccc6c6ccccc65)cc2c43)cc(C(C)(C)C)c1]

Example 2 was synthesized according to
AAV17 (78% yield)
AAV13/AAV14 (66% yield);
AAV18 (29% yield);
AAV11-a (46% yield) replacing I7 with I7-a and
AAV4a (14% yield).
MS (HPLC-MS), m/z (retention time): 963 (15.55 min).

The emission maximum of example 2 (5% by weight in PMMA) is at 468 nm, the full width at half maximum (FWHM) is 0.18 eV, the CIEy coordinate is 0.17. The photoluminescence quantum yield (PLQY) is 66%.

Example 3

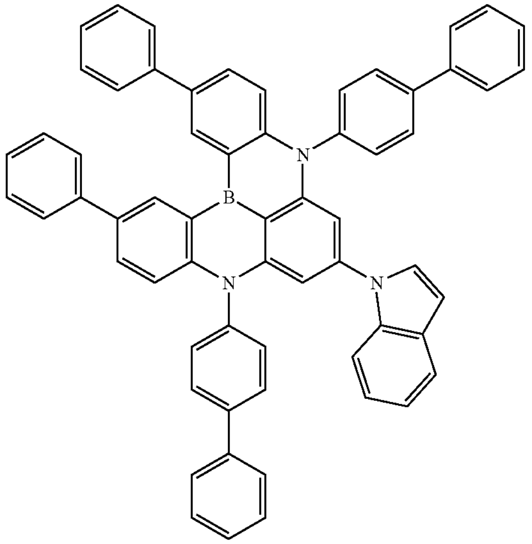 [SMILES: c1ccc(-c2ccc(N3c4ccc(-c5ccccc5)cc4B4c5cc(-c6ccccc6)ccc5N(c5ccc(-c6ccccc6)cc5)c5cc(-n6ccc7ccccc76)cc3c54)cc2)cc1]

Example 3 was synthesized according to
AAV17 (58% yield) replacing carbazole with indole [120-72-9]
AAV18 (52% yield) using Bisphenylamine [102113-98-4];
AAV11-a (43% yield) replacing I7 with 17-a and
AAV4a (5.7% yield).
MS (HPLC-MS), m/z (retention time): 840.60 (6.84 min)

The emission maximum of example 3 (1% by weight in PMMA) is at 457 nm, the full width at half maximum (FWHM) is 0.15 eV, the CIEy coordinate is 0.07. The photoluminescence quantum yield (PLQY) is 92%.

Example 4

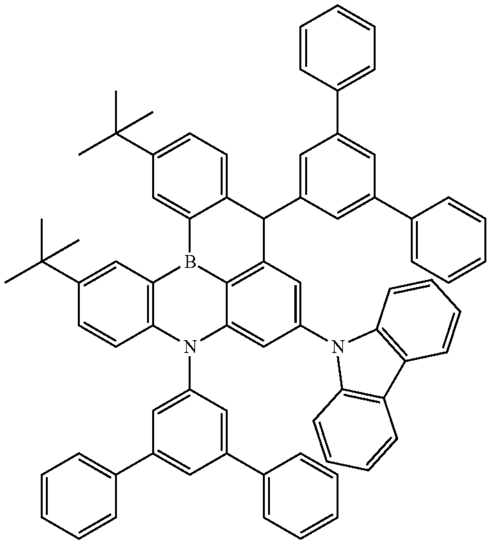 [SMILES: CC(C)(C)c1ccc2c(c1)B1c3cc(C(C)(C)C)ccc3N(c3cc(-c4ccccc4)cc(-c4ccccc4)c3)c3cc(-n4c5ccccc5c5ccccc54)cc(c31)C2c1cc(-c2ccccc2)cc(-c2ccccc2)c1]

Example 4 was synthesized according to
AAV17 (78% yield)
AAV131 AAV14 (65% yield);
AAV18 (69% yield);
AAV11-a (83% yield) replacing I7 with I7-a and
AAV4a (7% yield).
MS (HPLC-MS), m/z (retention time): 1002.80 (8.40 min)

The emission maximum of example 4 (5% by weight in PMMA) is at 451 nm, the full width at half maximum (FWHM) is 0.15 eV, the CIEy coordinate is 0.06. The photoluminescence quantum yield (PLQY) is 62%.

Example 5

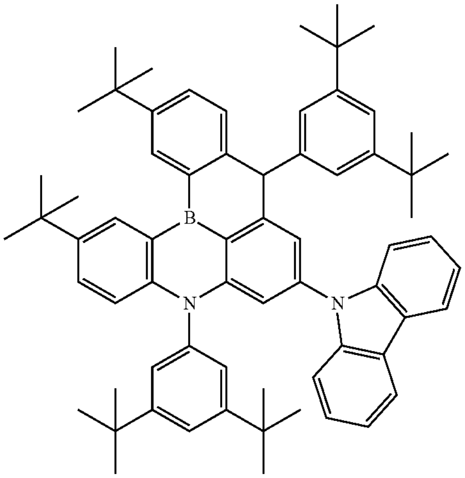 [SMILES: CC(C)(C)c1cc(C2c3ccc(C(C)(C)C)cc3B3c4cc(C(C)(C)C)ccc4N(c4cc(C(C)(C)C)cc(C(C)(C)C)c4)c4cc(-n5c6ccccc6c6ccccc65)cc2c43)cc(C(C)(C)C)c1]

Example 5 was synthesized according to

AAV17 (78% yield)

AAV18 (80% yield) using 4-ter-butyl-n-(3,5-di-tert-butylphenyl)benzenamine [1352756-38-7];

AAV11-a (84% yield) replacing I7 with I7-a and

AAV4a (10% yield).

MS (HPLC-MS), m/z (retention time): m/z (retention time): 948 (8.8 min).

The emission maximum of example 5 (2% by weight in PMMA) is at 451 nm, the full width at half maximum (FWHM) is 0.14 eV, the CIEy coordinate is 0.05. The photoluminescence quantum yield (PLQY) is 76%.

Example 6

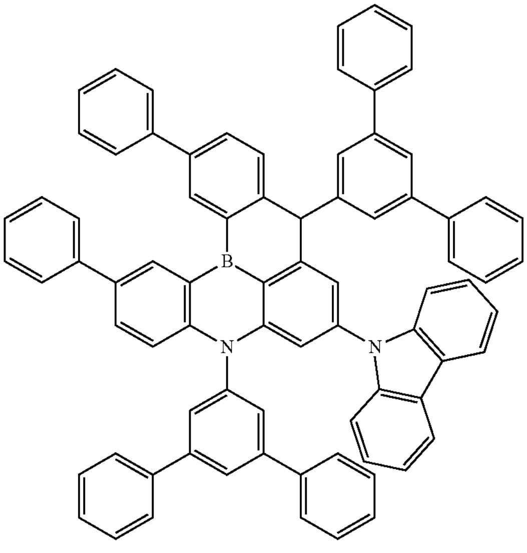 [SMILES: c1ccc(-c2cc(-c3ccccc3)cc(C3c4ccc(-c5ccccc5)cc4B4c5cc(-c6ccccc6)ccc5N(c5cc(-c6ccccc6)cc(-c6ccccc6)c5)c5cc(-n6c7ccccc7c7ccccc76)cc3c54)c2)cc1]

Example 6 was synthesized according to

AAV17 (78% yield)

AAV13/14 (91%) reacting 4-Bromobiphenyl [92-66-0] with 3,5-diphenylaniline [63006-66-6];

AAV18 (97% yield);

AAV11-a (47% yield) replacing I7 with I7-a and

AAV4a (16% yield).

MS (HPLC-MS), m/z (retention time): not detectable (8.00 min)

The emission maximum of example 6 (2% by weight in PMMA) is at 451 nm, the full width at half maximum (FWHM) is 0.14 eV, the CIEy coordinate is 0.05. The photoluminescence quantum yield (PLQY) is 76%.

Example 7

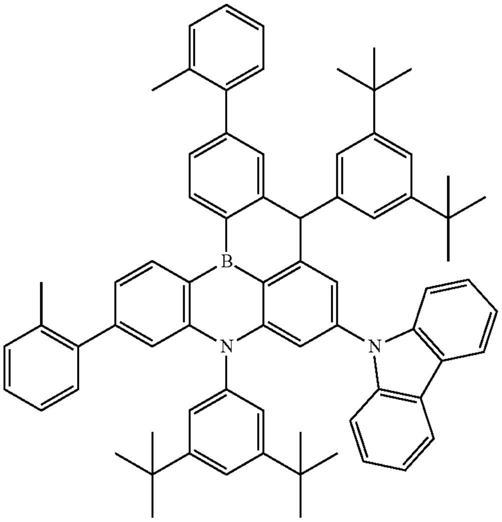 [SMILES: Cc1ccccc1-c1ccc2c(c1)C(c1cc(C(C)(C)C)cc(C(C)(C)C)c1)c1cc(-n3c4ccccc4c4ccccc43)cc3c1B2c1ccc(-c2ccccc2C)cc1N3c1cc(C(C)(C)C)cc(C(C)(C)C)c1]

Example 7 was synthesized according to

AAV17 (78% yield)

AAV1 (54%) using 2'-Methyl[1,1'-biphenyl]-3-amine [400745-54-2] as amine E1;

AAV2 (88% yield) using 1-Bromo-3,5-di-tert-butylbenzene (CAS-no. 22385-77-9) as bromide E2;

AAV11-a (42% yield) replacing I7 with I7-a and

AAV4a (14% yield).

MS (HPLC-MS), m/z (retention time): 990.1 (8.68 min).

The emission maximum of example 7 (2% by weight in PMMA) is at 461 nm, the full width at half maximum (FWHM) is 0.21 eV, the CIEy coordinate is 0.11. The photoluminescence quantum yield (PLQY) is 80%.

Example 8

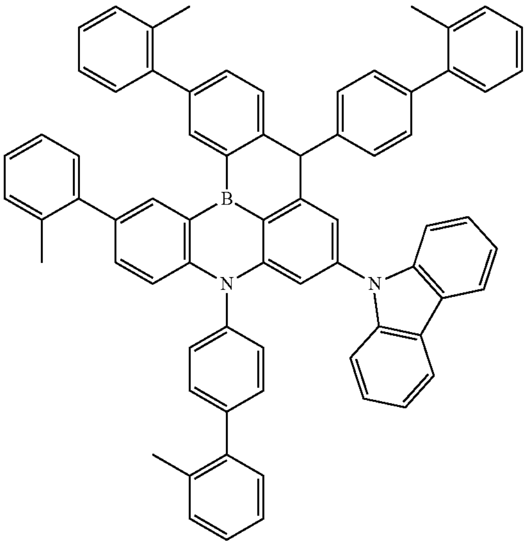 [SMILES: Cc1ccccc1-c1ccc(C2c3ccc(-c4ccccc4C)cc3B3c4cc(-c5ccccc5C)ccc4N(c4ccc(-c5ccccc5C)cc4)c4cc(-n5c6ccccc6c6ccccc65)cc2c43)cc1]

Example 8 was synthesized according to

AAV17 (78% yield)

AAV21 (87% yield);

AAV18 (86% yield);

AAV11-a (79% yield) replacing I7 with I7-a and AAV4a (33% yield).

MS (HPLC-MS), m/z (retention time): 963 (15.55 min).

The emission maximum of example 8 (2% by weight in PMMA) is at 454 nm, the full width at half maximum (FWHM) is 0.15 eV, the CIEy coordinate is 0.15. The photoluminescence quantum yield (PLQY) is 85%.

Example 9

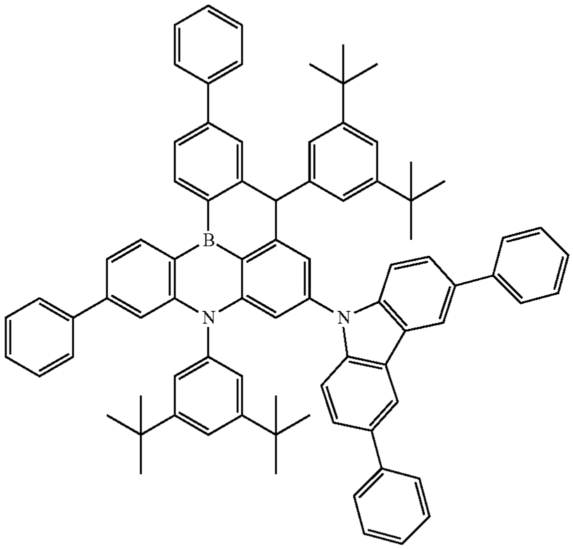 [SMILES: CC(C)(C)c1cc(C2c3cc(-c4ccccc4)ccc3B3c4ccc(-c5ccccc5)cc4N(c4cc(C(C)(C)C)cc(C(C)(C)C)c4)c4cc(-n5c6ccc(-c7ccccc7)cc6c6cc(-c7ccccc7)ccc65)cc2c43)cc(C(C)(C)C)c1]

The emission maximum of example 9 (1% by weight in PMMA) is at 463 nm, the full width at half maximum (FWHM) is 0.15 eV, the CIEy coordinate is 0.10. The photoluminescence quantum yield (PLQY) is 89%.

Example 10

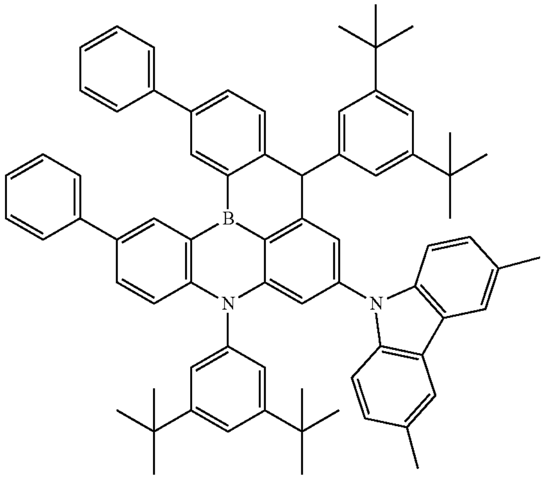 [SMILES: Cc1ccc2c(c1)c1cc(C)ccc1n2-c1cc2c3c(c1)N(c1cc(C(C)(C)C)cc(C(C)(C)C)c1)c1ccc(-c4ccccc4)cc1B3c1cc(-c3ccccc3)ccc1C2c1cc(C(C)(C)C)cc(C(C)(C)C)c1]

The emission maximum of example 10 (1% by weight in PMMA) is at 459 nm, the full width at half maximum (FWHM) is 0.13 eV, the CIEy coordinate is 0.07. The photoluminescence quantum yield (PLQY) is 90%.

Example D1

Example 1 was tested in the OLED D1, which was fabricated with the following layer structure:

| Layer # | Thickness | D1 |
|---|---|---|
| 9 | 100 nm | Al |
| 8 | 2 nm | Liq |
| 7 | 11 nm | NBPhen |
| 6 | 20 nm | MAT1 |
| 5 | 20 nm | MAT2 (99%):: Example 1 (1%) |
| 4 | 10 nm | MAT3 |
| 3 | 50 nm | MAT4 |
| 2 | 7 nm | HAT-CN |
| 1 | 50 nm | ITO |
| Substrate | | Glass |

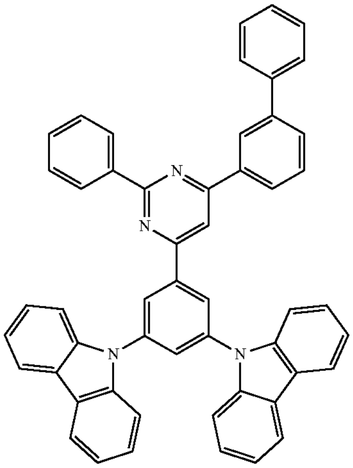 [SMILES: c1ccc(-c2cccc(-c3cc(-c4cc(-n5c6ccccc6c6ccccc65)cc(-n5c6ccccc6c6ccccc65)c4)nc(-c4ccccc4)n3)c2)cc1]

-continued

| Layer # | Thickness | D1 |
|---|---|---|

MAT1

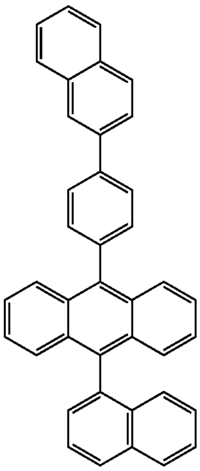 [SMILES: c1ccc2cc(-c3ccc(-c4c5ccccc5c(-c5cccc6ccccc56)c5ccccc45)cc3)ccc2c1]

MAT2

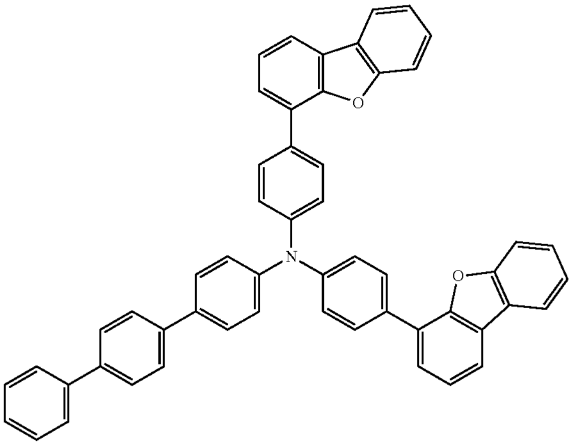 [SMILES: c1ccc(-c2ccc(-c3ccc(N(c4ccc(-c5cccc6c5oc5ccccc56)cc4)c4ccc(-c5cccc6c5oc5ccccc56)cc4)cc3)cc2)cc1]

MAT3

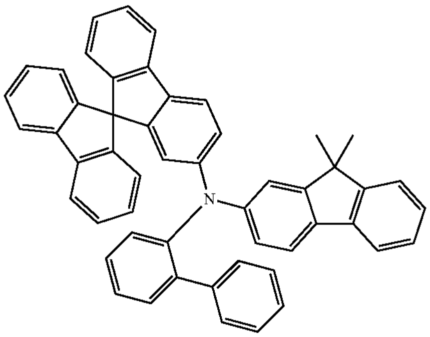 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

MAT4

OLED D1 yielded an external quantum efficiency (EQE) at 1000 cd/m$^2$ of 9.1%. The emission maximum is at 464 nm with a FWHM of 24 nm at 3.5 V. The corresponding CIEx value is 0.13 and the CIEy value is 0.09. A LT95-value at 1200 cd/m$^2$ of 20.4 h was determined.

Example D2

Example 3 was tested in the OLED D2, which was fabricated with the following layer structure:

| Layer # | Thickness | D2 |
|---|---|---|
| 9 | 100 nm | Al |
| 8 | 2 nm | Liq |
| 7 | 11 nm | NBPhen |
| 6 | 20 nm | MAT1 |
| 5 | 20 nm | MAT2 (98%): Example 3 (2%) |
| 4 | 10 nm | MAT3 |
| 3 | 50 nm | MAT4 |
| 2 | 7 nm | HAT-CN |
| 1 | 50 nm | ITO |
| Substrate | | Glass |

OLED D2 yielded an external quantum efficiency (EQE) at 1000 cd/m$^2$ of 10.6%. The emission maximum is at 462 nm with a FWHM of 24 nm at 3.6 V. The corresponding CIEx value is 0.14 and the CIEy value is 0.07. A LT95-value at 1200 cd/m$^2$ of 39 h was determined.

Example D3

Example 5 was tested in the OLED D3, which was fabricated with the following layer structure:

| Layer # | Thickness | D3 |
|---|---|---|
| 9 | 100 nm | Al |
| 8 | 2 nm | Liq |
| 7 | 11 nm | NBPhen |
| 6 | 20 nm | MAT1 |
| 5 | 20 nm | MAT2 (98%): Example 5 (2%) |
| 4 | 10 nm | MAT3 |
| 3 | 50 nm | MAT4 |
| 2 | 7 nm | HAT-CN |
| 1 | 50 nm | ITO |
| Substrate | | Glass |

OLED D3 yielded an external quantum efficiency (EQE) at 1000 cd/m$^2$ of 10.0%. The emission maximum is at 454 nm with a FWHM of 24 nm at 3.7 V. The corresponding CIEx value is 0.14 and the CIEy value is 0.05. A LT95-value at 1200 cd/m$^2$ of 34 h was determined.

Example D4

Example 7 was tested in the OLED D4, which was fabricated with the following layer structure:

| Layer # | Thickness | D4 |
|---|---|---|
| 9 | 100 nm | Al |
| 8 | 2 nm | Liq |
| 7 | 11 nm | NBPhen |
| 6 | 20 nm | MAT1 |
| 5 | 20 nm | MAT2 (98%): Example 7 (2%) |
| 4 | 10 nm | MAT5 |
| 3 | 50 nm | MAT4 |
| 2 | 7 nm | HAT-CN |
| 1 | 50 nm | ITO |
| Substrate | | Glass |

OLED D4 yielded an external quantum efficiency (EQE) at 1000 cd/$m^2$ of 10.5%. The emission maximum is at 458 nm with a FWHM of 26 nm at 4.0 V. The corresponding CIEx value is 0.14 and the CIEy value is 0.07. A LT95-value at 1200 cd/$m^2$ of 1 h was determined.

MAT5

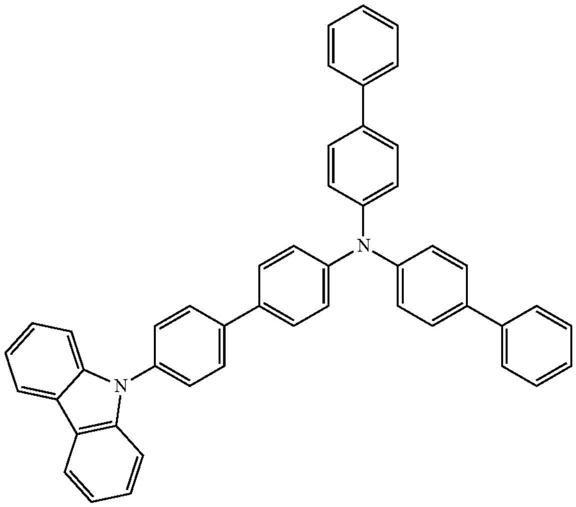

Example D5

Example 8 was tested in the OLED D5, which was fabricated with the following layer structure:

| Layer # | Thickness | D5 |
|---|---|---|
| 9 | 100 nm | Al |
| 8 | 2 nm | Liq |
| 7 | 11 nm | NBPhen |
| 6 | 20 nm | MAT1 |
| 5 | 20 nm | MAT2 (98%): Example 8 (2%) |
| 4 | 10 nm | MAT5 |
| 3 | 50 nm | MAT4 |
| 2 | 7 nm | HAT-CN |
| 1 | 50 nm | ITO |
| Substrate | | Glass |

OLED D5 yielded an external quantum efficiency (EQE) at 1000 cd/$m^2$ of 10.9%. The emission maximum is at 458 nm with a FWHM of 24 nm at 3.6 V. The corresponding CIEx value is 0.14 and the CIEy value is 0.06. A LT95-value at 1200 cd/$m^2$ of 1 h was determined.

Additional Examples of Organic Molecules of the Invention

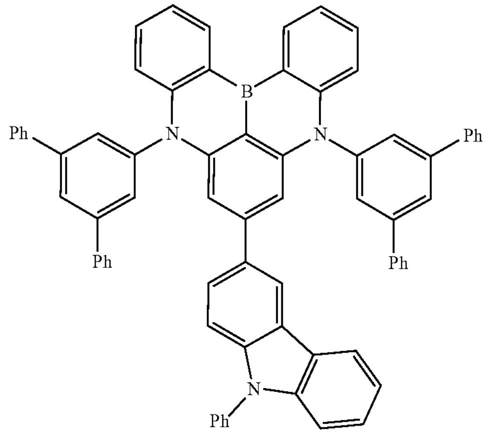

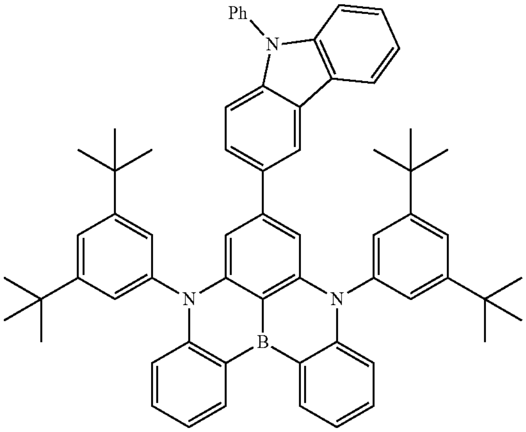

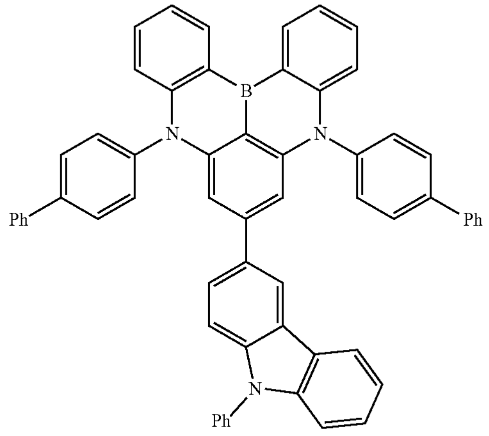

-continued
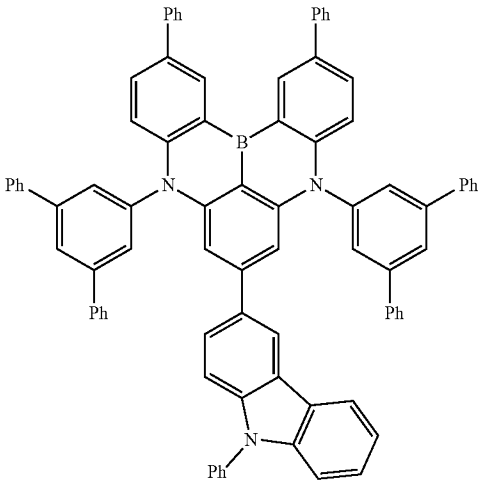
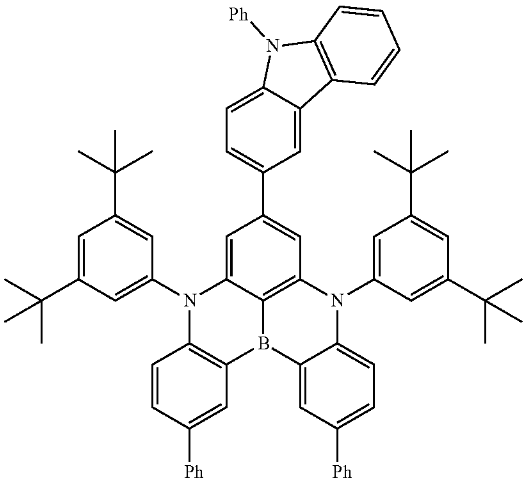
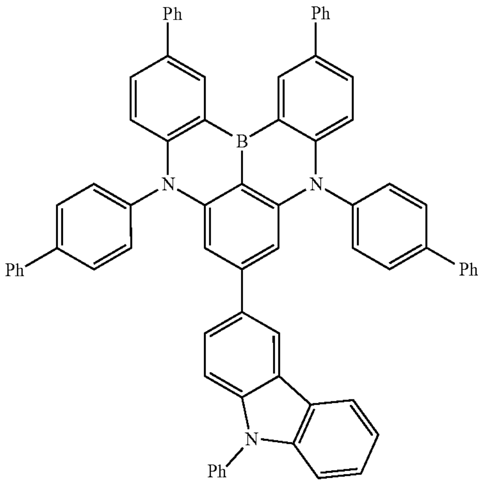
-continued
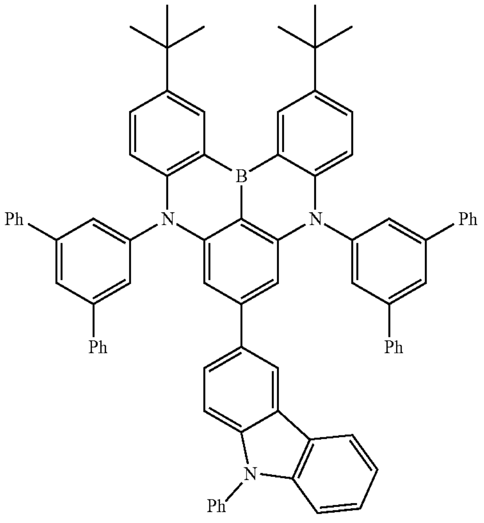
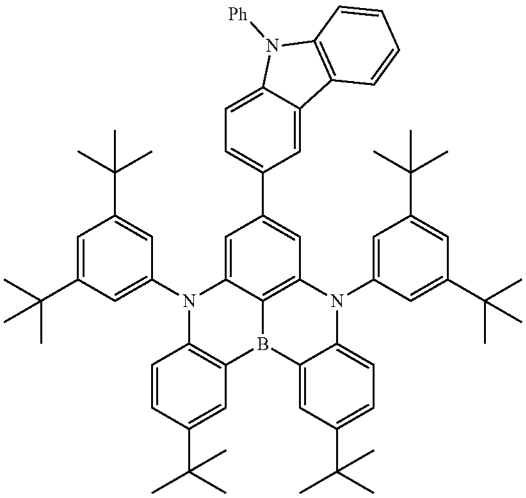
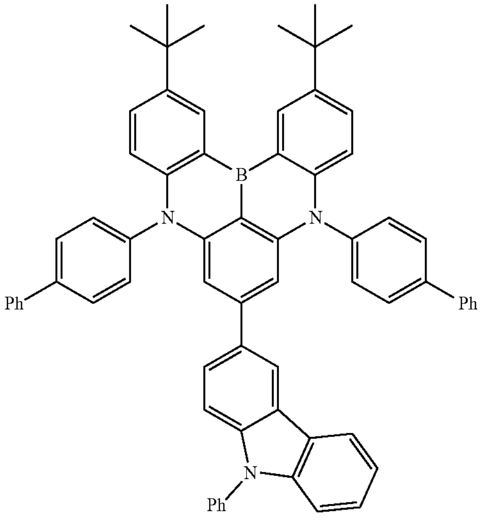

-continued
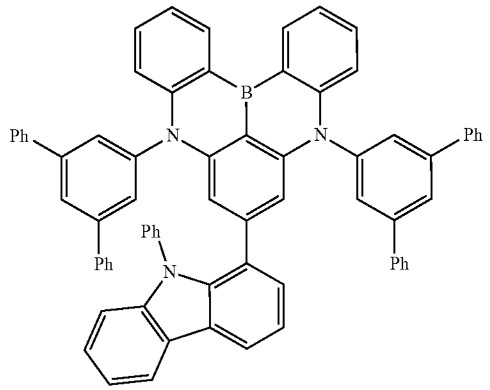
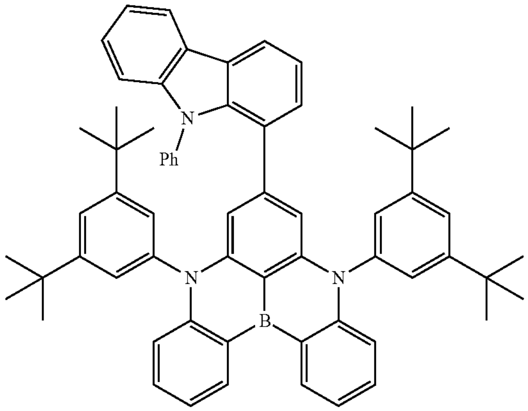
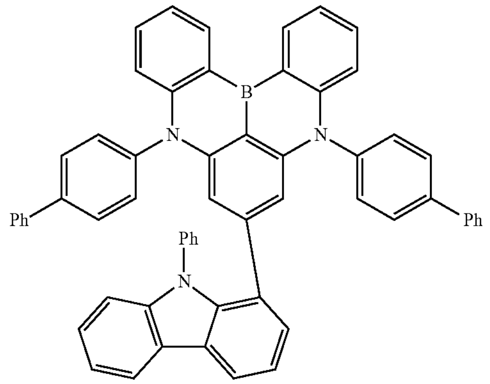
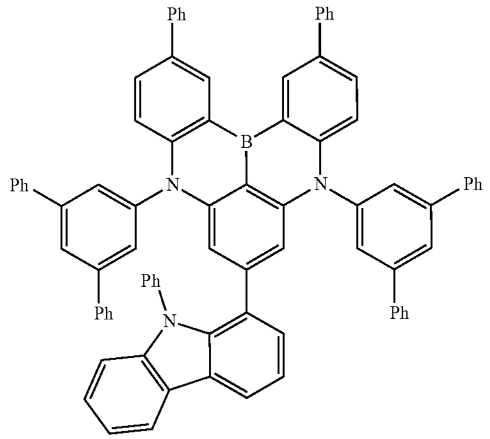
-continued
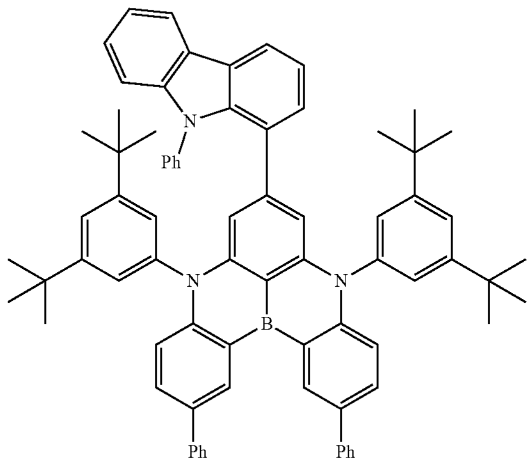
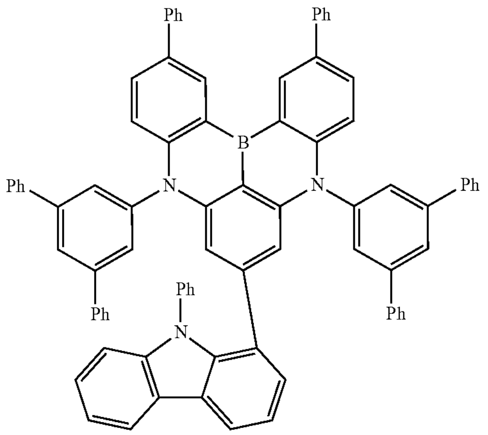
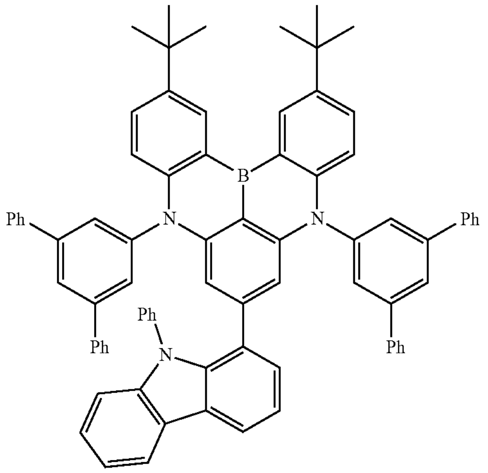

-continued
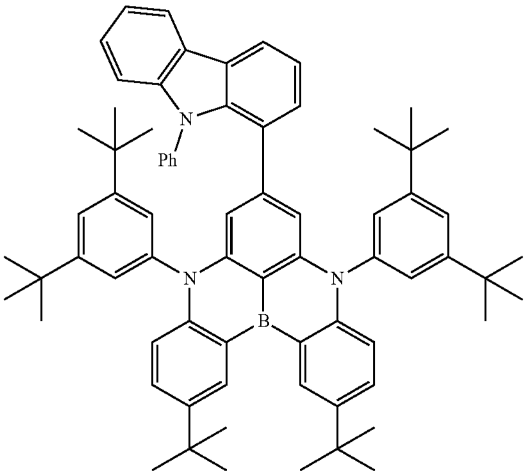
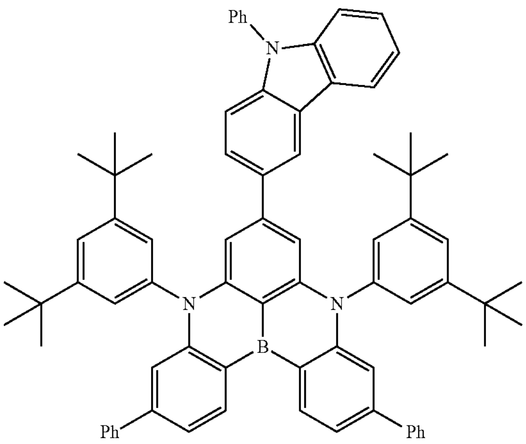
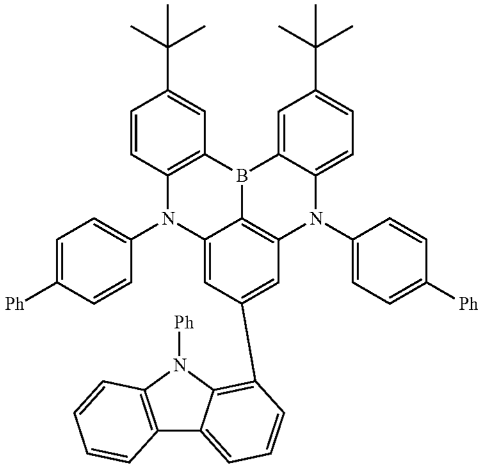
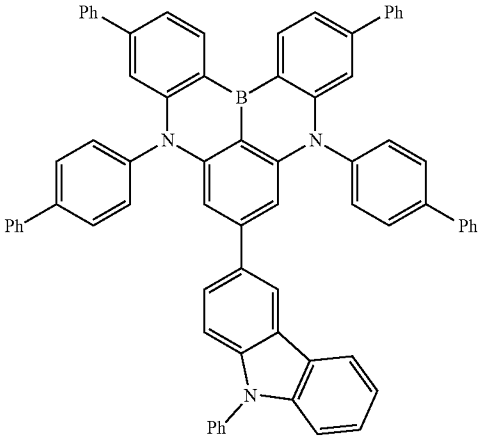
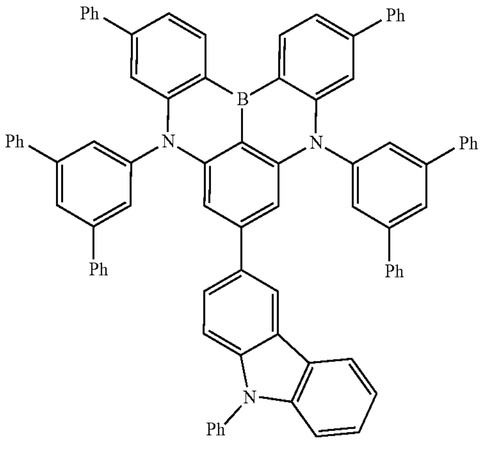
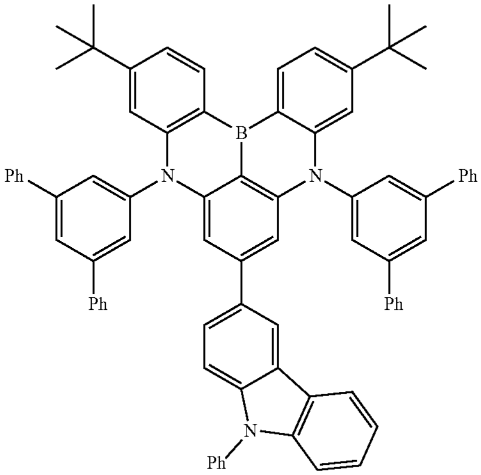
-continued -continued
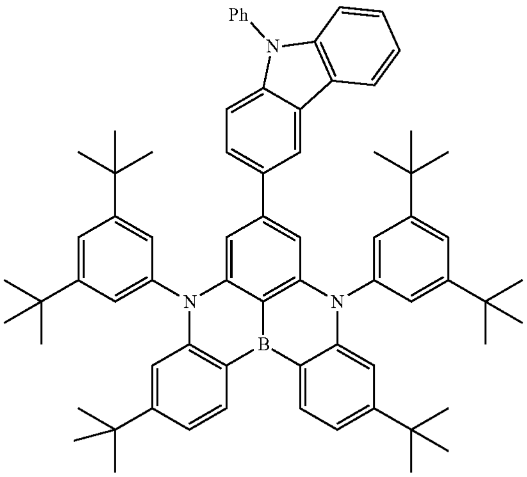
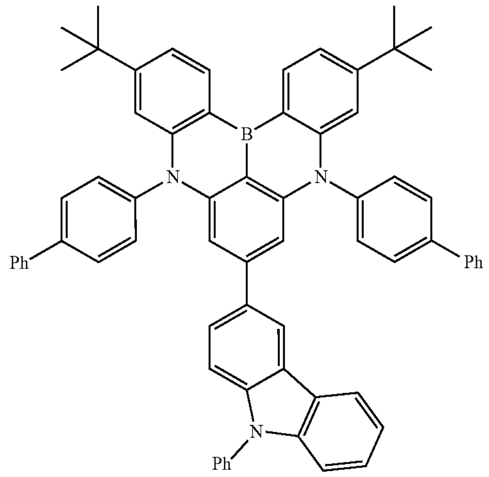
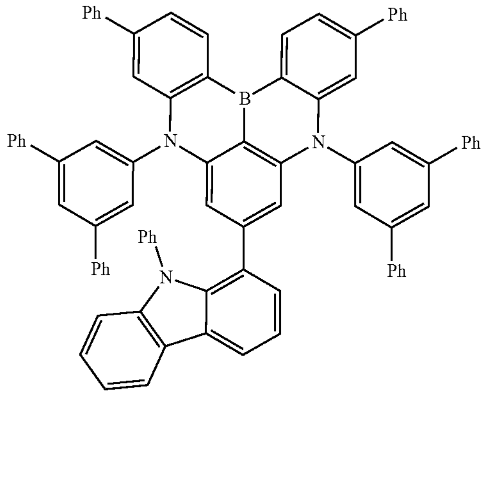
-continued
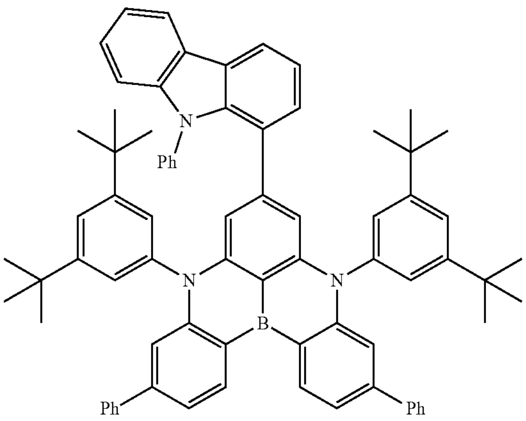
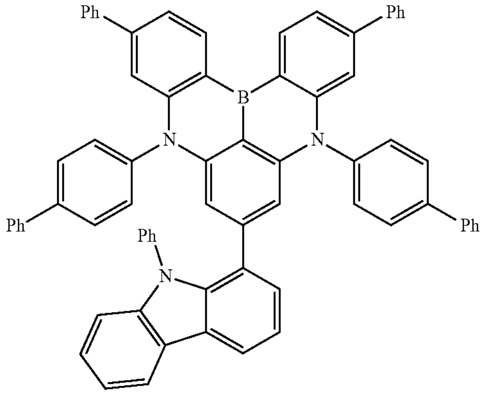
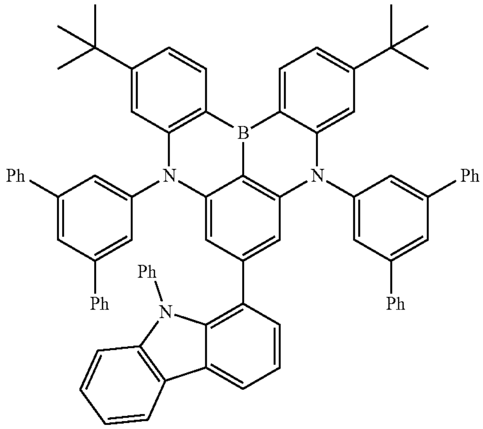
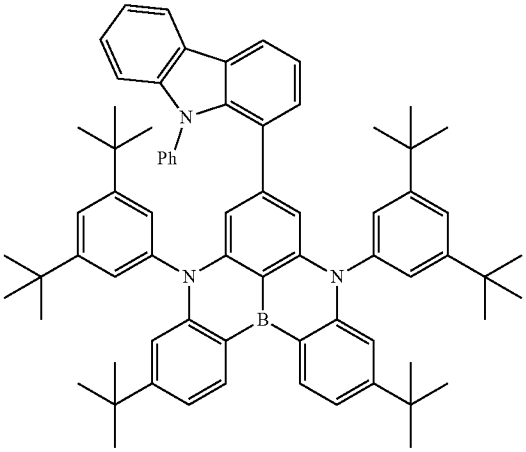

-continued
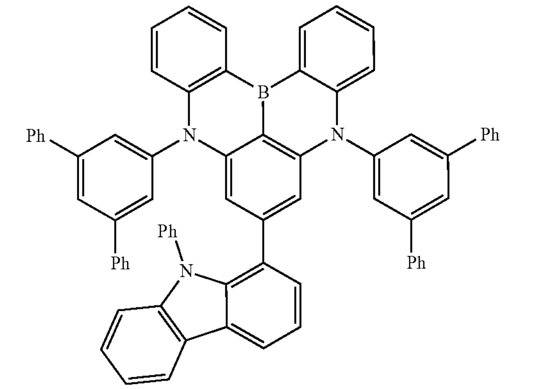
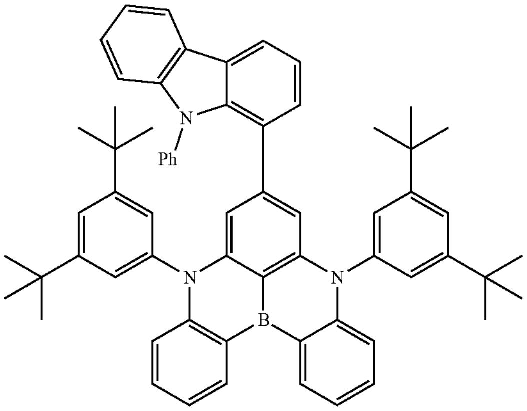
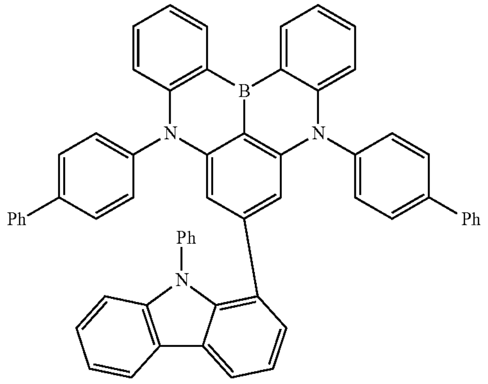
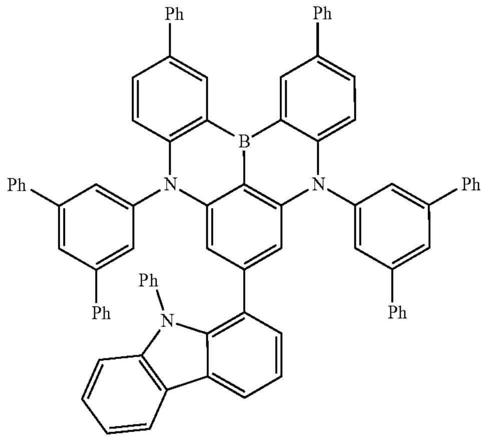
-continued
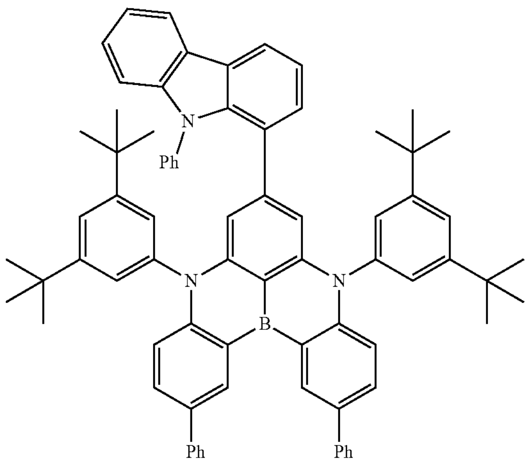
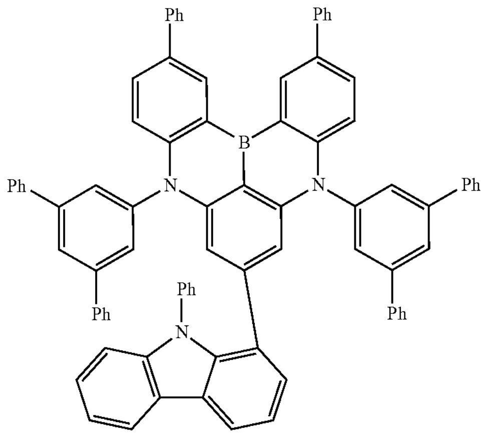
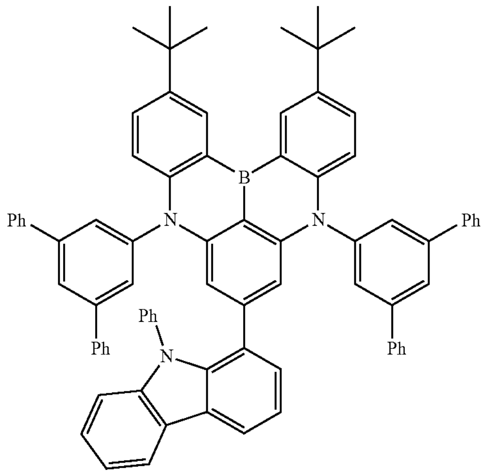

-continued
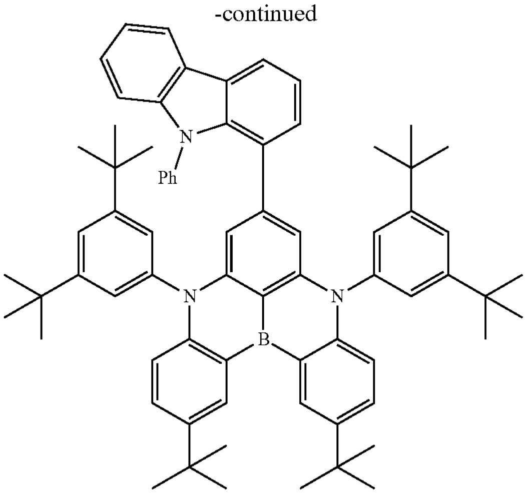
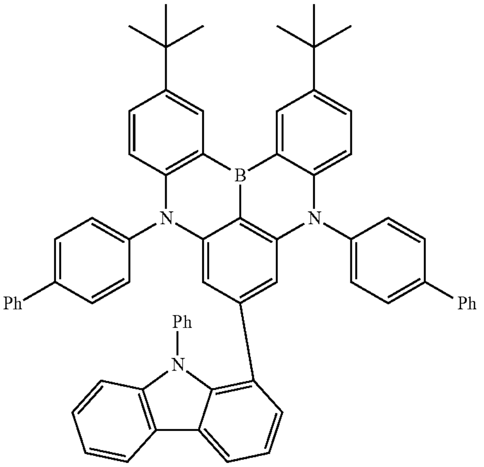
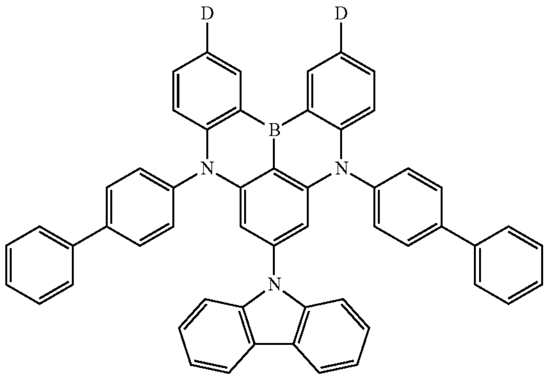
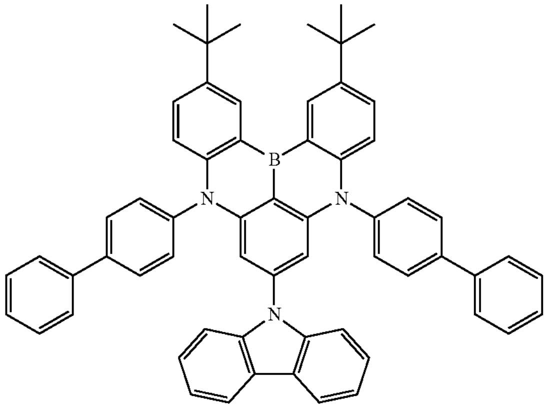
-continued
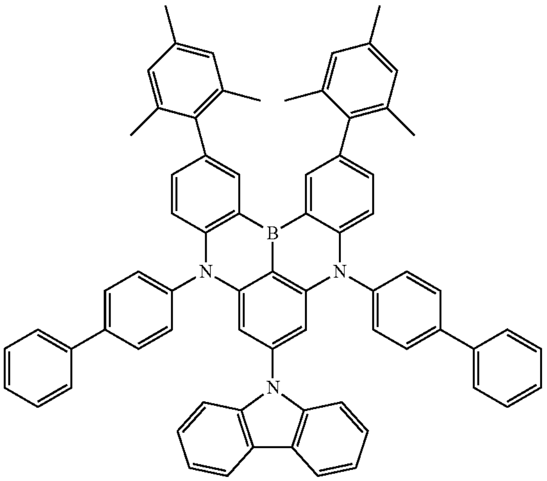
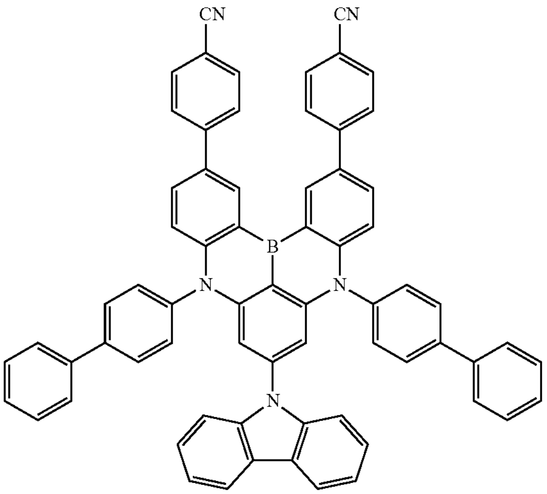
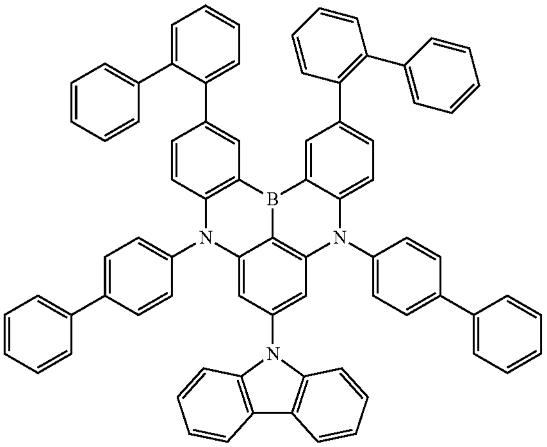

-continued
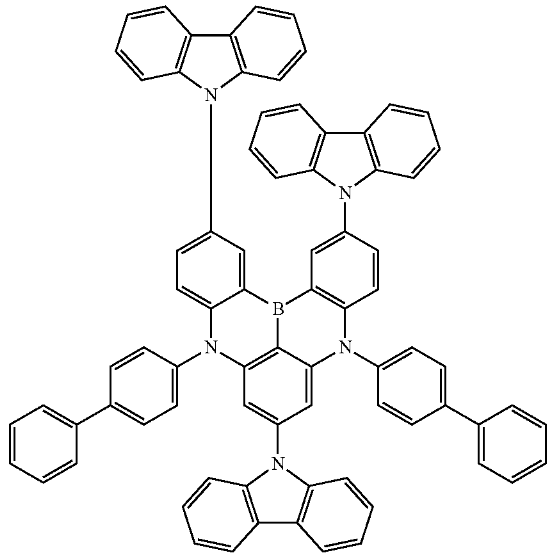
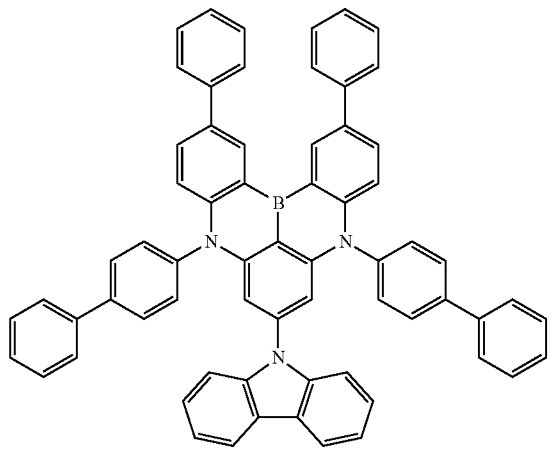
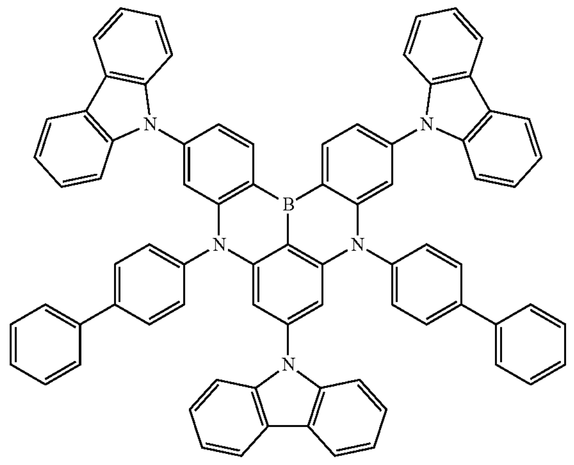
-continued
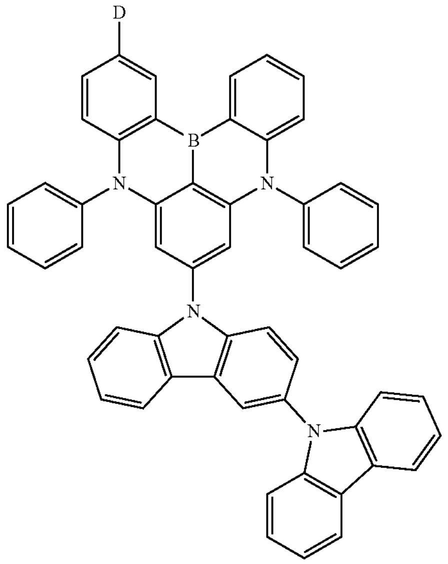
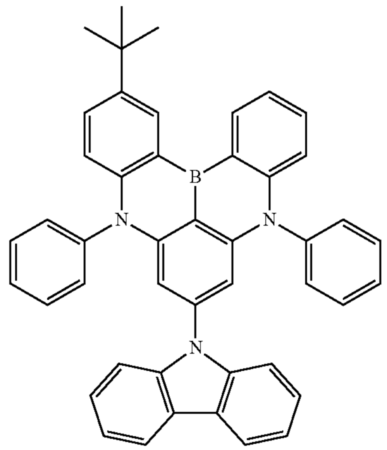
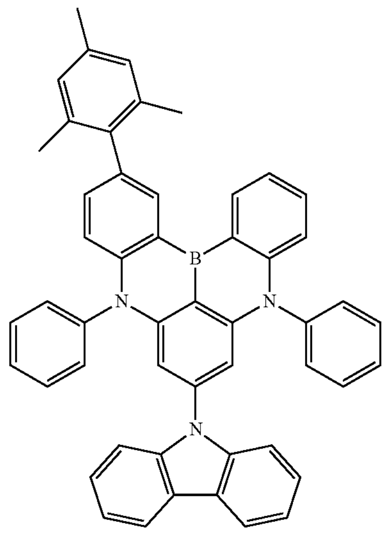

-continued
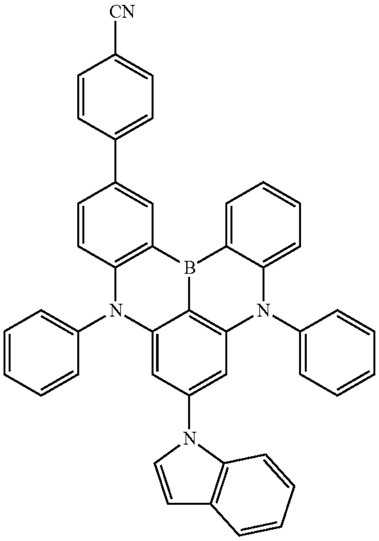
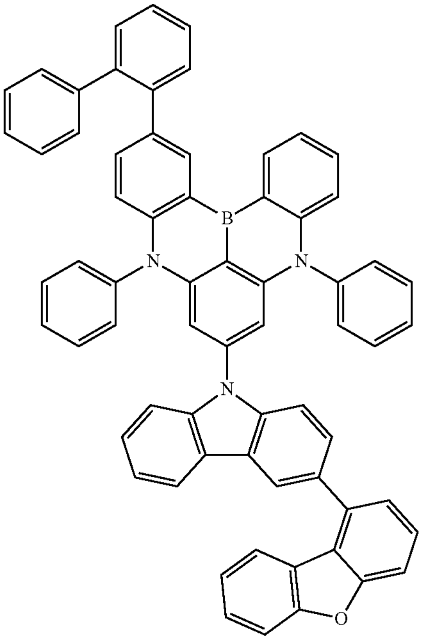
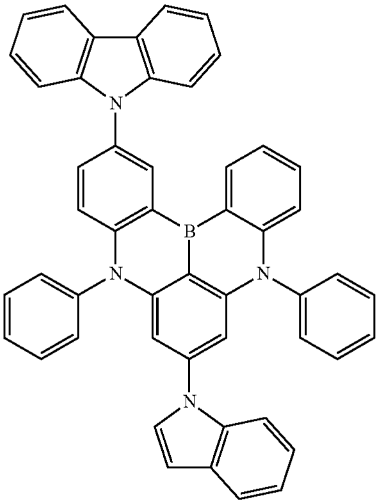
-continued
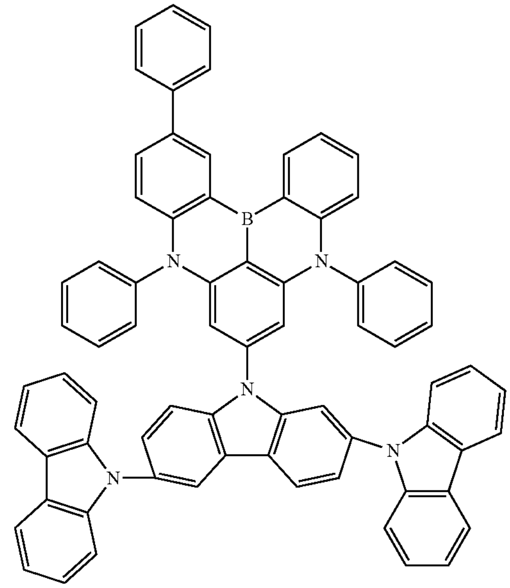
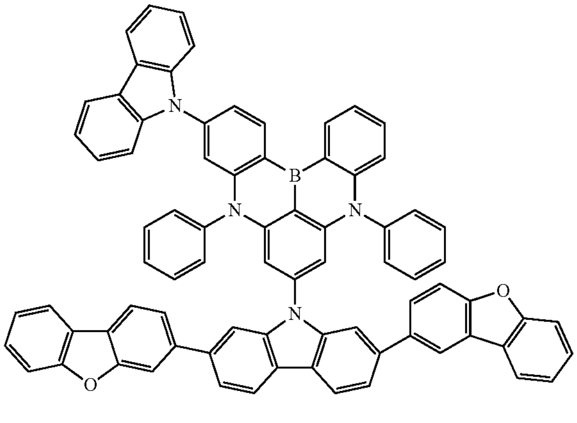
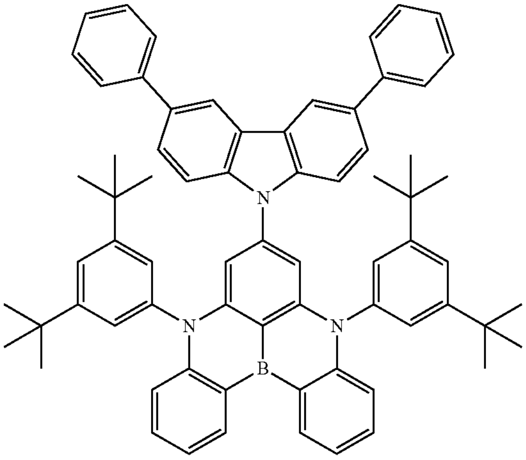

-continued
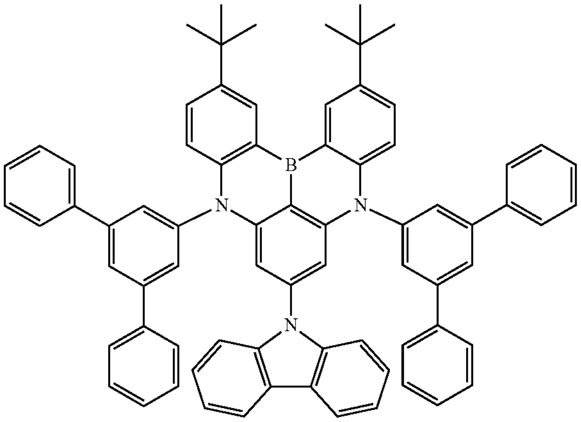
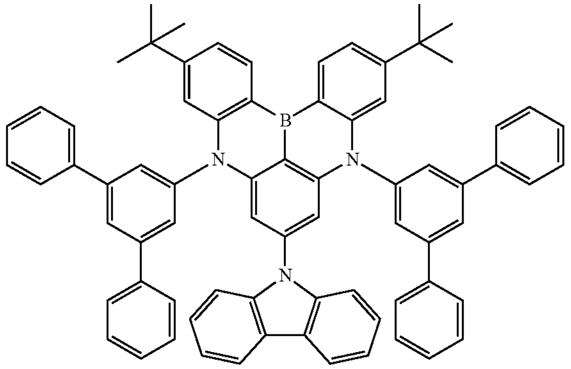
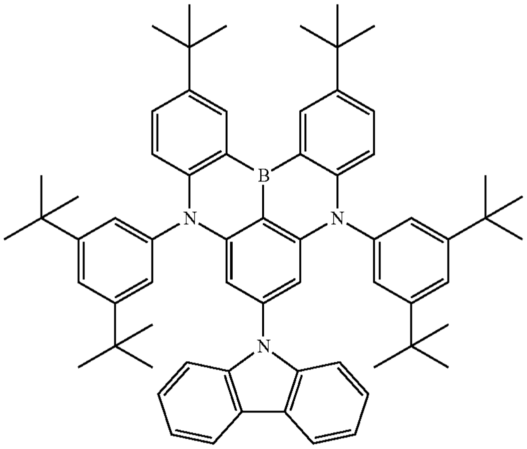
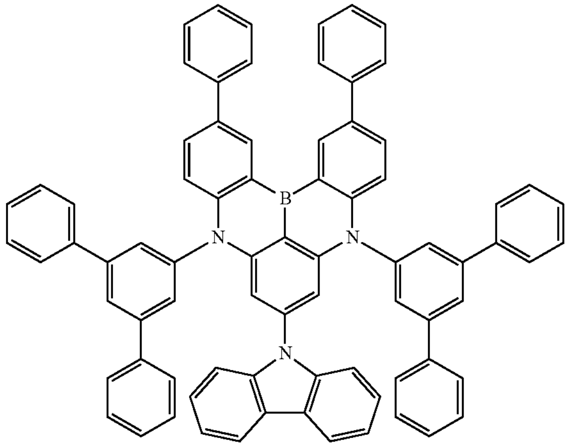
-continued
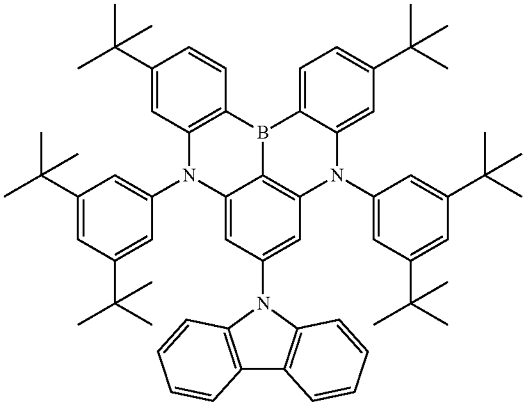
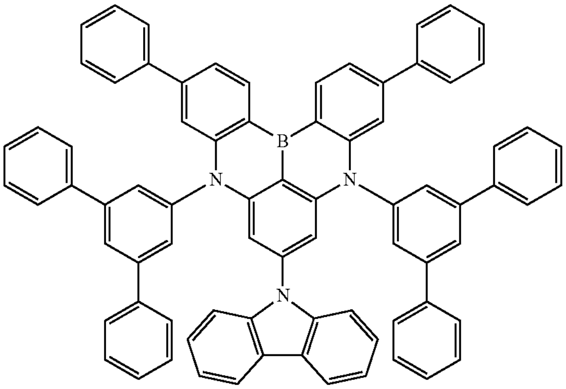
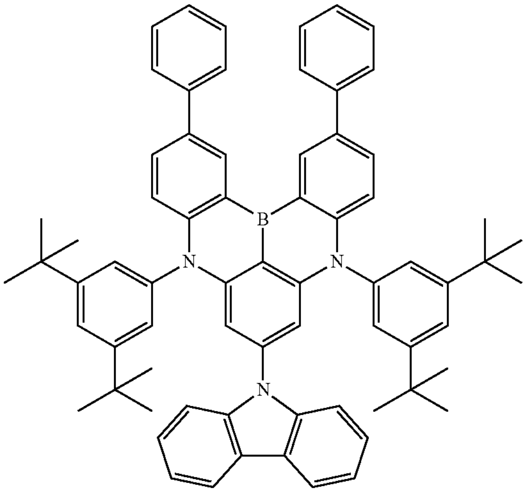
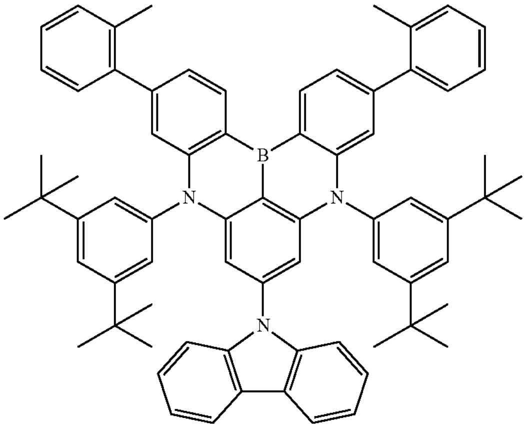

-continued
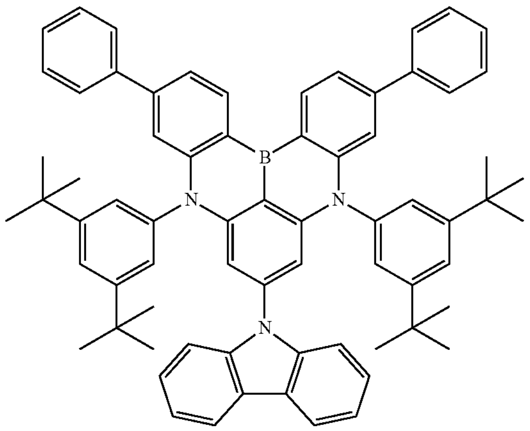
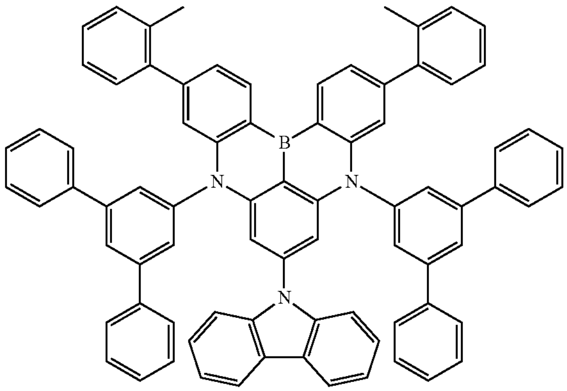
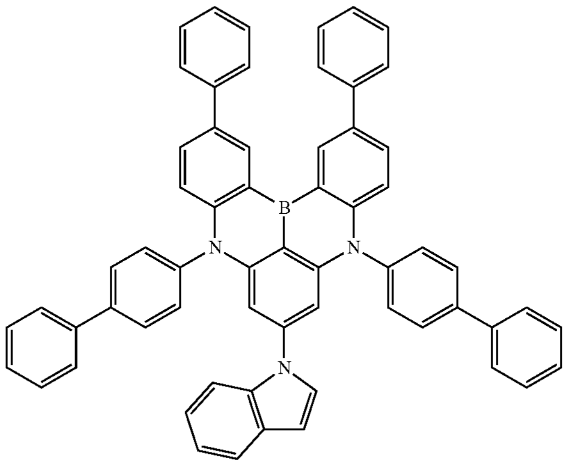
-continued
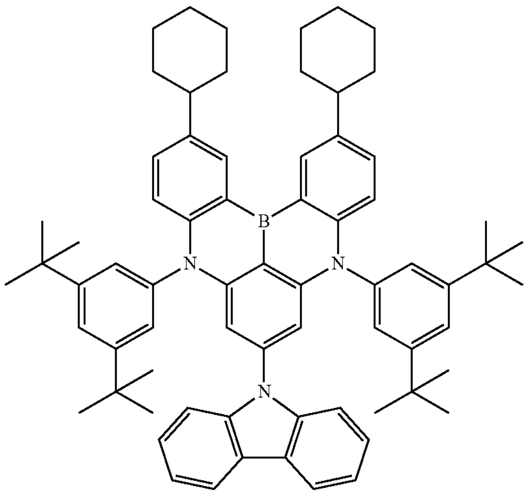
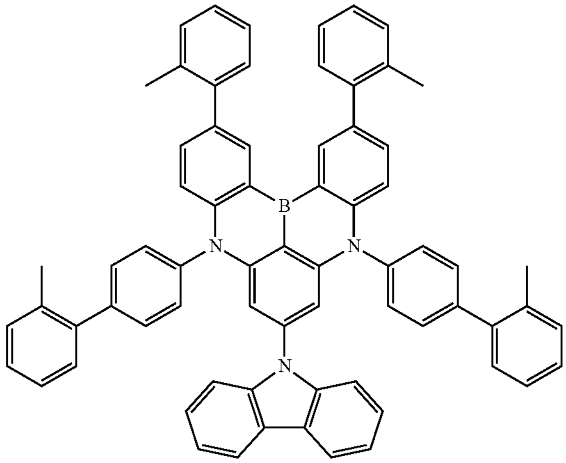
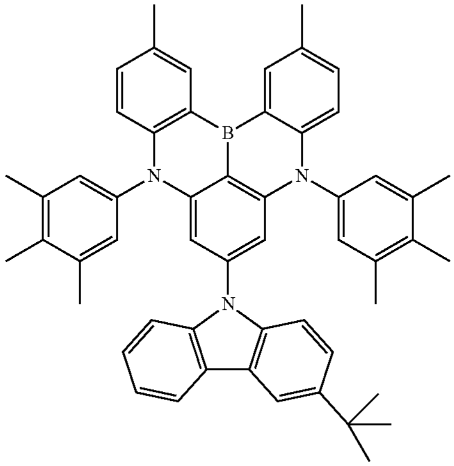

-continued
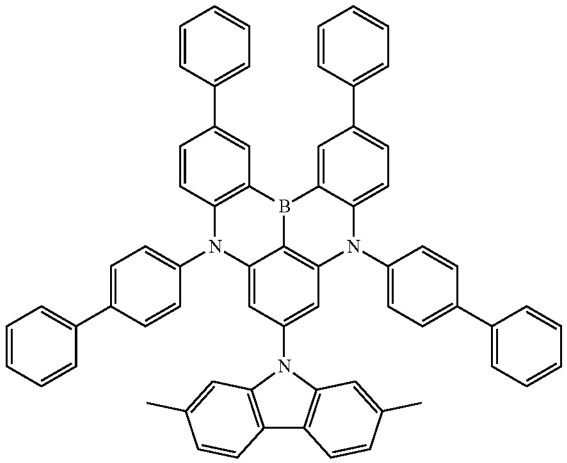
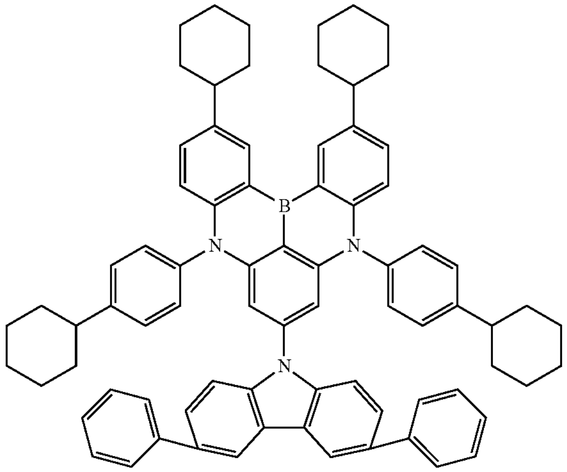
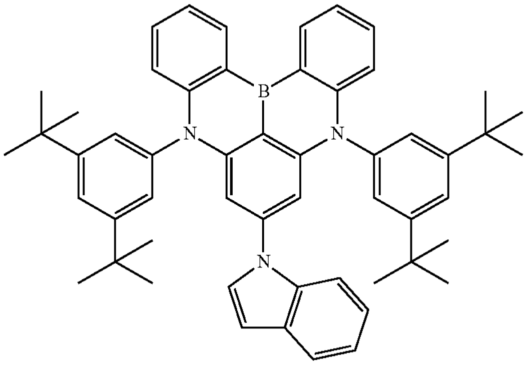
-continued
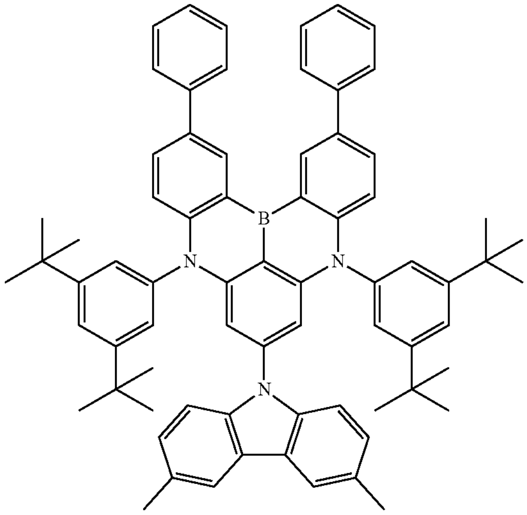
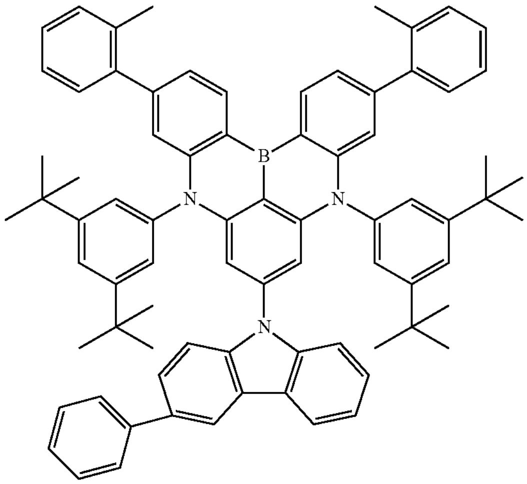
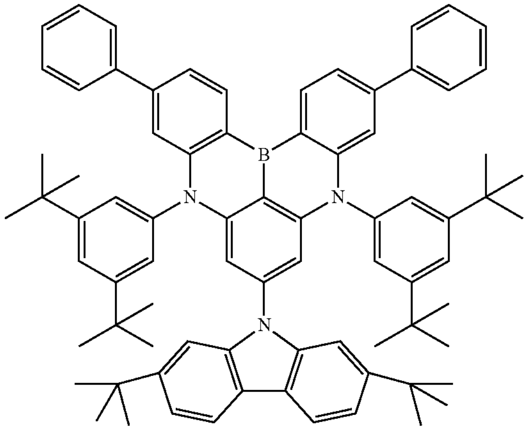

-continued
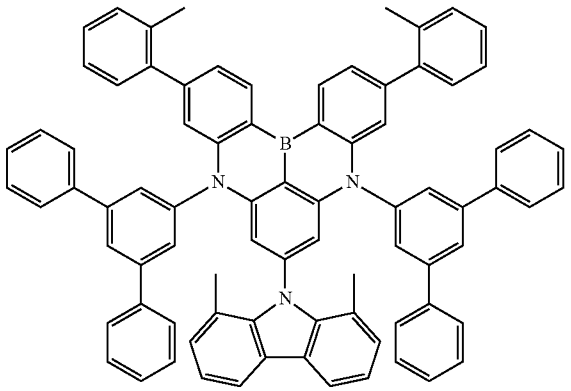
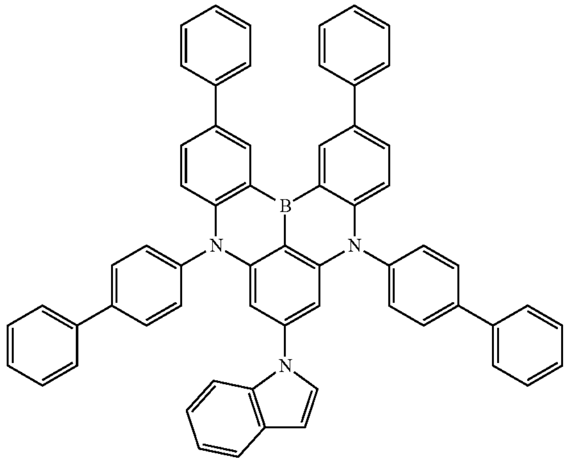
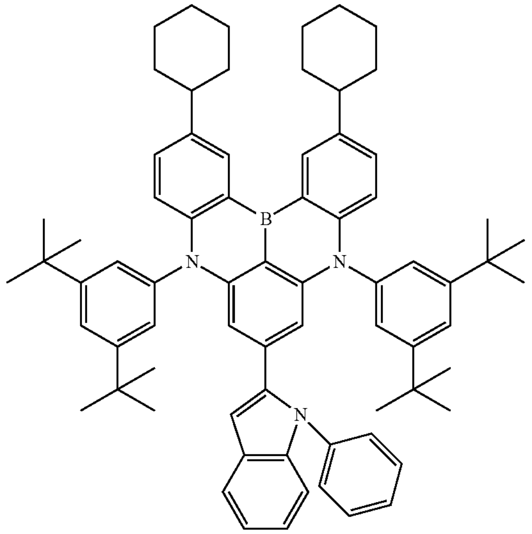
-continued
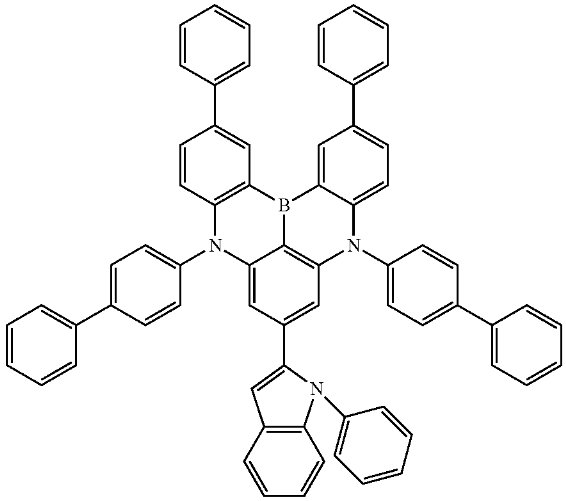
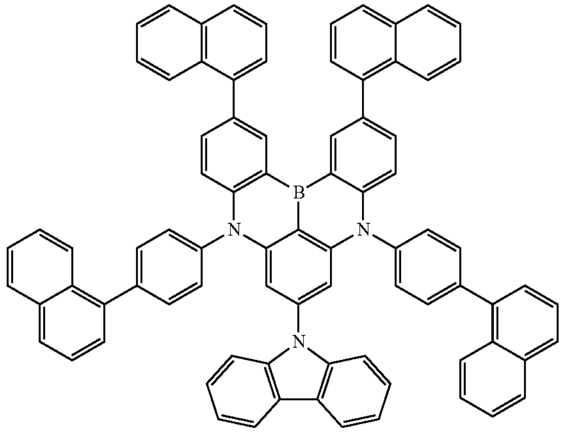
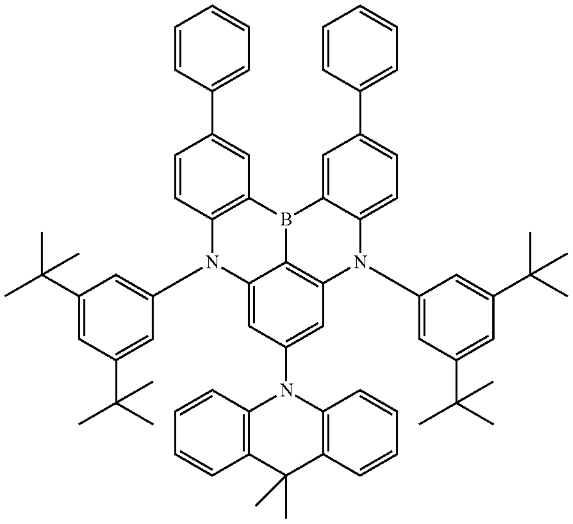

-continued
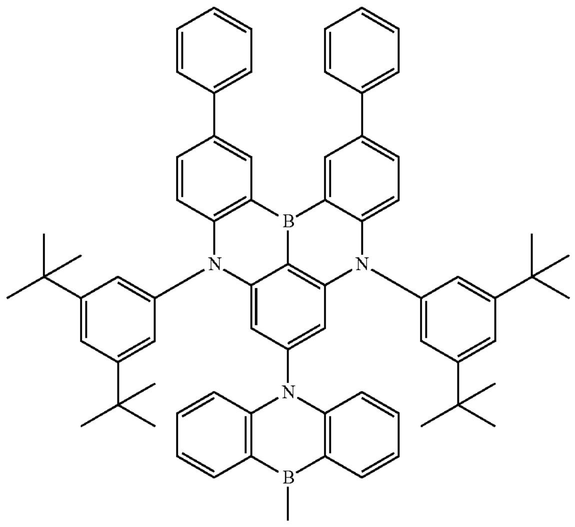
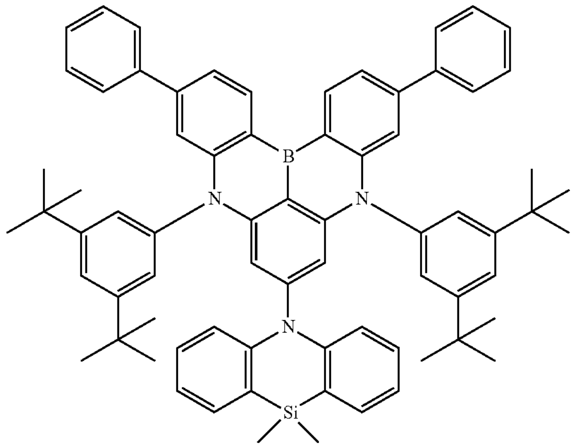
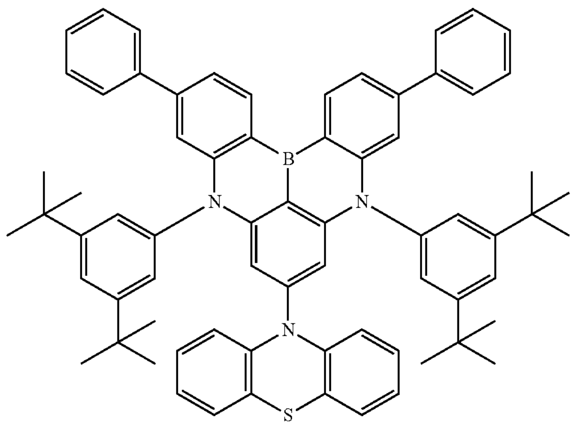
-continued
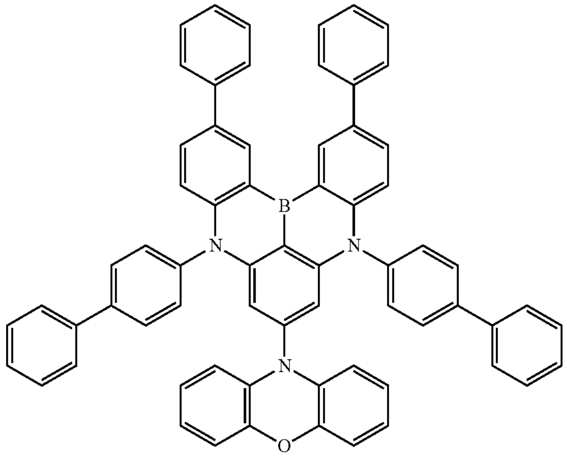
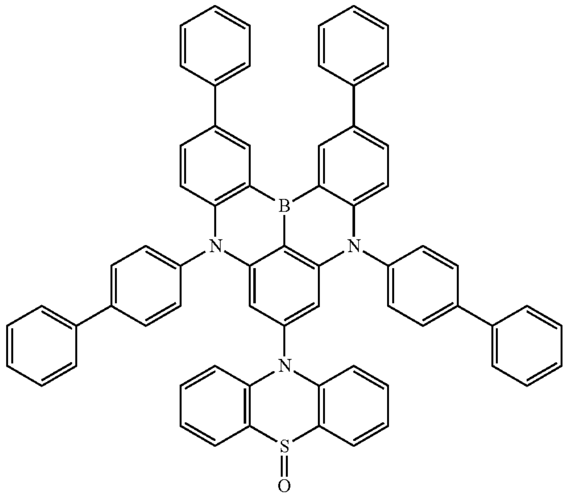
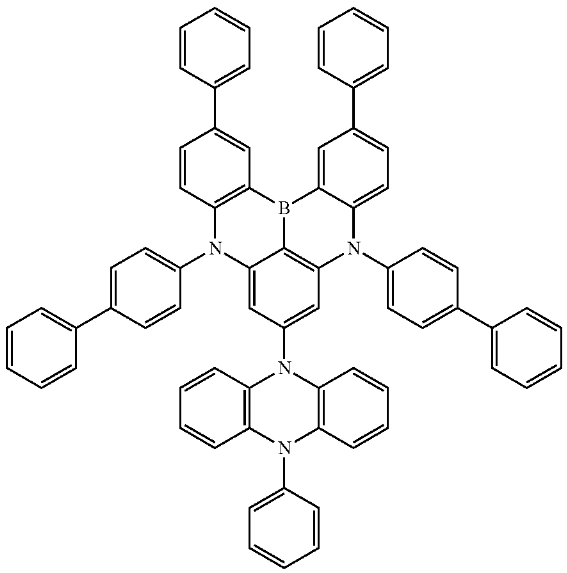

-continued

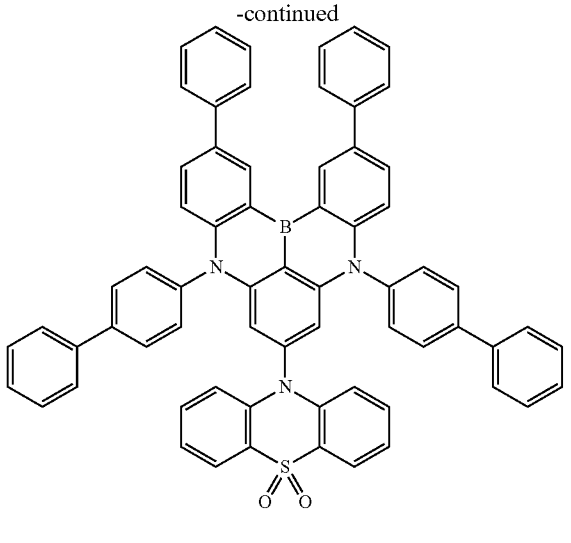

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. An organic molecule, comprising a structure of Formula I:

Formula I

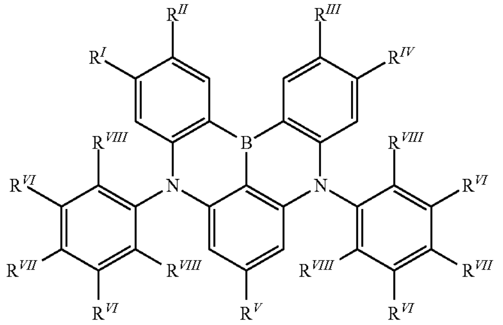

wherein each of $R^I$, $R^{II}$, $R^{III}$ and $R^{IV}$ is independently selected from the group consisting of:

hydrogen, deuterium, $N(R^5)_2$, $OR^5$, $SR^5$, $Si(R^5)_3$, $B(OR^5)_2$, $OSO_2R^5$, $CF_3$,

CN, halogen, $C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

$R^5$ is at each occurrence independently selected from the group consisting of: hydrogen, deuterium, OPh, SPh, $CF_3$, CN, F, $Si(C_1$-$C_5$-alkyl$)_3$, $Si(Ph)_3$, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl$)$;

$R^V$ comprises or consists of a structure of Formula II:

Formula II

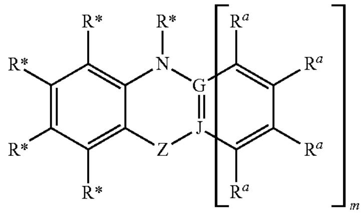

wherein

Z is at each occurrence independently selected from the group consisting of a direct bond, NRI, $Si(R^5)_2$, $C(R^5)_2$, $BR^5$, O, S, S(O) and $S(O)_2$;

m is 0 or 1;

G is C if m=1; G is CR* if m=0;

J is C if m=1; J is CR* if m=0;

R* is at each occurrence independently from another selected from the binding site or $R^a$;

$R^a$ is at each occurrence independently from another selected from the group consisting of:

hydrogen, $C_1$-$C_5$-alkyl, $C_6$-$C_{18}$ aryl or $C_3$-$C_{17}$-heteroaryl;

wherein exactly one R* of Formula II represents the binding site of $R^V$, and when Z is a direct bond, m is 1, G is C, and J is C, then (i) N—R* is not the binding site of $R^V$, or (ii) at least one of $R^I$ to $R^{IV}$ and $R^{VI}$ to $R^{VIII}$ is not hydrogen, and wherein when Z is a direct bond, m is 1, G is C, J is C, and N—R* is not the bindinq site of $R^V$, then at least one of $R^I$ to $R^{IV}$ and $R^{VI}$ to $R^{VIII}$ is selected from the group consisting of:

$N(R^5)_2$, $OR^5$, $SR^5$, $Si(R^5)_3$, $B(OR^5)_2$, $OSO_2R^5$, $CF_3$,

CN, haloqen, $C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$; and $C_6$-$C_{60}$-aryl, which is optionally substituted with one or more substituents $R^5$;

$R^{VI}$, $R^{VII}$ and $R^{VIII}$ are at each occurrence independently selected from the group consisting of:

hydrogen, deuterium, $C_1$-$C_5$-alkyl, wherein one or more hydrogen atoms are optionally substituted by deuterium;

$C_6$-$C_{18}$-aryl, wherein optionally one or more hydrogen atoms are independently from each other substituted by $C_1$-$C_5$-alkyl, $C_6$-$C_{18}$ aryl or $C_3$-$C_{17}$-heteroaryl;

$C_3$-$C_{18}$-heteroaryl, wherein optionally one or more hydrogen atoms are independently from each other substituted by $C_1$-$C_5$-alkyl, $C_6$-$C_{18}$ aryl or $C_3$-$C_{17}$-heteroaryl.

2. The organic molecule according to claim 1, wherein $R^I$, $R^{II}$, $R^{III}$ and $R^{IV}$ are independently from each other selected from the group consisting of:

hydrogen, deuterium, halogen, Me, $^i$Pr, $^t$Bu, CN, $CF_3$, $SiMe_3$, $SiPh_3$, Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

3. The organic molecule according to claim 1, wherein each of $R^I$, $R^{II}$, $R^{III}$ and $R^{IV}$ is independently selected from the group consisting of:

hydrogen, deuterium, Me, $^i$Pr, $^t$Bu, $SiMe_3$, $SiPh_3$,

Ph, which is optionally substituted with one or more substituents independently from each other selected from the group consisting of Me, $^i$Pr, $^t$Bu, and Ph, and $N(Ph)_2$.

4. The organic molecule according to claim 1, wherein the organic molecule comprises a structure of Formula Ia:

Formula Ia

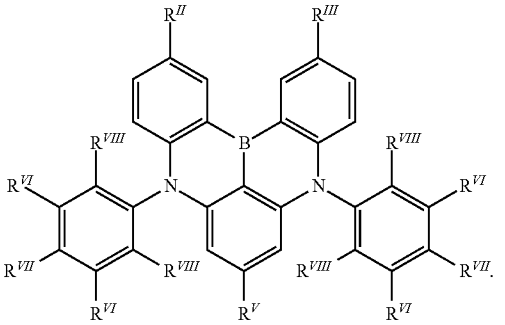

5. The organic molecule according to claim 1, wherein $R^V$ is selected from the group consisting of structures of Formula II-a, Formula II-b and Formula II-c:

Formula II-a

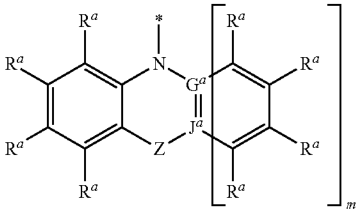

Formula II-b

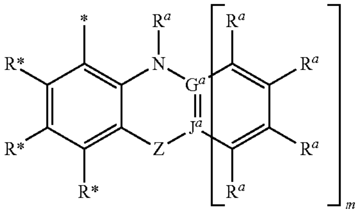

Formula II-c

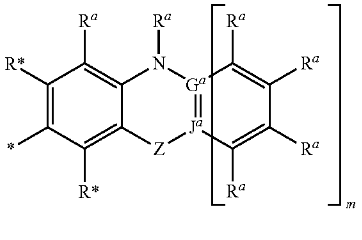

wherein

* represents the binding site;

$G^a$ is C if m=1; $G^a$ is $CR^a$ if m=0; and $J^a$ is C if m=1; $J^a$ is $CR^a$ if m=0.

6. An organic molecule, comprising a structure of Formula I:

Formula I

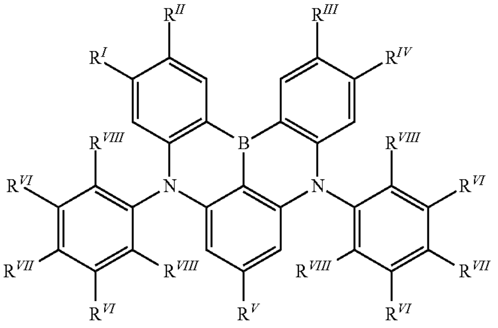

wherein each of $R^I$, $R^{II}$, $R^{III}$ and $R^{IV}$ is independently selected from the group consisting of:

hydrogen, deuterium, $N(R^5)_2$, $OR^5$, $SR^5$, $Si(R^5)_3$, $B(OR^5)_2$, $OSO_2R^5$, $CF_3$,

ON, haloqen, $C_1$-$C_{40}$-alkyl, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

$R^5$ is at each occurrence independently selected from the group consisting of: hydrogen, deuterium, OPh, SPh, $CF_3$, CN, F, Si($C_1$-$C_5$-alkyl$)_3$, $Si(Ph)_3$, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

N($C_6$-$C_{18}$-aryl$)_2$,

N($C_3$-$C_{17}$-heteroaryl$)_2$; and

N($C_3$-$C_{17}$-heteroaryl)($C_6$-$C_{18}$-aryl);

wherein $R^V$ comprises a structure of Formula II-a-IX:

Formula II-a-IX

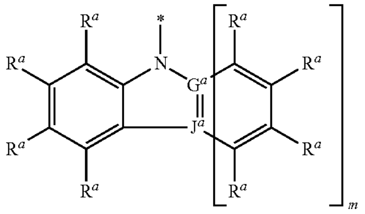

wherein m is 1;

G is C;

J is C;

$R^a$ is at each occurrence independently from another selected from the group consisting of:

hydrogen, $C_1$-$C_5$-alkyl, $C_6$-$C_{18}$ aryl or $C_3$-$C_{17}$-heteroaryl;

* represents the bindinq site of $R^V$.

7. The organic molecule according to claim 1, wherein $R^{VI}$, $R^{VII}$ and $R^{VIII}$ are at each occurrence independently from each other selected from the group consisting of hydrogen, $C_1$-$C_5$-alkyl, $C_6$-$C_{18}$-aryl, wherein optionally one or more hydrogen atoms are independently from each other substituted by $C_1$-$C_5$-alkyl or $C_6$-$C_{18}$-aryl.

8. The organic molecule according to claim 1, comprising a structure of Formula 1-0:

Formula I-0

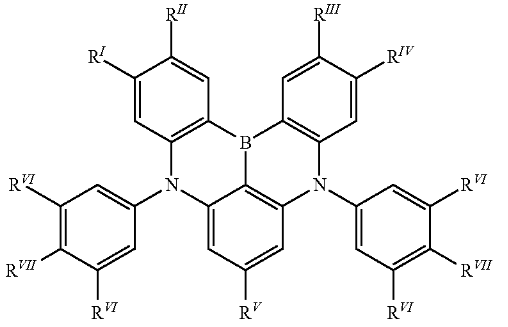

9. An organic molecule, comprising a structure of Formula Ic:

Formula Ic

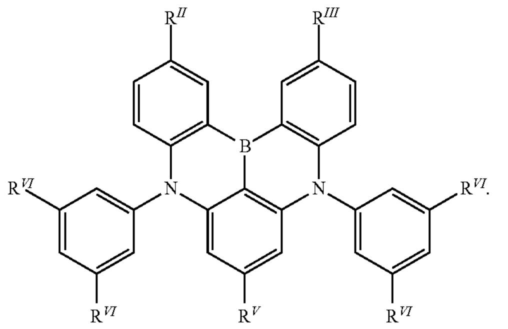

wherein each of $R^{II}$ and $R^{III}$ is independently selected from the group consisting of:

hydrogen, deuterium, $N(R^5)_2$, $OR^5$, $SR^5$, $Si(R^5)_3$, $B(OR^5)_2$, $OSO_2R^5$, $CF_3$,

ON, halogen, $C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, C═$NR^5$, P(═O)($R^5$), SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

$R^5$ is at each occurrence independently selected from the group consisting of: hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6\text{-}C_{18}\text{-aryl})_2$, $N(C_3\text{-}C_{17}\text{-heteroaryl})_2$; and $N(C_3\text{-}C_{17}\text{-heteroaryl})(C_6\text{-}C_{18}\text{-aryl})$;

$R^V$ comprises or consists of a structure of Formula II:

Formula II

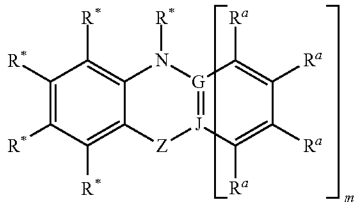

wherein

Z is at each occurrence independently selected from the group consisting of a direct bond, $NR^5$, $Si(R^5)_2$, $C(R^5)_2$, BRI, O, S, S(O) and $S(O)_2$;

m is 0 or 1;

G is C if m=1; G is CR* if m=0;

J is C if m=1; J is CR* if m=0;

R* is at each occurrence independently from another selected from the bindinq site or $R^a$;

$R^a$ is at each occurrence independently from another selected from the group consisting of:

hydrogen, $C_1$-$C_5$-alkyl, $C_6$-$C_{18}$ aryl or $C_3$-$C_{17}$-heteroaryl;

wherein exactly one R* of Formula II represents the bindinq site of $R^V$, and when Z is a direct bond, m is 1, G is C, and J is C, then (i) N—R* is not the bindinq site of $R^V$, or (ii) at least one of $R^I$ to $R^{IV}$ and $R^{VI}$ to $R^{VIII}$ is not hydrogen;

$R^{VI}$ is at each occurrence independently selected from the group consisting of:

hydrogen, deuterium, $C_1$-$C_5$-alkyl, wherein one or more hydrogen atoms are optionally substituted by deuterium;

$C_6$-$C_{18}$-aryl, wherein optionally one or more hydrogen atoms are independently from each other substituted by $C_1$-$C_5$-alkyl, $C_6$-$C_{18}$ aryl or $C_3$-$C_{17}$-heteroaryl;

$C_3$-$C_{15}$-heteroaryl, wherein optionally one or more hydrogen atoms are independently from each other substituted by $C_1$-$C_5$-alkyl, $C_6$-$C_{18}$ aryl or $C_3$-$C_{17}$-heteroaryl.

10. A composition, comprising:

(a) an organic molecule according to claim 1 as an emitter and/or a host;

(b) an emitter and/or a host material different from the organic molecule according to claim 1; and (c) optionally, a dye and/or a solvent.

11. An optoelectronic device comprising the organic molecule according to claim 1.

12. The optoelectronic device according to claim 11, wherein the optoelectronic device is an organic light-emitting diode, a light-emitting electrochemical cell, an organic light-emitting sensor, an organic diode, an organic solar cell, an organic transistor, an organic field-effect transistor, an organic laser or a down-conversion element.

13. The optoelectronic device according to claim 12, comprising:

a substrate;

an anode;

a cathode, wherein the anode or the cathode is disposed on the substrate; and at least one light-emitting layer disposed between the anode and the cathode and which comprises the organic molecule.

14. An optoelectronic device comprising the organic molecule according to claim 1, wherein the organic molecule is one of a luminescent emitter, an electron transport material, a hole injection material or a hole blocking material in the optoelectronic device.

15. An optoelectronic device comprising the organic molecule according to claim 2, wherein the optoelectronic device is an organic light-emitting diode, a light-emitting electrochemical cell, an organic light-emitting sensor, an organic diode, an organic solar cell, an organic transistor, an organic field-effect transistor, an organic laser or a down-conversion element.

16. The optoelectronic device according to claim 15, comprising:

a substrate;

an anode;

a cathode, wherein the anode or the cathode is applied to the substrate; and at least one light-emitting layer disposed between the anode and the cathode and which comprises the organic molecule.

17. An optoelectronic device comprising the composition according to claim 10.

18. The optoelectronic device according to claim 17, wherein the optoelectronic device is an organic light-emitting diode, a light-emitting electrochemical cell, an organic light-emitting sensor, an organic diode, an organic solar cell, an organic transistor, an organic field-effect transistor, an organic laser or a down-conversion element.

19. The optoelectronic device according to claim 18, comprising:

a substrate;

an anode;

a cathode, wherein the anode or the cathode is disposed on the substrate; and at least one light-emitting layer disposed between the anode and the cathode and which comprises the composition.

20. A method for producing an optoelectronic device, comprising processing of the organic molecule according to claim 1 by a vacuum evaporation method or from a solution.

* * * * *